(12) United States Patent
Taguchi et al.

(10) Patent No.: US 11,550,085 B2
(45) Date of Patent: Jan. 10, 2023

(54) STRUCTURE AND OPTICAL SENSOR

(71) Applicant: FUJIFILM Corporation, Tokyo (JP)

(72) Inventors: Yoshinori Taguchi, Haibara-gun (JP); Tetsushi Miyata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 156 days.

(21) Appl. No.: 16/548,368

(22) Filed: Aug. 22, 2019

(65) Prior Publication Data

US 2019/0377111 A1 Dec. 12, 2019

Related U.S. Application Data

(63) Continuation of application No. PCT/JP2018/007143, filed on Feb. 27, 2018.

(30) Foreign Application Priority Data

Mar. 29, 2017 (JP) .............................. JP2017-065376
Feb. 13, 2018 (JP) .............................. JP2018-023270

(51) Int. Cl.
*G02B 5/20* (2006.01)
*G02B 5/02* (2006.01)
*H01L 27/146* (2006.01)

(52) U.S. Cl.
CPC ........... *G02B 5/201* (2013.01); *G02B 5/0242* (2013.01); *G02B 5/0278* (2013.01); *G02B 5/208* (2013.01); *H01L 27/14621* (2013.01)

(58) Field of Classification Search
CPC .... G02B 5/201; G02B 5/0242; G02B 5/0278; G02B 5/208; G02B 5/20; G02B 5/206; G02B 5/28; G02B 5/281; G02B 5/282; G02B 5/26; G02B 5/22; G02B 5/02; G02B 5/0236; H01L 27/14621; H01L 27/1462; H01L 27/14601; H01L 27/146
See application file for complete search history.

(56) References Cited

U.S. PATENT DOCUMENTS

2006/0081890 A1 4/2006 Kang et al.
2008/0081173 A1 4/2008 Hatanaka et al.
(Continued)

FOREIGN PATENT DOCUMENTS

CN 101054709 A 10/2007
CN 102244086 A 11/2011
(Continued)

OTHER PUBLICATIONS

WO 2017/038542 A1, published Mar. 9, 2017, English language machine translation, generated Jun. 15, 2021 (Year: 2017).*
(Continued)

*Primary Examiner* — Stephone B Allen
*Assistant Examiner* — Adam W Booher
(74) *Attorney, Agent, or Firm* — Birch, Stewart, Kolasch & Birch, LLP

(57) ABSTRACT

A structure includes a support 10, a first optical filter layer 24 provided on the support, a light scattering layer 50 provided on the light path of the first optical filter layer 24, and a second optical filter layer 21, 22, 23, 25, and 26 provided on the support 10, on a different region from the region where the first optical filter layer is provided, and the light scattering layer 50 is not provided on the light path of the second optical filter layer.

22 Claims, 9 Drawing Sheets

(56) References Cited

U.S. PATENT DOCUMENTS

| | | | |
|---|---|---|---|
| 2009/0302411 A1* | 12/2009 | Massetti | H01L 27/14609 257/447 |
| 2009/0303359 A1 | 12/2009 | Otsuka et al. | |
| 2013/0258643 A1 | 10/2013 | Helstern et al. | |
| 2014/0084784 A1 | 3/2014 | Lee et al. | |
| 2014/0178634 A1 | 6/2014 | Sugishima et al. | |
| 2014/0339606 A1* | 11/2014 | Lin | H01L 27/14621 257/228 |
| 2016/0075948 A1 | 3/2016 | Ogawa et al. | |
| 2016/0343765 A1 | 11/2016 | Tu | |
| 2017/0003547 A1 | 1/2017 | Tochigi et al. | |
| 2017/0137444 A1 | 5/2017 | Sasaki et al. | |
| 2018/0120485 A1 | 5/2018 | Oota et al. | |
| 2018/0134922 A1 | 5/2018 | Katami et al. | |
| 2018/0162976 A1 | 6/2018 | Takasaki et al. | |
| 2018/0171372 A1 | 6/2018 | Abele et al. | |
| 2019/0101672 A1* | 4/2019 | Kasai | G02B 5/003 |

FOREIGN PATENT DOCUMENTS

| | | |
|---|---|---|
| CN | 103682146 A | 3/2014 |
| CN | 104350416 A | 2/2015 |
| CN | 105428377 A | 3/2016 |
| JP | 4009779 B2 | 11/2007 |
| JP | 2013-213932 A | 10/2013 |
| JP | 2015-34961 A | 2/2015 |
| JP | 2016-170313 A | 9/2016 |
| KR | 10-2006-0033943 A | 4/2006 |
| TW | 201314370 A1 | 4/2013 |
| TW | 201629537 A | 8/2016 |
| TW | 201710073 A | 3/2017 |
| TW | 201710786 A | 3/2017 |
| WO | WO 2014/006987 A1 | 1/2014 |
| WO | WO 2015/137448 A1 | 9/2015 |
| WO | WO 2016/031810 A1 | 3/2016 |
| WO | WO 2016/186050 A1 | 11/2016 |
| WO | WO 2017/038542 A1 | 3/2017 |

OTHER PUBLICATIONS

Aruga, Process and Material for Color Filter Preparation in Liquid Crystal Display, Journal of Photopolymer Science and Technology, vol. 3, No. 1, 1990. pp. 9-16.

Chinese Office Action and Search Report, dated Feb. 1, 2021, for Chinese Application No. 201880015926.4, with an English translation of the Chinese Office Action.

He et al., "Fabrication Methods of Color Filter for LCD with Their Color Resist Materials," China FPD Conference, 2010, pp. 63-73. with an English abstract.

Lu et al., "Research Progress of Near Infrared Absorbing Material and Application," New Chemical Materials, vol. 44, No. 4, Apr. 2016, pp. 41-43, with an English abstract.

Japanese Office Action dated May 12, 2020, for corresponding Japanese Application No. 2019-509015, with English translation.

International Preliminary Report on Patentability and Written Opinion of the Intemnational Searching Authority far International Application No. PCT/JP2018/007143, dated Oct. 10, 2019, with English translation.

International Search Report for International Application No. PCT/JP2018/007143, dated Jun. 5, 2018, with English translation.

Chinese Office Action for Chinese Application No. 201880015926. 4, dated Jul. 22, 2021, with English translation.

Tawanese Office Action and Search Report for corresponding Taiwanese Application No. 107107324, dated May 27, 2021, with English translation of the Office Action.

* cited by examiner

__US 11,550,085 B2__

STRUCTURE AND OPTICAL SENSOR

CROSS-REFERENCE TO RELATED APPLICATIONS

This application is a Continuation of PCT International Application No. PCT/JP2018/007143, filed on Feb. 27, 2018, which claims priority under 35 U.S.C. § 119(a) to Japanese Patent Application No. 2017-065376, filed on Mar. 29, 2017 and Japanese Patent Application No. 2018-023270, filed on Feb. 13, 2018. Each of the above application(s) is hereby expressly incorporated by reference, in its entirety, into the present application.

BACKGROUND OF THE INVENTION

1. Field of the Invention

The present invention relates to a structure and an optical sensor.

2. Description of the Related Art

In recent years, a demand for a solid-state imaging element such as charge coupled devices (CCDs) or complementary metal oxide semiconductors (CMOSs) has greatly increased with the widespread use of digital cameras and mobile phones with cameras. As a key device for a display or an optical element, a color filter is used.

In JP2015-034961A, it is described that a light scattering layer is formed on a transparent substrate, curable-type ink is applied to the light scattering layer using an ink-jet method to form a coloration pixel, and thereby producing a color filter. According to JP2015-034961A, it is described that a color filter in which, in a case where ink is applied in a pixel region surrounded by partition walls, a color mixing between adjacent pixels is prevented, and a pixel without white spots and color unevenness in the region is formed, can be provided.

On the other hand, JP2016-170313A describes a color filter, which is for electronic paper, including a transparent substrate, a colored layer provided on the transparent substrate, and a scattering layer provided on an opposite side to the transparent substrate of the colored layer. The colored layer has a plurality of unit pixels arranged in a matrix, each unit pixel includes three coloration areas, and the scattering layer has a plurality of scattering layer areas corresponding to the coloration areas of each color. The scattering layer areas corresponding to at least two of the three coloration areas have different scattering properties, thereby scattering intensities of the three coloration areas are close to each other. According to JP2016-170313A, it is possible to suppress a change of a color according to an observation direction can be suppressed while improving viewing angle characteristics.

SUMMARY OF THE INVENTION

In recent years, a development of an optical sensor that performs various types of sensing, imaging, and the like using light (hereinafter, also collectively referred to as ambient light) such as visible light, ultraviolet rays, and near-infrared rays has been considered. For example, attempts have been made to detect ambient brightness by detecting ambient light, and to adjust light intensity of a display, lighting equipment, or the like.

In addition, in recent years, it has been considered to provide a plurality of sensor functions by incorporating a plurality of optical sensors in one electronic device. However, since the number of optical sensors used in the electronic device increases as the sensor function increases, such an electronic device tends to become large-sized.

Therefore, an object of the present invention is to provide a structure capable of realizing multi-functionalization of an optical sensor and an optical sensor.

Under the circumstances, the present inventors have conducted extensive studies, and as a result, have found that the objects can be accomplished with a structure which will be described later, and completed the present invention. The present invention provides the followings.

<1> A structure comprising:
a support;
a first optical filter layer provided on the support;
a light scattering layer provided on a light path of the first optical filter layer; and
a second optical filter layer provided on a region on the support different from a region where the first optical filter layer is provided,
wherein the light scattering layer is not provided on a light path of the second optical filter layer.

<2> The structure according to <1>,
wherein each of the first optical filter layer and the second optical filter layer independently includes at least one selected from a colored layer, a transparent layer, an ultraviolet cutting layer, a near-infrared cutting layer, or a near-infrared transmission layer.

<3> The structure according to <1> or <2>,
wherein the second optical filter layer includes at least one selected from a colored layer or a near-infrared transmission layer.

<4> The structure according to <1>,
wherein the first optical filter layer includes at least one selected from a colored layer, a transparent layer, or a near-infrared cutting layer, and
the second optical filter layer includes at least one selected from a colored layer or a near-infrared transmission layer.

<5> The structure according to <1>,
wherein the first optical filter layer includes a near-infrared cutting layer, and
the second optical filter layer includes a colored layer.

<6> The structure according to any one of <2> to <5>,
wherein the colored layer is a colored layer selected from a green colored layer, a red colored layer, a blue colored layer, a cyan colored layer, a magenta colored layer, and a yellow colored layer.

<7> The structure according to any one of <1> to <6>,
wherein the light scattering layer is provided on a light incident side of the first optical filter layer.

<8> The structure according to any one of <1> to <7>,
wherein the light scattering layer has a value of L* of 35 to 100, a value of a* of −20 to 20, and a value of b* of −40 to 30 in an L*a*b* color system of CIE 1976.

<9> The structure according to any one of <1> to <8>,
wherein the light scattering layer has a value of L* of 35 to 100, a value of a* of −10 to 0, and a value of b* of −35 to 0 in an L*a*b* color system of CIE 1976.

<10> The structure according to any one of <1> to <9>,
wherein the light scattering layer includes a white pigment.

<11> The structure according to <10>,
wherein the white pigment is particles that have an average primary particle diameter of 50 to 150 nm.

<12> The structure according to <10> or <11>,
wherein the white pigment is titanium oxide.

<13> The structure according to any one of <1> to <12>,
wherein the light scattering layer has 30% to 60% by mass of particles having an average primary particle diameter of 50 to 150 nm with respect to a total solid content of the light scattering layer.

<14> The structure according to any one of <1> to <13>, further comprising:
a near-infrared cutting layer that cuts at least a part of light in a wavelength range of 800 to 1,500 nm on the light path of the first optical filter layer.

<15> The structure according to <14>,
wherein the near-infrared cutting layer includes a compound having a maximum absorption wavelength in a wavelength range of 800 to 1,500 nm.

<16> The structure according to <14> or <15>,
wherein the near-infrared cutting layer contains at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex.

<17> The structure according to <14> or <15>,
wherein the near-infrared cutting layer contains a pyrrolopyrrole compound.

<18> The structure according to any one of <1> to <17>,
wherein the first optical filter layer and the second optical filter layer are two-dimensionally arranged on the support.

<19> An optical sensor comprising the structure according to any one of <1> to <18>.

According to the present invention, a structure which can achieve multi-functionalization of an optical sensor, and an optical sensor can be provided.

DESCRIPTION OF THE PREFERRED EMBODIMENTS

Figure 1:
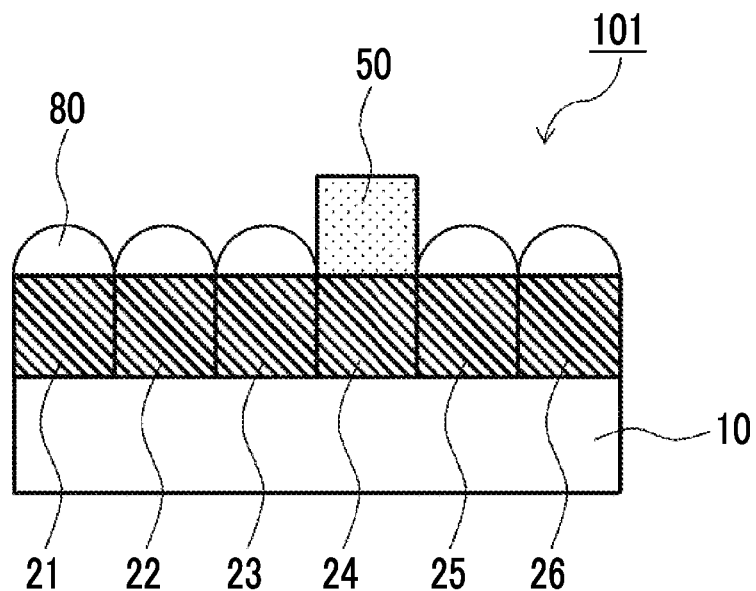
FIG. 1 is a schematic view showing an embodiment of a structure of the present invention.

Hereinafter, the contents of the present invention will be described in detail.

Description of configuration requirements described below may be made on the basis of representative embodiments of the present invention, but the present invention is not limited to such embodiments.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "(meth) acrylate" represents acrylate and methacrylate, "(meth)acryl" represents acryl and methacryl, and "(meth)acryloyl" represents acryloyl and methacryloyl.

In the present specification, Me in a formula represents a methyl group, Et represents an ethyl group, Pr represents a propyl group, Bu represents a butyl group, and Ph represents a phenyl group.

In the present specification, "a near-infrared ray" refers to light (electromagnetic wave) having a wavelength of 700 to 2500 nm.

In the present specification, "exposure" includes, unless otherwise specified, not only exposure using light but also lithography by particle rays such as electron beams and ion beams. Incidentally, light to be used in exposure means actinic rays or radiation such as a bright line spectrum of a mercury lamp, far ultraviolet rays typified by an excimer laser, extreme ultraviolet rays (EUV light), X-rays, and electron beams.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 GPC (manufactured by Tosoh Corporation), and by using columns connecting TOSOH TSKgel Super HZM-H, TOSOH TSKgel Super HZ4000, and TOSOH TSKgel Super HZ2000 as columns, and by using tetrahydrofuran as a developing solvent.

<Structure>

The structure of the embodiment of the present invention includes a support, a first optical filter layer provided on the support, a light scattering layer provided on the light path of the first optical filter layer, and a second optical filter layer provided on the support, that is on a different region from the region where the first optical filter layer is provided, and the light scattering layer is not provided on the light path of the second optical filter layer.

According to the structure of the embodiment of the present invention, the light scattering layer is provided on the light path of the first optical filter layer and thus, even in a case where the light is obliquely emitted to the first optical filter layer, light from the oblique direction with respect to the first optical filter layer can also be efficiently detected in the light receiving section of an optical sensor by scattering light in oblique directions by the light scattering layer. Therefore, in a case where the structure of the embodiment of the present invention is incorporated into the optical sensor, it is possible to cause the region provided with the first optical filter layer to function as a sensor part in which an incidence angle range is wider than the region provided with the second optical filter layer.

For example, the region where the first optical filter layer is provided is used as an ambient light sensor and the like, and the region where the second optical filter layer is provided can be used for various uses according to the type of the second optical filter layer. For example, in a case where a colored layer is used as the second optical filter layer, it is possible to capture a color image or the like by detecting light transmitted through the second optical filter layer. In the case where a near-infrared transmission layer is used as the second optical filter layer, near-infrared rays can be detected by detecting the light transmitted through the second optical filter layer, and it is possible to perform distance measurement, gesture recognition, vital recognition, and the like.

Thus, since the structure of the embodiment of the present invention has different incidence angle characteristics between the first optical filter layer and the second optical filter layer, it is possible to achieve multi-functionalization of the optical sensor function.

In the present invention, the optical filter layer means a filter layer that transmits light. Light transmitted through the optical filter layer is not particularly limited, and includes ultraviolet rays, visible light, and the near-infrared rays. The optical filter layer in the present invention may only need to transmit light of at least a part of the wavelength of an incidence ray. That is, the optical filter layer in the present invention may selectively transmit or cut light of specific wavelength among the incidence ray, and may transmit substantially all the incidence ray.

(Support)

In the structure of the embodiment of the present invention, a support is not particularly limited. It can be selected suitably according to use. For example, a silicon substrate, a glass substrate, a resin substrate, a germanium substrate, a gallium arsenide (GaAs) substrate, a gallium arsenide phosphide substrate, a gallium nitride (GaN) substrate, a silicon carbide (SiC) substrate, and an indium gallium arsenide (InGaAs) substrate are included. In addition, a charge coupled element (CCD), a complementary metal oxide semiconductor (CMOS), a transparent conductive film, or the like may be formed on the support. Additionally, there are also cases that a black matrix may be formed on the support. Moreover, an under-layer may be provided on the support, as desired, for the purpose of improving the adhesiveness to an upper layer, preventing the diffusion of materials, or planarizing a substrate surface.

(First Optical Filter Layer)

In the structure of the embodiment of the present invention, a first optical filter layer may be a filter layer that transmits light, and is not particularly limited. For example, a filter layer that selectively transmits or cuts light of specific wavelength in the incidence ray, and a filter layer that transmits substantially all the incidence ray can be exemplified. Preferable examples of the first optical filter layer include a filter layer that selectively transmits or cuts light of specific wavelength, in light in the wavelength range of 300 to 2000 nm, a filter layer that transmits substantially all of light in the above range, or the like. Specific examples of the first optical filter layer include a colored layer, a transparent layer, an ultraviolet cutting layer, a near-infrared cutting layer, a near-infrared transmission layer, and the like. And it is preferable that it is the near-infrared cutting layer, because it is easy to detect light in which noise from a near-infrared ray is reduced.

In the present invention, the ultraviolet cutting layer is a filter layer having spectral characteristics that cuts at least a part of ultraviolet rays. The ultraviolet cutting layer may transmit visible light and/or the near-infrared ray, and may cut light. Moreover, the near-infrared cutting layer means the filter layer which has spectral characteristics transmitting visible light and cutting at least a part of the near-infrared ray. In addition, the near-infrared transmission layer means the filter layer which has spectral characteristics which cut at least a part of the visible light, and transmits at least a part of the near-infrared ray.

Examples of the colored layer include a green colored layer, a red colored layer, a blue colored layer, a cyan colored layer, a magenta colored layer, and a yellow colored layer.

A minimum of transmittance in a wavelength range of 400 to 600 nm of the transparent layer is preferably 80% or more, more preferably 90% or more, and particularly preferably 95% or more.

The near-infrared transmission layer is not particularly limited as long as it is a filter layer having the spectral characteristics that cuts visible light and transmits at least a part of the near-infrared ray. The near-infrared transmission layer may be formed of a single layer film (single layer film), or may be formed of a laminate of two or more layers (multilayer film). In a case where the near-infrared transmission layer is configured with the multilayer film, the single layer film may not have the above-mentioned spectral characteristics, as long as the entire multilayer film has the above-mentioned spectral characteristics.

As a preferable example of the near-infrared transmission layer, for example, the filter layer having any of the following spectral characteristics (1) to (4) can be exemplified.

(1): A filter layer in which a maximum value of light transmittance in the thickness direction in the wavelength range of 400 to 640 nm is 20% or less (preferably 15% or less, more preferably 10% or less), and a minimum value of light transmittance in the thickness direction in the wavelength range of 800 to 1300 nm is 70% or more (preferably 75% or more, more preferably 80% or more). According to the filter layer, it is possible that light in the wavelength range of 400 to 640 nm is cut and light in the wavelength of more than 670 nm is transmitted.

(2): A filter layer in which a maximum value of light transmittance in the thickness direction in the wavelength range of 400 to 750 nm is 20% or less (preferably 15% or less, more preferably 10% or less), a minimum value of light transmittance in the thickness direction in the wavelength range of 900 to 1300 nm is 70% or more (preferably 75% or more, more preferably 80% or more). According to the filter layer, it is possible that light in the wavelength range of 400 to 750 nm is cut and light in the wavelength of more than 850 nm is transmitted.

(3): A filter layer in which a maximum value of light transmittance in the thickness direction in the wavelength range of 400 to 830 nm is 20% or less (preferably 15% or less, more preferably 10% or less), and a minimum value of light transmittance in the thickness direction in the wavelength range of 1000 to 1300 nm is 70% or more (preferably 75% or more, more preferably 80% or more). According to the filter layer, it is possible that light in the wavelength range of 400 to 830 nm is cut and light in the wavelength of more than 940 nm is transmitted.

(4): A filter layer in which a maximum value of light transmittance in the thickness direction in the wavelength range of 400 to 950 nm is 20% or less (preferably 15% or less, more preferably 10% or less), and a minimum value of light transmittance in the thickness direction in the wavelength range of 1100 to 1300 nm is 70% or more (preferably 75% or more, more preferably 80% or more). According to the filter layer, it is possible that light in the wavelength range of 400 to 950 nm is cut and light in the wavelength of more than 1040 nm is transmitted.

The near-infrared cutting layer is not particularly limited as long as it is the filter layer having spectral characteristics that transmit visible light and cuts at least a part of the near-infrared ray. The near-infrared cutting layer may transmit all visible light, or may cut light in a specific wavelength region in visible light by transmitting light in the specific wavelength region. The near-infrared cutting layer is preferably a filter layer that cuts at least a part of light in the wavelength range of 800 to 1500 nm. Preferred spectral characteristics of the near-infrared cutting layer will be described later.

The ultraviolet cutting layer is not particularly limited as long as it is the filter layer having spectral characteristics that cuts at least a part of ultraviolet rays. The ultraviolet cutting layer may transmit visible light and/or the near-infrared ray, and may cut light. A minimum of transmittance in a wavelength range at 400 to 700 nm of the ultraviolet cutting layer is preferably 60% or more, more preferably 70% or more, and particularly preferably 80% or more. Further, a minimum of transmittance in a wavelength range at 300 to 400 nm is preferably 15% or less, more preferably 10% or less, and still more preferably 5% or less.

The first optical filter layer may be only one type, or of two or more types. For example, it may be configured with two or more colored layers, and may be composed of one or more colored layers and the transparent layer and/or the near-infrared cutting layer.

The thickness of the first optical filter layer is not particularly limited. For example, 100 μm or less is preferable, 15 μm or less is more preferable, 5 μm or less is still more preferable, and 1 μm or less is particularly preferable. In a case where the first optical filter layer is configured with a plurality of filter layers, the thickness of each filter layer may be the same or different. The thickness of each filter layer is preferably substantially the same from the viewpoint of flatness, adhesion, and incident angle characteristics. Moreover, it is preferable that the height difference of the upper surface of adjacent filter layers is substantially the same.

(Light Scattering Layer)

The structure of the embodiment of the present invention has a light scattering layer on a light path of a first optical filter layer. The light scattering layer may be provided on either a light incident side to the first optical filter layer or a light emission side from the first optical filter layer. However, it is preferable to be provided on the light incident side to the first optical filter layer, because viewing angle characteristics can be further improved. The light incident side is intended to be opposite side to side on which the support is provided of the first optical filter layer, and a light emission side is intended to be the same side to the side on which the support is provided of the first optical filter layer.

In the structure of the embodiment of the present invention, it is preferable for the light scattering layer to have an $L^*$ value of 35 to 100, $a^*$ value of $-20$ to 20, and $b^*$ value of $-40$ to 30 in the $L^*a^*b^*$ color system of CIE 1976 and it is more preferable that the value of $L^*$ is 35 to 100, the value of $a^*$ is $-10$ to 0, and the value of $b^*$ is $-35$ to 0. The light scattering layer having such spectral characteristics is excellent in whiteness and light scattering. Furthermore, it is possible to efficiently detect a target light such as ambient light using the light scattering layer having such spectral characteristics. The value of the $L^*$, the value of $a^*$, and the value of $b^*$ in an $L^*a^*b^*$ color system of CIE 1976 of the light scattering layer were measured using a spectrophotometer (X-Rite 528, manufactured by X-Rite Inc.). Specifically, D65 light source was used as a light source, an observation field of view was set to 2°, and a white reference was set using a white patch of a calibration reference plate included in the spectrophotometer.

The value of $L^*$ of the light scattering layer is preferably 40 or more, more preferably 50 or more, and still more preferably 60 or more. According to this aspect, the light scattering layer having excellent whiteness and the light scattering can be obtained. Further, the value of $L^*$ of the light scattering layer is preferably 95 or less, more preferably 90 or less, and still more preferably 85 or less. According to this aspect, the light scattering layer having appropriate visible transparency can be obtained, and target light such as ambient light can be efficiently detected.

The value of $a^*$ of the light scattering layer is preferably $-15$ or more, more preferably $-10$ or more, and still more preferably $-5$ or more. Further, the value of $a^*$ of the light scattering layer is preferably 10 or less, more preferably 5 or less, and still more preferably 0 or less. According to this aspect, the light scattering layer having excellent whiteness can be obtained.

The value of $b^*$ of the light scattering layer is preferably $-35$ or more, more preferably $-30$ or more, and still more preferably $-25$ or more. Further, the value of $b^*$ of the light scattering layer is preferably 20 or less, more preferably 10 or less, and still more preferably 0 or less. According to this aspect, the light scattering layer having excellent whiteness can be obtained.

The thickness of the light scattering layer is preferably 3 to 40 μm. The upper limit of the film thickness is preferably 30 μm or less, more preferably 20 μm or less, and still more preferably 15 μm or less. The lower limit of the film thickness is preferably 5 μm or more, more preferably 7 μm or more, and still more preferably 9 μm or more. In a case where the film thickness of the light scattering layer is within the range, an effect of reduction in the film thickness of a sensor and improvement of a device optical sensitivity due to inhibition of cross torques can be expected.

The average transmittance with respect to light in wavelength range of 400 to 700 nm of the light scattering layer is preferably 1% or more, more preferably 10% or more, and particularly preferably 30% or more. The upper limit of the average transmittance is preferably 50% or less.

The light scattering layer preferably contains a white pigment. Further, in the present invention, the white pigment includes not only pure white pigments, but also bright grey close to white (for example, off-white and light grey) pigments.

The content of the white pigment in the light scattering layer is preferably 1% to 75% by mass with respect to the total solid content of the light scattering layer. The lower limit is preferably 3% by mass or more, more preferably 5% by mass or more, still more preferably 25% by mass or more, and particularly preferably 35% by mass or more. The upper limit is preferably 60% by mass or less, more preferably 55% by mass or less, still more preferably 50% by mass or less, even still more preferably 45% by mass or less, and particularly preferably 42% by mass or less. In a case where the content of the white pigment is within the range, the whiteness and light scattering of the light scattering layer is good. The light scattering layer may include only one kind or two or more kinds of white pigments. In a case where the light scattering layer includes two or more kinds of the white pigments, the total amount thereof preferably falls within the range.

The white pigment is preferably in the form of particles having a refractive index to light at a wavelength of 589 nm of 2.10 or more. The above-mentioned refractive index is preferably 2.10 to 3.00, and more preferably 2.50 to 2.75. In a case where the refractive index to light at a wavelength of 589 nm of the particles is 2.10 or more, the value of L* of light scattering layer can be increased, which is thus preferable.

The refractive index of the white pigment can be measured by the following method. First, a dispersion liquid is prepared using a white pigment and a resin (dispersant) having a known refractive index, and propylene glycol monomethyl ether acetate. Thereafter, the prepared dispersion liquid and a resin having a known refractive index are mixed to prepare coating liquids having concentrations of the white pigment of 10% by mass, 20% by mass, 30% by mass, and 40% by mass in the total solid content of the coating liquid. After these coating liquids are used on a silicon wafer to form a film in thickness of 300 nm, and then the refractive index of the obtained film is measured using ellipsometry (Lambda Ace RE-3300 (trade name), Dainippon Screen Mfg. Co., Ltd.). Thereafter, by plotting the white pigment concentration and the refractive index on a graph and the refractive index of the white pigment is derived.

After extracting the white pigment from the light scattering layer by the following method, the refractive index of the white pigment can also be measured by the method. As for a method for extracting the white pigment from the light scattering layer, for example, 2 to 6 mol/L of a basic solution can be added to a light scattering layer in the amount of 10% to 30% by mass with respect to the mass of the light scattering layer, heated and refluxed for 12 hours, and then filtered and washed to extract a white pigment.

Also, the refractive index of the white pigment can be measured by the method described in 'AIST Measurement Standard Report Vol. 6, No. 1 (P. 11); measure skill of solid refractive index, and investigation and research related to standard establishment'.

The average primary particle diameter of the white pigment is preferably 50 to 300 nm, more preferably 50 to 200 nm, still more preferably 50 to 150 nm, even still more preferably 50 to 130 nm, and particularly preferably 50 to 100 nm. In a case where the average primary particle diameter of the white pigment is within the range, the light scattering layer having good whiteness and light scattering can be obtained. Above all, in a case where the average primary particle diameter of the white pigment is 50 to 150 nm (preferably 50 to 130 nm, and more preferably 50 to 100 nm), the light scattering layer having good whiteness and light scattering can be obtained while increasing visible transparency. In addition, the temporal stability of the composition used for the formation of the light scattering layer can be increased. For example, sedimentation of the white pigment and the like can be effectively suppressed. The average primary particle diameter of the white pigment can be determined by observing the white pigment with a transmission electron microscope (TEM), and a portion in which the particles of the white pigment are not aggregated (primary particles). In the present invention, a number-based arithmetic mean diameter calculated from the particle size distribution of the white pigment was taken as an average primary particle diameter of the white pigment. In the present invention, with regard to the particle size distribution of the white pigment is determined by taking the image of the primary particles of the white pigment using the transmission electron microscope, and then measuring the particle size distribution with an image treatment device using the image. An electron microscope (H-7000) manufactured by Hitachi High-Technologies Corporation can be used as the transmission electron microscope. LUZEX AP manufactured by NIRECO Corporation can be used as the image treatment device.

The content of the particles having an average primary particle diameter of 50 to 150 nm in the light scattering layer is preferably 30% to 60% by mass, and more preferably 35% to 50% by mass, with respect to the total solid content of the light scattering layer. According to this aspect, visible transparency of the light scattering layer can be increased. In addition, the temporal stability of the composition used for the formation of the light scattering layer can be increased.

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably in the form of particles having titanium atom, and more preferably titanium oxide. As the titanium oxide, the titanium oxide described in "Titanium Oxide-Physical Properties and Applied Technology, written by Manabu Kiyono, published on Jun. 25, 1991, published by Shuppan Co., Ltd." can also be suitably used.

With regard to titanium oxide, the content (purity) of titanium dioxide ($TiO_2$) is preferably 70% by mass or more, more preferably 80% by mass or more, and still more preferably 85% by mass or more. With regard to titanium oxide, the content of lower titanium oxide represented by $Ti_nO_{2n-1}$ (n represents a number of 2 to 4), titanium oxynitride, and the like is preferably 30% by mass or less, more preferably 20% by mass or less, and still more preferably 15% by mass or less.

The titanium oxide may be either anatase type titanium oxide or rutile type titanium oxide, but from the viewpoints of a coloration property, and the temporal stability of the composition, the rutile type titanium oxide is preferable. In particular, the rutile type titanium oxide has a small change in the color difference even with heating and has a good coloration property. In addition, the rutilization rate of titanium oxide is preferably 95% or more, and more preferably 99% or more.

As the rutile type titanium oxide, known ones can be used. As a method for producing the rutile type titanium oxide, there are two kinds of methods, a sulfuric acid method and a chlorine method, and in the present invention, rutile type titanium oxide produced by any of the methods can be suitably used. Here, the sulfuric acid method refers to a method in which ilmenite ore or titanium slag is used as a raw material, which is dissolved in concentrated sulfuric acid to separate iron as iron sulfate, the solution is hydrolyzed to obtain a precipitate of hydroxide, and the hydroxide is calcined at a high temperature to recover rutile type titanium oxide. On the other hand, the chlorine method refers to a production method in which synthetic rutile or natural rutile used as a raw material is reacted with chlorine gas and carbon at a high temperature of about 1,000° C. to synthesize titanium tetrachloride, which is oxidized to extract rutile type titanium oxide. The rutile type titanium oxide is preferably rutile type titanium oxide obtained by the chlorine method.

As the specific surface area of titanium oxide, a value thereof as measured by a Brunauer, Emmett, and Teller (BET) method is preferably 10 to 400 m$^2$/g, more preferably 10 to 200 m$^2$/g, still more preferably 10 to 150 m$^2$/g, particularly preferably 10 to 40 m$^2$/g, and most preferably 10 to 20 m$^2$/g.

The pH of titanium oxide is preferably 6 to 8.

The oil absorption amount of titanium oxide is preferably 10 to 60 (g/100 g), and more preferably 10 to 40 (g/100 g).

For titanium oxide, the total amount of $Fe_2O_3$, $Al_2O_3$, $SiO_2$, $Nb_2O_5$, and $Na_2O$ is preferably 0.1% by mass or less, more preferably 0.05% by mass or less, and still more preferably 0.02% by mass or less, and particularly preferably, titanium oxide is not substantially included.

The shape of titanium oxide is not particularly limited. Examples thereof include shapes such as an isotropic shape (for example, a spherical shape and a polyhedral shape), an anisotropic shape (for example, a needle-like shape, a rod-like shape, and a plate-like shape), and an amorphous shape.

The hardness (Mohs hardness) of titanium oxide is preferably 5 to 8, and more preferably 7 to 7.5.

The true specific gravity (density) of titanium oxide is preferably 1.0 to 6.0 g/cm$^3$, and more preferably 3.9 to 4.5 g/cm$^3$.

The volume gravity of titanium oxide is preferably 0.1 g/cm$^3$ to 1.0 g/cm$^3$, and more preferably 0.2 g/cm$^3$ to 0.4 g/cm$^3$.

A white pigment such as titanium oxide may be a material which has been subjected to a surface treatment with a surface treating agent such as an organic compound. Examples of the surface treating agent used for the surface treatment of the white pigment include a polyol, aluminum oxide, aluminum hydroxide, silica (silicon oxide), hydrated silica, alkanolamine, stearic acid, organosiloxane, zirconium oxide, hydrogenphosphite dimethicone, a silane coupling agent, and a titanate coupling agent. Among those, the silane coupling agent is preferable. Further, the white pigment such as titanium oxide is preferably a material which has been subjected to a surface treatment. The surface treatment can be carried out with only one kind of surface treating agent or a combination of two or more kinds of surface treating agents. Further, it is also preferable that the surface of a white pigment such as titanium oxide is coated with oxides such as aluminum oxide, silica, and zirconium oxide. Thus, the light resistance and the dispersibility are further improved.

It is also preferable that a white pigment such as titanium oxide is coated with a basic metal oxide or a basic metal hydroxide. Examples of the basic metal oxide or the basic metal hydroxide include metal compounds containing magnesium, zirconium, cerium, strontium, antimony, barium, calcium, or the like.

The white pigment coated with a basic metal oxide or a basic metal hydroxide can be obtained, for example, as follows.

The white pigment is dispersed in water or a liquid including water as a main component to obtain a slurry. The white pigment is pulverized using a sand mill, a ball mill, or the like, as desired. Then, the pH of the slurry is adjusted to make the slurry neutral or alkaline, or acidic, as desired. Thereafter, a water-soluble salt thereof which serves as a raw material for a coating material is added to the slurry to coat the surface of the white pigment. Thereafter, the slurry is neutralized to recover the white pigment. The recovered white pigment may be dried or dry-pulverized.

It is preferable that the white pigment such as titanium oxide may be a material formed by surface-treating the surface of inorganic particles having an acidic site with a compound capable of reacting with the acidic site. Examples of the compound capable of reacting with the acidic site include polyhydric alcohols such as trimethylolpropane, trimethylolethane, ditrimethylolpropane, trimethylolpropane ethoxylate, and pentaerythritol, alkanolamines such as monoethanolamine, monopropanolamine, diethanolamine, dipropanolamine, triethanolamine, and tripropanolamine, chlorosilanes, and alkoxysilanes. Examples of a method for treating the surface of inorganic particles having an acidic site with a compound capable of reacting with the acidic site include (1) a method in which the compound and the inorganic particles are put into a dry pulverizer such as a fluid energy pulverizer and an impact pulverizer, and the inorganic particles are pulverized, (2) a method in which the compound and the dry-pulverized inorganic particles are stirred and mixed using a high-speed stirrer such as a Henschel mixer and a super mixer, and (3) a method in which the compound is added to an aqueous slurry of the inorganic particles, and stirred.

In addition, as the titanium oxide, the titanium oxide described in "Titanium Oxide-Physical Properties and Applied Technology, written by Manabu Kiyono, published on Jun. 25, 1991, pages 13-45, published by Gihodo Shuppan Co., Ltd." can also be suitably used.

As the white pigment, a commercially available product can be preferably used. The commercially available product may be used as it is or may be used after performing a classification treatment. Examples of a commercially available product of titanium oxide include: trade names TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-401L, PT-501A, PT-501R, UT771, TTO-51C, TTO-55C, TTO-80A, TTO-S-2, A-220, MPT-136, MPT-140, and MPT-141, manufactured by ISHIHARA SANGYO KAISHA, LTD.;

trade names R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, STR-100A-LP, STR-100C-LP, and TCA-123E, manufactured by Sakai Chemical Industry Co., Ltd.;

trade names JR, JRNC, JR-301, JR-403, JR-405, JR-600 A, JR-600 E, JR-603, JR-605, JR-701, JR-800, JR-805, JR-806, JR-1000, MT-01, MT-05, MT-10 EX, MT-100 S, MT-100 TV, MT-100 Z, MT-100 AQ, MT-100 WP, MT-100 SA, MT-100HD, MT-150 EX, MT-150 W, MT-300HD, MT-500B, MT-500 SA, MT-500HD, MT-600B, MT-600 SA, MT-700B, MT-700BS, MT-700HD, and MT-700Z, manufactured by TAYCA CORPORATION;

trade names KR-310, KR-380, KR-380N, and ST-485SA15, manufactured by Titan Kogyo, Ltd.;

trade names TR-600, TR-700, TR-750, TR-840, and TR-900, manufactured by Fuji Titanium Industry Co., Ltd.; and trade name Brilliant 1500 manufactured by Shiraishi Calcium Kaisha, Ltd. Further, titanium oxide described in paragraph Nos. 0025 to 0027 of JP2015-067794A can also be used.

In addition, examples of a commercially available product of strontium titanate include SW-100 (manufactured by Titan Kogyo, Ltd.). Examples of a commercially available product of barium sulfate include BF-1L (manufactured by Sakai Chemical Industry Co., Ltd.). Examples of a commercially available product of zinc oxide include Zincox Super F-1 (manufactured by Hakusui Tech Co., Ltd.). Examples of a commercially available product of zirconium oxide include Z-NX (manufactured by Taiyo Engineering Corporation).

In the present invention, it is preferable that as the white pigment, not only particles including only singular inorganic substance, but also composite particles including other materials may be used. It is preferable to use, for example, particles having pores or other materials therein, particles having a number of inorganic particles attached to core particles, or core-shell composite particles including core particles including polymer particles and a shell layer including inorganic fine nanoparticles. With regard to the core-shell composite particles including core particles including polymer particles and a shell layer including inorganic fine nanoparticles, reference can be made to, for example, the descriptions in paragraph Nos. 0012 to 0042 of JP2015-047520A, the contents of which are incorporated herein by reference.

In the present invention, as the white pigment, hollow inorganic particles can also be used. The hollow inorganic particles refer to inorganic particles having a structure with a cavity therein, which have a hole enclosed by a shell. As the hollow inorganic particles, the hollow inorganic particles described in JP2011-075786A, WO2013-061621A, JP2015-164881A, and the like can be used, the contents of which are incorporated herein by reference.

The diameters of the hollow portions of the hollow inorganic particles are not particularly limited. The diameters of the hollow portions of the hollow inorganic particles are preferably 5 to 900 nm, more preferably 20 to 800 nm, and particularly preferably 50 to 500 nm.

The shell materials of the hollow inorganic particles, that is, the materials surrounding the hollow portions of the hollow inorganic particles are not particularly limited, but various inorganic substances are used. Examples thereof include zinc sulfide, barium sulfate, lead carbonate, lead oxide, antimony oxide, potassium titanate, barium titanate, zinc oxide, zirconium oxide, cerium oxide, lanthanum oxide, and titanium oxide, and titanium oxide is preferable.

The average particle diameter (preferably an average secondary particle diameter) of the hollow inorganic particles is preferably 100 to 1,000 nm, more preferably 150 to 600 nm, and particularly preferably 200 to 500 nm.

The porosity of the hollow inorganic particles is preferably 5% to 90% by volume, more preferably 10% to 80% by volume, and particularly preferably 30% to 70% by volume. Incidentally, the porosity of the hollow inorganic particles is a total percent by volume of the hollow portions of the hollow inorganic particles in a case where the entire volume of the hollow inorganic particles is taken as 100% by volume. The porosity of the hollow inorganic particle can be determined by calculation using the refractive index of the hollow inorganic particles and a theoretical value of the refractive index calculated from the material of the hollow inorganic particles. Further, the porosity of the hollow inorganic particles can also be determined, for example, by cutting a layer (light scattering layer) including the hollow inorganic particles, observing the shape and size of the multiple hollow inorganic particles shown on the cut surface, and the shapes and the sizes of the hollow portions of the hollow inorganic particles, and calculating the total volume of the hollow inorganic particles and the total volume of the hollow portions of the hollow inorganic particles.

In a case where the light scattering layer contains hollow inorganic particles as the white pigment, it is preferable that hollow inorganic particles having an average particle diameter of 100 to 1,000 nm is contained in the proportion of 35% to 50% by mass with respect to the total solid content of the light scattering layer. According to this aspect, it is easy to form a light scattering layer having excellent whiteness and light scattering.

The light scattering layer can be formed using a composition including a white pigment (hereinafter also referred to as a composition for forming a light scattering layer). The details of the composition for forming a light scattering layer will be described later.

(Second Optical Filter Layer)

The structure of the embodiment of the present invention has a second optical filter layer on the support, that is in a region different from the region provided with the first optical filter layer. A light scattering layer is not provided on the light path of the second optical filter layer. In the structure of the embodiment of the present invention, the first optical filter layer and the second optical filter layer may be two-dimensionally disposed on the support, or both may be disposed on a different plane. Among them, it is preferable that the first optical filter layer and the second optical filter layer are two-dimensionally arranged on the support because it is easy to detect the target light with further reduced noise. Further, from the viewpoint of incident angle characteristics and the like, it is preferable that the height difference between the upper surfaces of the first optical filter layer and the second optical filter layer is substantially the same. In the present invention, the fact that the first optical filter layer and the second optical filter layer are two-dimensionally arranged on the support means that a part of the first optical filter layer and a part of the second optical filter layer exist on the same plane.

In the structure of the embodiment of the present invention, at least a part of the second optical filter layer may be continuously connected to the first optical filter layer. For example, in the case where at least a part of the second optical filter layer adjacent to the first optical filter layer is an optical filter layer of the same type as the first optical filter layer, the same type of optical filter layers in the first optical filter layer and the second optical filter layer may be connected continuously. In the structure of the embodiment of the present invention, the first optical filter layer and the second optical filter layer may be adjacent to each other, and a partition may be provided between the two.

The type of the second optical filter layer is not particularly limited as long as it is a filter layer that transmits light. For example, a filter layer that selectively transmits or cuts light of specific wavelength among incidence ray, and a filter layer that transmits substantially all the incidence ray can be exemplified. As the second optical filter layer, a filter layer that selectively transmits or cuts light of a specific wavelength in light of a wavelength range of 300 to 2000 nm, a filter layer that transmits substantially all of light of the above range, and the like are included as preferred examples. Preferred specific examples of the second optical filter layer include a colored layer, a transparent layer, an ultraviolet cutting layer, a near-infrared cutting layer, a near-infrared transmission layer, and the like. The second optical filter layer preferably includes a filter layer that transmits at least a part of visible light or near-infrared ray, and more preferably includes at least one filter layer selected from the colored layer or the near-infrared transmission layer. The second optical filter layer preferably includes a filter layer of a different type (spectral characteristics) from the first optical filter layer. For example, in a case where the first optical filter layer is a green colored layer, the second optical filter layer preferably includes at least a layer other than the green colored layer. The second optical filter layer may further include the transparent layer, the near-infrared cutting layer, an ultraviolet cutting layer, and the like in addition to the colored layer and the near-infrared transmission layer. In a case where the second optical filter layer is configured with a plurality of filter layers, it is preferable that the upper height difference between surfaces of adjacent filter layers is substantially the same from the viewpoint of flatness, adhesion, and incident angle characteristics.

Examples of the colored layer include the green colored layer, the red colored layer, the blue colored layer, the cyan colored layer, the magenta colored layer, and the yellow colored layer and one or more of these colored layers can be used in combination. There are an aspect using a combination of two types selected from the green colored layer, the red colored layer and the blue colored layer, an aspect using the green colored layer, the red colored layer and the blue colored layer in combination, an aspect using the combination of two types selected from the cyan colored layer, the magenta colored layer and the yellow colored layer. Among them, an aspect in which the cyan colored layer, the magenta colored layer and the yellow colored layer are used in combination is preferable. And an aspect using the green colored layer, the red colored layer and the blue colored layer in combination, and an aspect in which the cyan colored layer, the magenta colored layer and the yellow colored layer are used in combination are more preferable.

Examples of the transparent layer, the near-infrared transmission layer, the near-infrared cutting layer, and the ultraviolet cutting layer include the filter layers described in the first optical filter layer as described above, and a preferred range is also the same.

As a combination of the first optical filter layer and the second optical filter layer, a combination in which the first optical filter layer includes at least one selected from the colored layer, the transparent layer, or the near-infrared cutting layer, and the second optical filter layer includes at least one selected from the colored layer or the near-infrared transmission layer is preferable. And a combination in which the first optical filter layer includes the near-infrared cutting layer and the second optical filter layer includes the colored layer is more preferable. Specific combinations of the first optical filter layer and the second optical filter layer include the following.

(1) A combination in which the first optical filter layer is a filter layer including one or more colored layers selected from a green colored layer, a red colored layer and a blue colored layer, and the second optical filter layer is the filter layer including one or more colored layers selected from the green colored layer, the red colored layer and the blue colored layer. In this combination, the second optical filter layer preferably includes a different colored layer from that of the first optical filter layer.

(2) A combination in which the first optical filter layer is a filter layer including one or more colored layers selected from a cyan colored layers, a magenta colored layers and a yellow colored layers, and the second optical filter layer is the filter layer including one or more colored layers selected from the cyan colored layers, the magenta colored layers and the yellow colored layers. In this combination, the second optical filter layer preferably includes a different colored layer from that of the first optical filter layer.

(3) A combination in which the first optical filter layer is the filter layer including one or more colored layers selected from the cyan colored layer, the magenta colored layer and the yellow colored layer, and the second optical filter layer is the filter layer including one or more colored layers selected from the green colored layer, the red colored layer and the blue colored layer.

(4) A combination in which the first optical filter layer is the filter layer including one or more colored layers selected from the green colored layer, the red colored layer and the blue colored layer, and the second optical filter layer is the filter layer including one or more colored layers selected from the cyan colored layers, the magenta colored layers and the yellow colored layers.

(5) The combination according to the above (1) to (4), in which the second optical filter layer is a filter layer further including the near-infrared transmission layer.

(6) A combination in which the first optical filter layer is a filter layer including one or more colored layers selected from the green colored layers, the red colored layers, the blue colored layers, the cyan colored layers, the magenta colored layers and the yellow colored layers and the second optical filter layer is the filter layer including the near-infrared transmission layer.

(7) A combination in which the first optical filter layer is the filter layer including the transparent layer, and the second optical filter layer is the filter layer including one or more colored layers selected from the green colored layers, the red colored layers, the blue colored layers, the cyan colored layers, the magenta colored layers and the yellow colored layers.

(8) A combination in which the first optical filter layer is the filter layer including the transparent layer, and the second optical filter layer is a filter layer including the near-infrared transmission layer.

(9) A combination in which the first optical filter layer is the filter layer including the transparent layer, and the second optical filter layer is the filter layer that includes one or more colored layers selected from the green colored layer, the red colored layer, the blue colored layer, the cyan colored layer, the magenta colored layer and the yellow color, and includes the near-infrared transmission layer.

(10) A combination in which the first optical filter layer is a filter layer including a near-infrared cutting layer, and the second optical filter layer is the filter layer including one or more colored layers selected from the green colored layers, the red colored layers, the blue colored layers, the cyan colored layers, the magenta colored layers and the yellow colored layers.

(11) A combination in which the first optical filter layer is the filter layer including the near-infrared cutting layer, and the second optical filter layer is the filter layer including the near-infrared transmission layer.

(12) A combination in which the first optical filter layer is the filter layer including a near-infrared cutting layer, and the second optical filter layer is the filter layer that includes one or more colored layers selected from the green colored layer, the red colored layer, the blue colored layer, the cyan colored layer, the magenta colored layer and the yellow color, and includes the near-infrared transmission layer.

(13) The combination according to the above (1) to (12), in which the second optical filter layer is the filter layer further including at least one selected from the transparent layer, the near-infrared cutting layer, or the ultraviolet cutting layer.

The thickness of the second optical filter layer is not particularly limited. For example, 100 µm or less is preferable, 15 µm or less is more preferable, 5 µm or less is still more preferable, and 1 µm or less is particularly preferable. In a case where the second optical filter layer is configured with the plurality of filter layers, the thickness of each filter layer may be the same or different. It can be adjusted suitably according to the characteristics of each filter.

In the structure of the embodiment of the present invention, the ratio of the area of the first optical filter layer and the second optical filter layer on the support is preferably the first optical filter layer/second optical filter layer=1/100 to 50/50, more preferably 5/95 to 50/50, and still more preferably 10/90 to 50/50. In a case where the area ratio is in the above range, the sensitivity of target light in each filter layer is good.

(Near-Infrared Cutting Layer)

The structure of the embodiment of the present invention preferably further has the near-infrared cutting layer for cutting at least a part of light in the wavelength range of 800 to 1500 nm on the light path of the first optical filter layer. According to this aspect, it is possible to detect light or the like in which noise derived from the near-infrared rays is reduced. In the case where the first optical filter layer itself is the near-infrared cutting layer, the same effect can be expected without providing the near-infrared cutting layer. Therefore, in a case where the near-infrared cutting layer is provided on the light path of the first optical filter layer, the first optical filter layer is preferably a filter layer other than the near-infrared cutting layer.

In a case where the structure of the embodiment of the present invention has the near-infrared cutting layer, the near-infrared cutting layer may be provided only on the light path of the first optical filter layer, or provided on the light path of the second optical filter layer. Also, the near-infrared cutting layer may be provided only on the light path of the second optical filter layer. In addition, lamination order of the first optical filter layer, the light scattering layer, and the near-infrared cutting layer is not particularly limited, but the following (1) to (3) are preferable, (1) or (2) is more preferable, and (2) is still more preferable. According to the aspect of (1) or (2), the viewing angle characteristics in the first optical filter layer can be further improved. Moreover, according to the aspect of (2), at the time of manufacture of a structure, because color mixing of the first optical filter layer and the light scattering layer can be suppressed by the near-infrared cutting layer, it is easy to detect target light in which noise was reduced more.

(1) An aspect in which the light scattering layer, the near-infrared cutting layer, and the first optical filter layer are laminated in order from the incidence ray side.

(2) An aspect in which the light scattering layer, the first optical filter layer, and the near-infrared cutting layer are laminated in order from the incidence ray side.

(3) An aspect in which the near-infrared cutting layer, the light scattering layer, and the first optical filter layer are laminated in order from the incidence ray side.

The near-infrared cutting layer is preferably a layer that cuts at least a part of light in the wavelength range of 800 to 1200 nm. In the near-infrared cutting layer, the transmittance with respect to light having the wavelength of at least a part of the wavelength region of 800 to 1,200 nm is preferably 50% or less, more preferably 25% or less, and still more preferably 10% or less.

The near-infrared cutting layer preferably has at least one of the following spectral characteristics.

(1) Transmittance of light having a wavelength of at least a part of the wavelength range of 800 nm or more and less than 850 nm is preferably 50% or less, more preferably 25% or less, and still more preferably 10% or less. Further, average transmittance of light having the wavelength range of 800 nm or more and less than 850 nm is preferably 50% or less, more preferably 25% or less, and still more preferably 10% or less.

(2) Transmittance of a light having a wavelength of at least a part of the wavelength rage of 850 nm or more and less than 900 nm is preferably 50% or less, more preferably 25% or less, and still more preferably 10% or less. Further, average transmittance of light having the wavelength of 850 nm or more and less than 900 nm is preferably 50% or less, more preferably 25% or less, and still more preferably 10% or less.

(3) Transmittance of light having a wavelength of at least a part of the wavelength rage of 900 nm or more and less than 950 nm is preferably 50% or less, more preferably 25% or less, and still more preferably 10% or less. Further, average transmittance of light having the wavelength of 900 nm or more and less than 950 nm is preferably 50% or less, more preferably 25% or less, and still more preferably 10% or less.

(4) Transmittance of light having a wavelength of at least a part of the wavelength range of 950 nm or more and less than 1000 nm is preferably 50% or less, more preferably 25% or less, and still more preferably 10% or less. Further, average transmittance of light having the wavelength of 950 nm or more and less than 1000 nm is preferably 50% or less, more preferably 25% or less, and still more preferably 10% or less.

(5) Transmittance of light having a wavelength of at least a part of the wavelength rage of 1000 nm or more and less than 1050 nm is preferably 50% or less, more preferably 25% or less, and still more preferably 10% or less. Further, average transmittance of light having the wavelength of 1000 nm or more and less than 1050 nm is preferably 50% or less, more preferably 25% or less, and still more preferably 10% or less.

(6) Transmittance of light having a wavelength of at least a part of the wavelength rage of 1050 nm or more and less than 1100 nm is preferably 50% or less, more preferably 25% or less, and still more preferably 10% or less. Further, average transmittance of light having the wavelength of 1050 nm or more and less than 1100 nm is preferably 50% or less, more preferably 25% or less, and still more preferably 10% or less.

(7) Transmittance of light having a wavelength of at least a part of the wavelength rage of 1100 nm or more and less than 1150 nm is preferably 50% or less, more preferably 25% or less, and still more preferably 10% or less. Further, average transmittance of light having the wavelength of 1100 nm or more and less than 1150 nm is preferably 50% or less, more preferably 25% or less, and still more preferably 10% or less.

(8) Transmittance of light having a wavelength of at least a part of the wavelength rage of 1150 nm or more and less than 1200 nm is preferably 50% or less, more preferably 25% or less, and still more preferably 10% or less. Further, average transmittance of light having the wavelength of 1150 nm or more and less than 1200 nm is preferably 50% or less, more preferably 25% or less, and still more preferably 10% or less.

It is preferable that an average transmittance of light having a wavelength range of 400 to 700 nm with respect to the near-infrared cutting layer is preferably 60% to 100%, more preferably 70% to 100%, and particularly preferably 80% to 100%. It is preferable that the average transmittance in this wavelength region is high.

In the structure according to the embodiment of the present invention, as the near-infrared cutting layer, any layer that has the above-mentioned spectral characteristics can be preferably used. For example, examples of the near-infrared cutting layer include a layer including a near-infrared absorber, and a dielectric multilayer film. Further, as the near-infrared cutting layer, a combination of the layer including the near-infrared absorber and the dielectric multilayer film can also be used. Hereinafter, the layer containing the near-infrared absorber and the dielectric multilayer film will be described.

[Layer Including Near-Infrared Absorber]

Examples of the near-infrared absorber used in the layer including a near-infrared absorber include a compound having a maximum absorption wavelength in the range of 700 to 1,500 nm. The near-infrared absorber is preferably a compound having a maximum absorption wavelength in the range of 800 to 1,500 nm, more preferably a compound having a maximum absorption wavelength in the range of 800 to 1,300 nm, and still more preferably a compound having a maximum absorption wavelength in the range of 800 to 1,200 nm. Further, the near-infrared absorber used in the layer including a near-infrared absorber is preferably at least one selected from tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, or a copper complex, more preferably tungsten oxide containing an alkali metal, a pyrrolopyrrole compound, or a copper complex, and still more preferably tungsten oxide containing an alkali metal or pyrrolopyrrole compound, particularly preferably pyrrolopyrrole compound. According to this aspect, the structure having excellent light resistance or heat resistance can be obtained.

In the present invention, as the tungsten oxide containing an alkali metal (hereinafter also referred to as tungsten oxide), cesium tungsten oxide is preferable. Further, the tungsten oxide is also preferably a compound represented by Formula (Composition Formula) (I).

$$M_xW_yO_z \quad (I)$$

M represents an alkali metal, W represents tungsten, and O represents oxygen.

$$0.001 \leq x/y \leq 1.1$$

$$2.2 \leq z/y \leq 3.0$$

As the alkali metal represented by M, Rb or Cs is preferable, and Cs is more preferable.

In a case where the value of x/y is 0.001 or more, it is possible to sufficiently cut the near-infrared rays, and in a case where the value of x/y is 1.1 or less, it is possible to avoid the generation of impurity phases in the tungsten oxide. The value of x/y is preferably from 0.22 to 0.5.

In a case where the value of z/y is 2.2 or more, it is possible to further improve the chemical stability as a material, and in a case where the value of z/y is 3.0 or less, it is possible to sufficiently cut the near-infrared rays. The value of z/y is preferably from 2.45 to 3.00.

Specific examples of the compound represented by Formula (I) include $Cs_{0.33}WO_3$, $Rb_{0.33}WO_3$, and $K_{0.33}WO_3$,  $Cs_{0.33}WO_3$ or $Rb_{0.33}WO_3$ is preferable, and $Cs_{0.33}WO_3$ is more preferable.

Examples of a commercially available product of the tungsten oxide include YMS-01A-2 (a dispersion liquid of cesium tungsten oxide particles) manufactured by Sumitomo Metal Mining Co., Ltd.

The average secondary particle diameter (D90) of the tungsten oxide is preferably 100 nm or less, more preferably 50 nm or less, and still more preferably 25 nm or less. With the average secondary particle diameter of the tungsten oxide within such a range, the visible transparency can be improved. From the viewpoint of avoiding light scattering, a smaller average particle diameter of the tungsten oxide is preferable, but for reasons of ease in handling during production, the average secondary particle diameter (D90) of the tungsten oxide is preferably 1 nm or more. The average secondary particle diameter of the tungsten oxide particles is a particle diameter (a value (D90) at 90% of an integrated value of the particle size distribution) on a volume basis, obtained by measuring using Microtrac UPA-EX150 manufactured by Nikkiso Co., Ltd.

With regard to the tungsten oxide, reference can be made to the description of paragraph Nos. 0050 to 0072 of JP2009-062411A, the contents of which are incorporated herein by reference.

Examples of the pyrrolopyrrole compound in the present invention include the compounds described in paragraph Nos. 0016 to 0058 of JP2009-263614A, the compounds described in paragraph Nos. 0037 to 0052 of JP2011-068731A, and the compounds described in paragraph Nos. 0010 to 0033 WO2015/166873A, the contents of which are incorporated herein by reference. Examples of the squarylium compound include the compounds described in paragraph Nos. 0044 to 0049 of JP2011-208101A, the contents of which are incorporated herein by reference. Examples of the cyanine compound include the compounds described in paragraph Nos. 0044 and 0045 JP2009-108267A, and the compounds described in paragraph Nos. 0026 to 0030 of JP2002-194040A, the contents of which are incorporated herein by reference. Examples of the diimmonium compound include the compounds described in JP2008-528706A, the contents of which are incorporated herein by reference. Examples of the phthalocyanine compound and the tetraazaporphyrin compound include the compounds described in paragraph No. 0093 of JP2012-077153A, the oxytitanium phthalocyanine described in JP2006-343631A, and the compounds described in paragraph Nos. 0013 to 0029 of JP2013-195480A, the contents of which are incorporated herein by reference. Examples of the naphthalocyanine compound include the compounds described in paragraph No. 0093 of JP2012-077153A, the contents of which are incorporated herein by reference. Further, as the cyanine compound, the phthalocyanine compound, the naphthalocyanine compound, the tetraazaporphyrin compound, the diimmonium compound, and the squarylium compound, the compounds described in paragraph Nos. 0010 to 0081 of JP2010-111750A may be used, the content of which are incorporated herein by reference. Further, with regard to the cyanine compound, reference can be made to, for example, "Functional Colorants, written by Makoto Okawara/Masaru Matsuoka/Teijiro Kitao/Tsuneoka Hirashima, published by Kodansha Scientific Ltd.", the content of which is incorporated herein by reference. Examples of the copper complex include the copper complexes described in paragraph Nos. 0009 to 0049 of WO2016/068037A, the phosphoric ester copper complexes described in paragraph Nos. 0022 to 0042 of JP2014-041318A, and the copper sulfonate complexes described in paragraph Nos. 0021 to 0039 of JP2015-043063A, the contents of which are incorporated herein by reference.

In the present invention, the pyrrolopyrrole compound is preferably a compound represented by Formula (PP). According to this aspect, it is easy to obtain the structure having excellent heat resistance or light resistance.

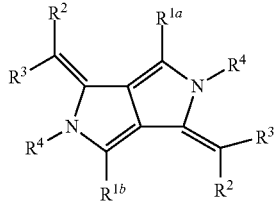

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$ each independently represent a hydrogen atom, an alkyl group, an aryl group, a heteroaryl group, —$BR^{4A}R^{4B}$, or a metal atom, $R^4$ may be covalently or coordinately bonded to at least one selected from $R^{1a}$, $R^{1b}$ or $R^3$, and $R^{4A}$ and $R^{4B}$ each independently represent a substituent. With regard to the details of Formula (PP), reference can be made to the descriptions in paragraph Nos. 0017 to 0047 of JP2009-263614A, paragraph Nos. 0011 to 0036 of JP2011-068731A, paragraph Nos. 0010 to 0024 of WO2015/166873A, the contents of which are incorporated herein by reference.

Specific examples of the compound represented by Formula (PP) include the following compounds. In the following structural formulae, Ph represents a phenyl group.

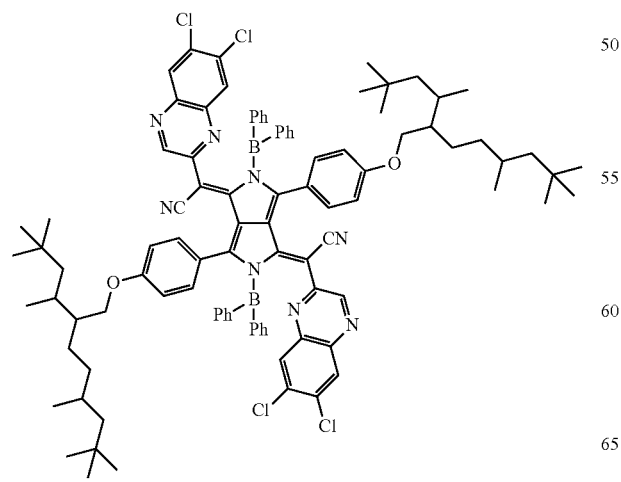

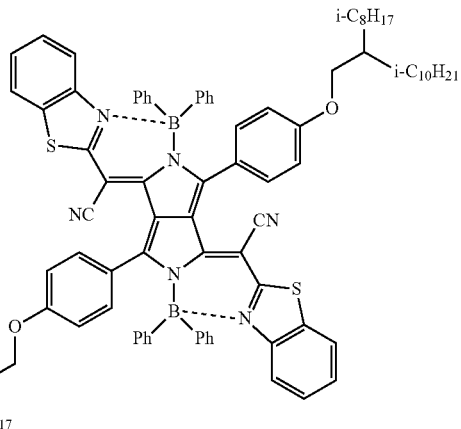

In the present invention, as the diimmonium compound, a compound represented by Formula (Im) is preferable.

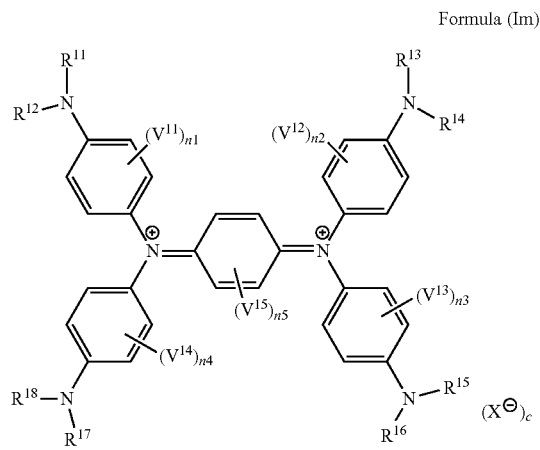

Formula (Im)

In the formula, $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, X represents an anion, c represents a number that is necessary to balance the charge, and n1 to n5 each independently represent an integer of 0 to 4. With regard to the details of Formula (Im), reference can be made to the description of paragraph Nos. 0034 to 0058 of JP2008-528706A, the contents of which are incorporated herein by reference.

Specific examples of the compound represented by Formula (Im) include the following compounds. In the following structural formula, Bu represents a butyl group.

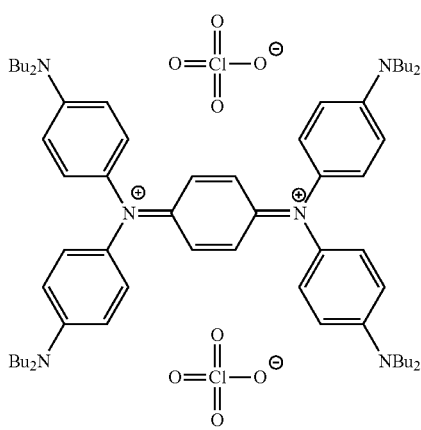

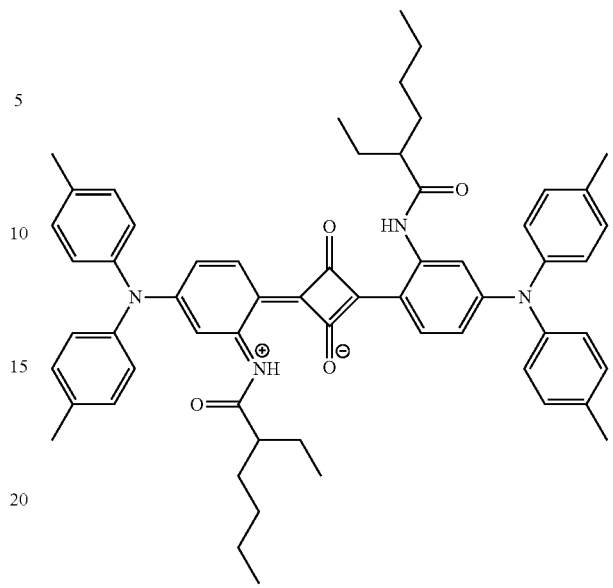

In the present invention, as the squarylium compound, a compound represented by Formula (SQ) is preferable.

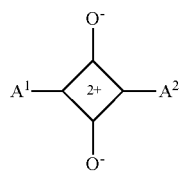

(SQ)

In Formula (SQ), $A^1$ and $A^2$ each independently represent an aryl group, a heteroaryl group, or a group represented by Formula (A-1);

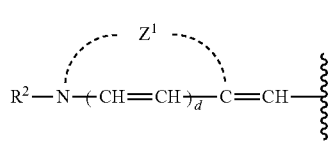

(A-1)

In Formula (A-1), $Z^1$ represents a non-metal atomic group that forms a nitrogen-containing heterocycle, $R^2$ represents an alkyl group, an alkenyl group, or an aralkyl group, d represents 0 or 1, and the wavy line represents a bond.

With regard to the details of Formula (SQ), reference can be made to the descriptions in paragraph Nos. 0020 to 0049 of JP2011-208101A, the contents of which are incorporated herein by reference.

Furthermore, the cation in Formula (SQ) exists as being delocalized as follows.

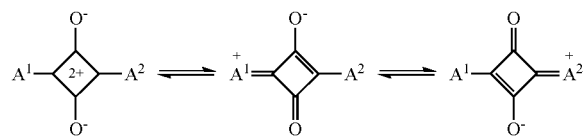

Specific examples of the compound represented by Formula (SQ) include the following compound.

In the present invention, a copper complex is preferably a complex of copper and a compound (ligand) having one or more a coordination site with respect to copper. Examples of the coordination site to copper include a coordination site for coordination with an anion with respect to copper, and a coordinating atom for coordination with an unshared electron pair with respect to copper. The copper complex may have two or more ligands. In a case where the copper complex has two or more ligands, the respective ligands may be the same as or different from each other. Examples of the copper complex include a four-coordinate copper complex, a five-coordinate copper complex, and a six-coordinate copper complex, the four-coordinate copper complex and the five-coordinate copper complex are more preferable, and the five-coordinate copper complex is still more preferable. In addition, in the copper complex, a five-membered ring and/or a six-membered ring is preferably formed by copper and a ligand. Such a copper complex has a stable shape and is excellent in complex stability.

The copper complex can be obtained, for example, by mixing and reacting the compound (ligand) having a coordination site to copper with a copper component (copper or a compound including copper). The compound (ligand) having a coordination site to copper may be a low molecular compound or a polymer, both of which may also be used in combination.

The copper component is preferably a compound including divalent copper. Only one kind or two or more kinds of the copper components may be used. As the copper component, for example, a copper oxide or a copper salt can be used. As the copper salt, for example, copper carboxylate (such as copper acetate, copper ethyl acetoacetate, copper formate, copper benzoate, copper stearate, copper naphthenate, copper citrate, and copper 2-ethylhexanoate), copper sulfonate (such as copper methanesulfonate), copper phosphate, phosphoric acid ester copper, copper phosphonate, phosphonic acid ester copper, copper phosphinate, copper amide, copper sulfonamide, copper imide, copper acyl sulfonimide, copper bissulfonimide, copper methide, alkoxycopper, phenoxycopper, copper hydroxide, copper carbonate, copper sulfate, copper nitrate, copper perchlorate, copper fluoride, copper chloride, and copper bromide are preferable, copper carboxylate, copper sulfonate, copper sulfonamide, copper imide, copper acyl sulfonimide, copper bissulfonimide, alkoxycopper, phenoxycopper, copper hydroxide, copper carbonate, copper fluoride, copper chloride, copper sulfate, and copper nitrate are more preferable, copper carboxylate, copper acyl sulfonimide, phenoxycopper, copper chloride, copper sulfate, and copper nitrate are still more preferable, and copper carboxylate, copper acyl sulfonimide, copper chloride, and copper sulfate are particularly preferable.

As the copper complex, for example, a copper complex represented by Formula (Cu-1) can be used. This copper complex is a copper complex in which a ligand L coordinates to copper as a central metal, and the copper is usually divalent copper. This copper complex can be obtained, for example, by reacting the compound or a salt thereof serving as a ligand L with a copper component.

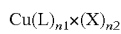   Formula (Cu-1)

In the formula, L represents a ligand that coordinates to copper and X represents a counter ion. n1 represents an integer of 1 to 4. n2 represents an integer of 0 to 4.

X represents a counter ion. In some cases, the copper complex serves as a cation complex or an anion complex, in addition to a neutral complex having no charge. In this case, a counter ion exits, as described, so as to neutralize a charge of a copper complex.

In a case where the counter ion is a counter ion (counter anion) having negative charge, the counter anion may be, for example, an inorganic anion or an organic anion. Moreover, the counter anion is preferably a weakly nucleophilic anion. The weakly nucleophilic anionic structure is generally an anionic structure formed by an acid having a low pKa, called a super acid, dissociating a proton. The definition of the super acid varies depending on the documents, but super acids collectively refer to acids having a lower pKa than that of methanesulfonic acid, and the structures described in J. Org. Chem. 2011, 76, 391-395 Equilibrium Acidities of Superacids are known. The pKa of the weakly nucleophilic anion is, for example, preferably −11 or less, and preferably −11 to −18. The pKa can be measured by the method described in, for example, J. Org. Chem. 2011, 76, 391-395. The pKa in the present specification is a pKa in 1,2-dichloroethane unless otherwise specified. In a case where the counter anion is a weakly nucleophilic anion, it is difficult for a decomposition reaction of a copper complex or a resin to occur, and the heat resistance is good. The weakly nucleophilic anion is more preferably a tetrafluoroboric acid ion, a tetraaryl boric acid ion (including aryl substituted with a halogen atom or a fluoroalkyl group), a hexafluorophosphate ion, an imide ion (including amide substituted with an acyl group or a sulfonyl group), or a methide ion (including methide substituted with an acyl group or a sulfonyl group), and particularly preferably a tetraaryl boric acid ion (including aryl substituted with a halogen atom or a fluoroalkyl group), an imide ion (including amide substituted with a sulfonyl group), or a methide ion (including methide substituted with a sulfonyl group).

Incidentally, in the present invention, the counter anion is also preferably a halogen anion, a carboxylate ion, a sulfonate ion, a boron ion, a sulfonate ion, or an imide ion.

In a case where the counter ion is a counter ion (counter cation) having positive charge, for example, the counter cation includes inorganic or organic ammonium ions (for example, tetraalkyl ammonium ions such as a tetrabutylammonium ion, a triethylbenzylammonium ion, and a pyridinium ion), phosphonium ions (for example tetraalkylphosphonium ions such as a tetrabutylphosphonium ion, alkyl triphenyl phosphonium ions, and a triethyl tetraphenylphosphonium ion), alkali metal ions, and protons.

In addition, the counter ion may be a metal complex ion (for example, a copper complex ion).

The ligand L is a compound having a coordination site to the copper, and examples thereof include a compound having at least one of a coordination site for coordination to copper with an anion or a coordination atom for coordination to copper with an unshared electron pair. The coordination site for coordination with an anion in the copper may be dissociated or non-dissociated. The ligand L is preferably a compound having two or more coordination sites of copper (polydentate ligand). Further, it is preferable that the ligand L does not have a plurality of consecutive bonds with p-conjugated systems such as an aromatic substance in order to improve the visible transparency. As the ligand L, a combination of a compound having one coordination site to copper (monodentate ligand) and a compound having two or more coordination sites to copper (polydentate ligand) can be used. Examples of the monodentate ligand include a monodentate ligand that coordinates to an anion or an unshared electron pair.

The anion contained in the ligand L may be one capable of coordinating to a copper atom, and is preferably an oxygen anion, a nitrogen anion, or a sulfur anion.

Other examples of the coordination site for coordination with an anion include a monoanionic coordination site. The monoanionic coordination site represents a site for coordination to a copper atom through a functional group having one negative charge. Examples thereof include an acid group having an acid dissociation constant (pKa) of 12 or less. Specifically, an acid group containing a phosphorus atom (a phosphoric diester group, a phosphonic acid monoester group, a phosphinic acid group, and the like), a sulfo group, a carboxyl group, and an imidic acid group, and the sulfo group or the carboxyl group is preferable.

The coordinating atom that coordinates with an unshared electron pair is preferably an oxygen atom, a nitrogen atom, a sulfur atom, or a phosphorus atom, more preferably an oxygen atom, a nitrogen atom, or a sulfur atom, still more preferably an oxygen atom or a nitrogen atom, and particularly preferably a nitrogen atom. In a case where the coordinating atom that coordinates with an unshared electron pair is a nitrogen atom, the atom adjacent to the nitrogen atom is preferably a carbon atom or a nitrogen atom, and more preferably a carbon atom.

Preferred examples of the copper complex include the following aspects of (1) to (5), and the copper complex is more preferably (2) to (5), still more preferably (3) to (5), and even still more preferably (4) or (5).

(1) A copper complex having one or two of the compounds having two coordination sites as a ligand.

(2) A copper complex having a compound having three coordination sites as a ligand.

(3) A copper complex having a compound having three coordination sites and a compound having two coordination sites as a ligand.

(4) A copper complex having a compound having four coordination sites as a ligand.

(5) A copper complex having a compound having five coordination sites as a ligand.

Specific examples of the copper complex include the following compounds.

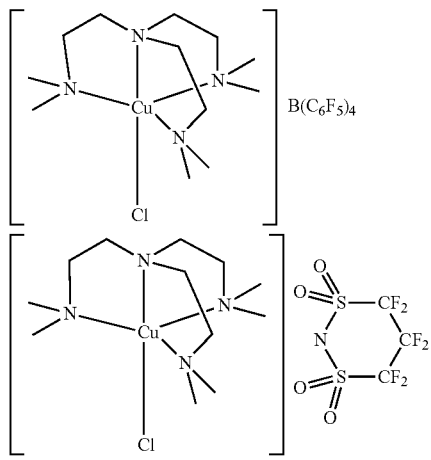

In the present invention, as the copper complex, a copper containing polymer having a copper complex site in the polymer side chain can be used. Examples of the copper complex site include copper and a site for coordination to the copper (coordination site). Examples of the site for coordination to the copper include a site for coordination with an anion or an unshared electron pair. Further, the copper complex site preferably has a site for tetradentate coordination or pentadentate coordination to copper. With regard to the details of the coordination site, what was exemplified above is included, and a preferred range thereof is also the same.

Examples of the copper containing polymer include a polymer including a coordination site (also referred to as a polymer (B1)), a polymer obtained by the reaction with a copper component or a polymer having a reactive site for a polymer side chain (hereinafter also referred to as a polymer (B2)), and a polymer obtained by the reaction with a copper complex having a functional group capable of reacting with a reactive site contained in the polymer (B2). The weight-average molecular weight of the copper containing polymer is preferably 2,000 or more, more preferably 2,000 to 2,000,000, and still more preferably 6,000 to 200,000.

The content of the near-infrared absorber in the layer including the near-infrared absorber can be appropriately adjusted depending on the type of the near-infrared absorber. For example, in a case of the tungsten oxide containing an alkali metal, the content thereof is preferably 10% to 50% by mass, and more preferably 20% to 40% by mass, with respect to the total solid content of the layer including the near-infrared absorber. Incidentally, in a case of an organic colorant such as a pyrrolopyrrole compound, a cyanine compound, a phthalocyanine compound, a tetraazaporphyrin compound, a diimmonium compound, and a squarylium compound, the content thereof is preferably 10% to 50% by mass, and more preferably 20% to 40% by mass, with respect to the total solid content of the layer including the near-infrared absorber. Further, in a case of a copper complex, the content thereof is preferably 10% to 50% by mass, and more preferably 20% to 40% by mass, with respect to the total solid content of the layer including the near-infrared absorber.

The film thickness of the layer including the near-infrared absorber can be appropriately adjusted depending on the type of the near-infrared absorber. For example, in a case of tungsten oxide containing an alkali metal, the film thickness of the layer including the near-infrared absorber is preferably 0.5 to 10.0 and more preferably 2.0 to 5.0 Further, in a case of an organic colorant such as a pyrrolopyrrole compound, a cyanine compound, a phthalocyanine compound, a tetraazaporphyrin compound, a diimmonium compound, and a squarylium compound, the film thickness of the layer including the near-infrared absorber is preferably 0.1 to 5.0 and more preferably 0.5 to 2.0 Incidentally, in a case of a copper complex, the film thickness of the layer including the near-infrared absorber is preferably 10 to 300 and more preferably 50 to 200 In a case where the film thickness is within the above range, the near-infrared cutting property is good. In addition, an effect that the transmitted light can be detected by a photodiode without being diffused into the light scattering layer can be expected.

The layer including the near-infrared absorber can be formed using a composition including the near-infrared absorber (hereinafter also referred to as a composition for forming a near-infrared cutting layer) can be formed. The details of the composition for forming the near-infrared cutting layer will be described later.

[Dielectric Multilayer Film]

In the present invention, the dielectric multilayer film is a film that cuts the near-infrared rays or the like by utilizing an effect of interference of light. Specifically, the dielectric multilayer film is a film formed by alternately laminating two or more dielectric layers having different refractive indices (high-refractive-index layers and low-refractive-index layers). The dielectric multilayer film can be produced, for example, by laminating alternately high-refractive-index layers and low-refractive-index layers on a support by a method such as a chemical vapor deposition (CVD) method, a sputtering method, and a vacuum deposition method. Further, it can also be obtained by alternately applying compositions for forming a high-refractive-index layer and compositions for forming a low-refractive-index layer on a support, followed by drying.

As the material constituting the high-refractive-index layer, a material having a refractive index of 1.7 or more (preferably a material having a refractive index of 1.7 to 2.5) can be used. Examples thereof include a material containing a small amount of titanium oxide, tin oxide, and/or cerium oxide with titanium oxide, zirconium oxide, tantalum pentoxide, niobium pentoxide, lanthanum oxide, yttrium oxide, zinc oxide, zinc sulfide, or indium oxide as main components.

As the material constituting the low-refractive-index layer, a material having a refractive index of 1.6 or less (preferably a material having a refractive index of 1.2 o 1.6) can be used. Examples thereof include silica, alumina, lanthanum fluoride, magnesium fluoride, and sodium aluminum hexafluoride.

The thickness of each layer of the high-refractive-index layers and the low-refractive-index layers is preferably a thickness of 0.1 l to 0.5 l in the wavelength l (nm) of the near-infrared rays to be cut. By setting the thickness within the range, it is easy to control the cutting and/or transmission of light at a specific wavelength. The number of the lamination in the dielectric multilayer film is preferably 2 to 100, more preferably 2 to 60, and still more preferably 2 to 40.

The film thickness of the dielectric multilayer film (a total thickness of the high-refractive-index layers and the low-refractive-index layers) is appropriately designed by the refractive indices and the spectroscopic design of the high-refractive-index layers and the low-refractive-index layers.

In the structure of the embodiment of the present invention, an antireflective film, an overcoat layer, a lens or the like may be provided on the first optical filter layer, the second optical filter layer or the light scattering layer. In addition, an interlayer may be provided between the first optical filter layer and the light scattering layer. The antireflective film may be provided on the surface of the lens.

The structure of the embodiment of the present invention will be described in detail below with reference to the drawings. In the structure 101 shown in FIG. 1, filter layers 21 to 26 are provided on the support 10. In addition, a light scattering layer 50 is provided on a filter layer 24. A lens 80 is provided on the filter layers 21 to 23, 25 and 26. In this embodiment, the filter layer 24 is the first optical filter layer, and the filter layers 21 to 23, 25, and 26 are the second optical filter layers. The filter layers 21 to 26 may be filter layers that transmit light. A colored layer, a transparent layer, an ultraviolet cutting layer, the near-infrared cutting layer, a near-infrared transmission layer, and the like can be exemplified. For example, there are an aspect that the first optical filter layer (the filter layer 24 in FIG. 1) is the colored layer, and each of the second optical filter layer (the filter layers 21, 22, 23, 25, and 26 in FIG. 1) is independently the colored layer or the near-infrared transmission layer, an aspect that the first optical filter layer (the filter layer 24 in FIG. 1) is the transparent layer, and each of the second optical filter layer (the filter layers 21, 22, 23, 25, and 26 in FIG. 1) is independently the colored layer or the near-infrared transmission layer, an aspect that the first optical filter layer (the filter layer 24 in FIG. 1) is the near-infrared cutting layer, and each of the second optical filter layer (the filter layers 21, 22, 23, 25, and 26 in FIG. 1) is independently the colored layer or the near-infrared transmission layer, and an aspect, in each of the above-mentioned aspects, in which the second optical filter layer further includes at least one selected from the transparent layer, the ultraviolet cutting layer, or the near-infrared cutting layer is exemplified as a preferable aspects.

In the structure 101, at least one of the filter layers 21 to 23, 25, or 26 may be the same type of filter layer as the filter layer 24. Also, each of the filter layers 21 to 23, 25, and 26 may be a different type of filter layer from the filter layer 24. Additionally, the filter layers 21 to 23, 25, and 26 may be the same filter layer or different filter layers. Among them, at least one of the filter layers 21 to 23, 25, or 26 is preferably a filter layer of different type from the filter layer 24.

In FIG. 1, the thicknesses of the filter layers 21 to 26 are the same, but the thickness of each filter layer may be different. Further, in FIG. 1, although the widths of the filter layers 21 to 26 are the same, the widths of the filter layers may be different. Moreover, although the adjacent filter layers are in contact with each other in FIG. 1, the adjacent filter layers may not be in contact with each other. In addition, partition walls may be provided between adjacent filter layers. Additionally, the height difference of the upper surfaces of the filter layers 21 to 26 substantially coincide in FIG. 1, but the upper surfaces of the respective filter layers may have height difference. From the viewpoint of securing the flatness and simplifying the process, it is preferable that the height differences of the upper surfaces of the filter layers 21 to 26 is substantially the same. In addition, in FIG. 1, filter layer 21 to 23, 25, and 26 and the light scattering layer 50 may be two-dimensionally arranged on the support 10 by changing a lamination order of the filter layers 24 and the light scattering layer 50. In addition, a base film may be provided between the support 10 and the filter layers 21 to 26. Additionally, the interlayer may be provided between the filter layers 21 to 23, 25 and 26 and the lens 80, and between the filter layer 24 and the light scattering layer 50. In addition, the antireflective film may be provided on the surface of the light scattering layer 50 and/or the surface of the lens 80. In addition, the lens 80 may be provided on the light scattering layer 50. Moreover, an overcoat layer may be provided on the light scattering layer 50 and the lens 80.

Figure 2:
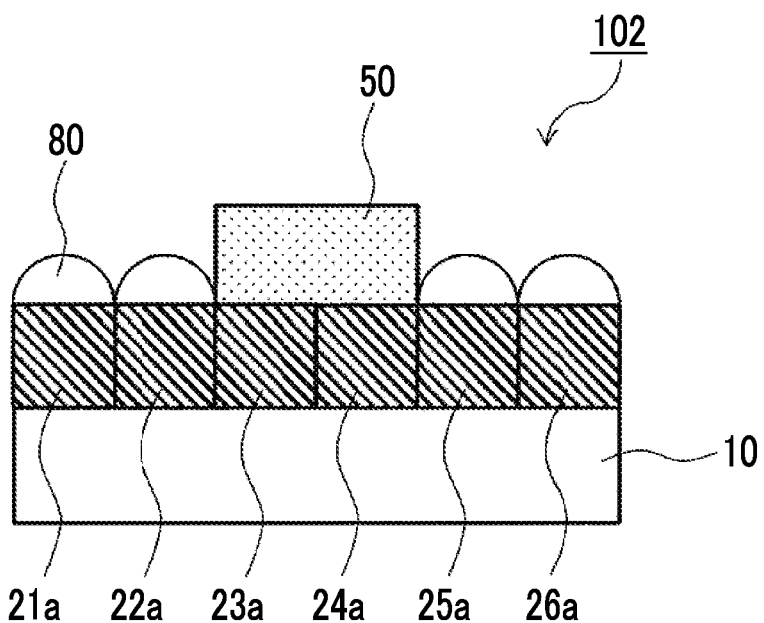
FIG. 2 is a schematic view showing an embodiment of a structure of the present invention.

In the structure 102 shown in FIG. 2, filter layers 21a to 26a are provided on a support 10. In addition, the light scattering layer 50 is provided on the filter layers 23a and 24a. A lens 80 is provided on the filter layers 21a, 22a, 25a, and 26a. In this embodiment, the filter layers 23a and 24a are the first optical filter layers, and the filter layers 21a, 22a, 25a, and 26a are the second optical filter layers. The first optical filter layer and the second optical filter layer are the same as the contents described in FIG. 1. In the structure 102, the filter layers 23a and 24a may be the same filter layer or different filter layers. The filter layers 21a, 22a, 25a, and 26a may be the same filter layer or different filter layers, but at least one of the filter layers 21a, 22a, 25a, or 26a may be a filter layer of a type different from 23a and 24a. Further, in FIG. 2, the lamination order of the filter layers 23a and 24a, and the light scattering layer 50 may be switched. In addition, in FIG. 2, although the thicknesses of the filter layers 21a to 26a are the same, the thickness of each filter layer may be different. In addition, in FIG. 2, the widths of the filter layers 21a to 26a are the same, but the widths of the filter layers may be different. Moreover, although the adjacent filter layers are in contact with each other in FIG. 2, the adjacent filter layers may not be in contact with each other. In addition, partition walls may be provided between adjacent filter layers. Further, in FIG. 2, the height differences between the upper surfaces of the filter layers 21a to 26a are substantially the same, but the upper surfaces of the filter layers may have height differences. From the viewpoint of securing the flatness and simplifying the process, it is preferable that the height differences between the upper surfaces of the filter layers 21a to 26a are substantially the same.

Figure 3:
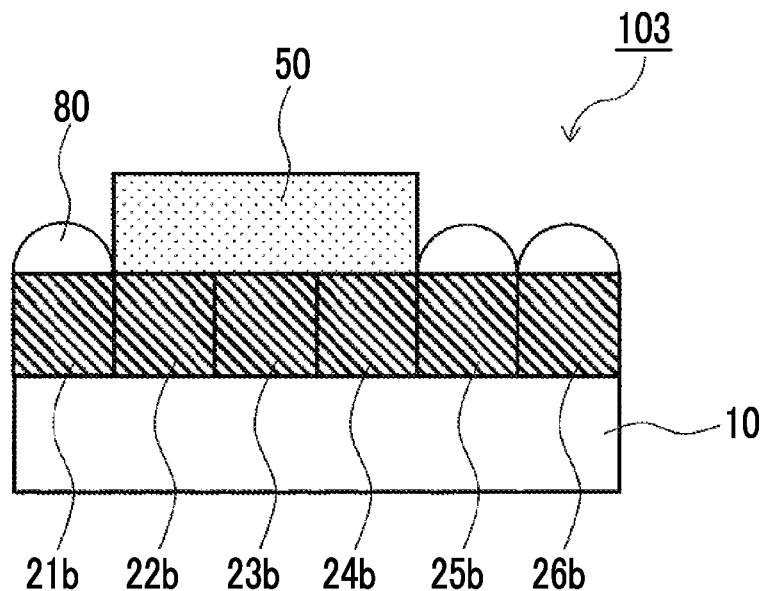
FIG. 3 is a schematic view showing an embodiment of a structure of the present invention.

In a structure 103 shown in FIG. 3, filter layers 21b to 26b are provided on a support 10. In addition, the light scattering layer 50 is provided on the filter layers 22b to 24b. The lens 80 is provided on the filter layers 21b, 25b, and 26b. In this embodiment, the filter layers 22b to 24b are the first optical filter layers, and the filter layers 21b, 25b, and 26b are the second optical filter layers. The first optical filter layer and the second optical filter layer are the same as the contents described in FIG. 1. In the structure 103, the filter layers 22b to 24b may be the same filter layer or different filter layers. The filter layers 21b, 25b and 26b may be the same filter layer or different filter layers, but at least one of the filter layers 21b, 25b or 26b may be filter layers of different types from the filter layers 22b to 24b. Further, in FIG. 3, the lamination order of the filter layers 22b to 24b and the light scattering layer 50 may be switched. Moreover, although the adjacent filter layers are in contact with each other in FIG. 3, the adjacent filter layers may not be in contact with each other. In addition, partition walls may be provided between adjacent filter layers. Further, in FIG. 3, although the height differences of the upper surfaces of the filter layers 21b to 26b substantially coincide with each other, the upper surfaces of the respective filter layers may have height differences. From the viewpoint of securing the flatness and simplifying the process, it is preferable that the height differences of the upper surfaces of the filter layers 21b to 26b substantially coincide.

Figure 4:
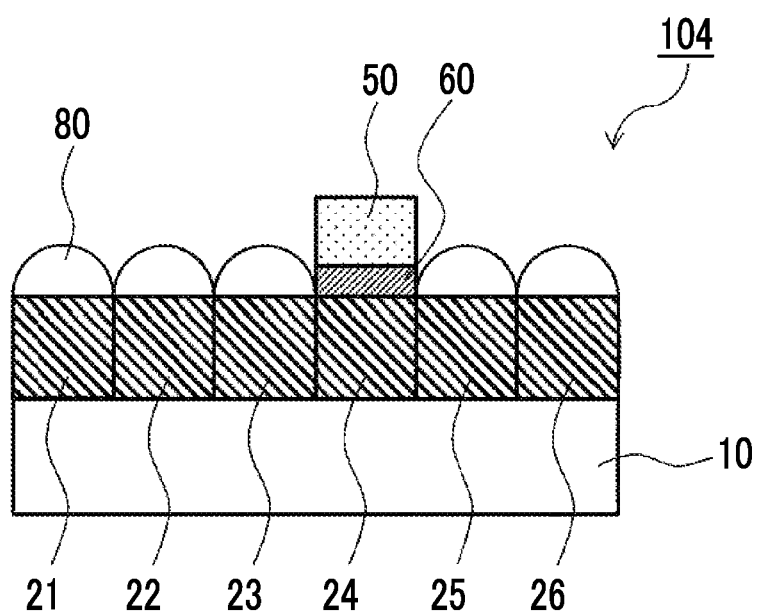
FIG. 4 is a schematic view showing an embodiment of a structure of the present invention.

The structure 104 shown in FIG. 4 has the same configuration as the structure 101 shown in FIG. 1 other than that the near-infrared cutting layer 60 is provided between the light scattering layer 50 and the filter layer 24. Although not shown, the interlayer may further be provided between the light scattering layer 50 and the near-infrared cutting layer 60 and/or between the filter layer 24 and the near-infrared cutting layer 60.

Figure 5:
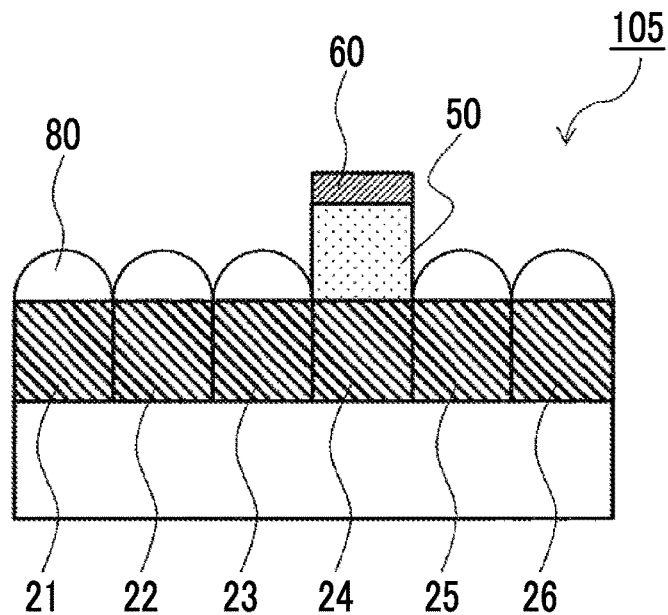
FIG. 5 is a schematic view showing an embodiment of a structure of the present invention.

The structure 105 shown in FIG. 5 has the same configuration as the structure 101 shown in FIG. 1 other than that the near-infrared cutting layer 60 is provided on the surface of the light scattering layer 50. Although not shown, the interlayer may be further provided between the light scattering layer 50 and the near-infrared cutting layer 60.

Figure 6:
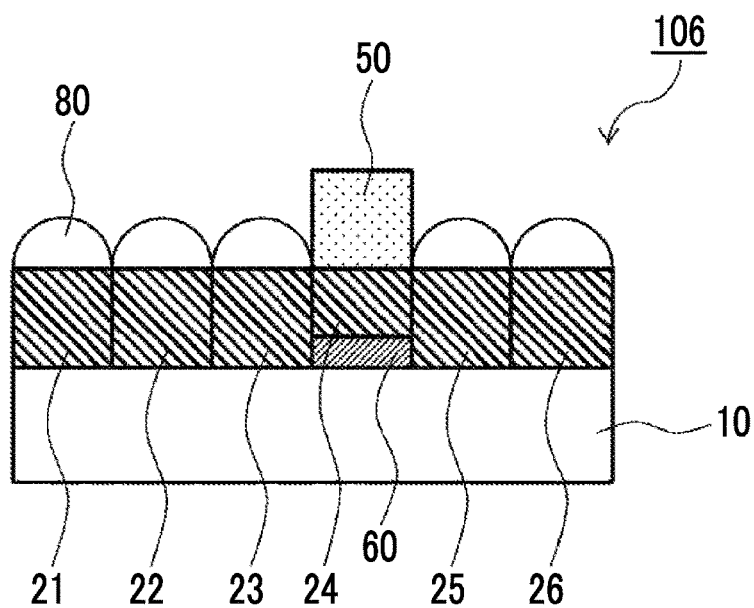
FIG. 6 is a schematic view showing an embodiment of a structure of the present invention.

A structure 106 shown in FIG. 6 has the same configuration as that of FIG. 1 other than that the near-infrared cutting layer 60 is provided between the support 10 and the filter layer 24. Although not shown, the interlayer may further be provided between the support 10 and the near-infrared cutting layer 60 and/or between the filter layer 24 and the near-infrared cutting layer 60.

Figure 7:
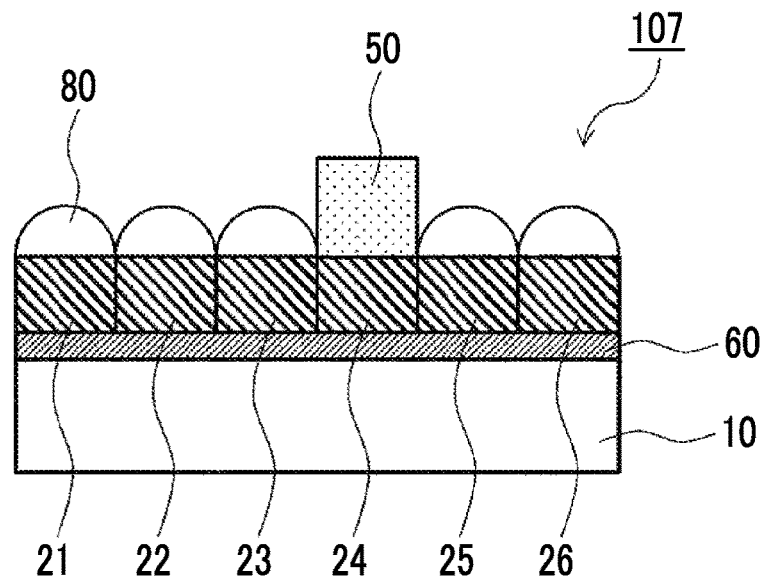
FIG. 7 is a schematic view showing an embodiment of a structure of the present invention.
Figure 8:
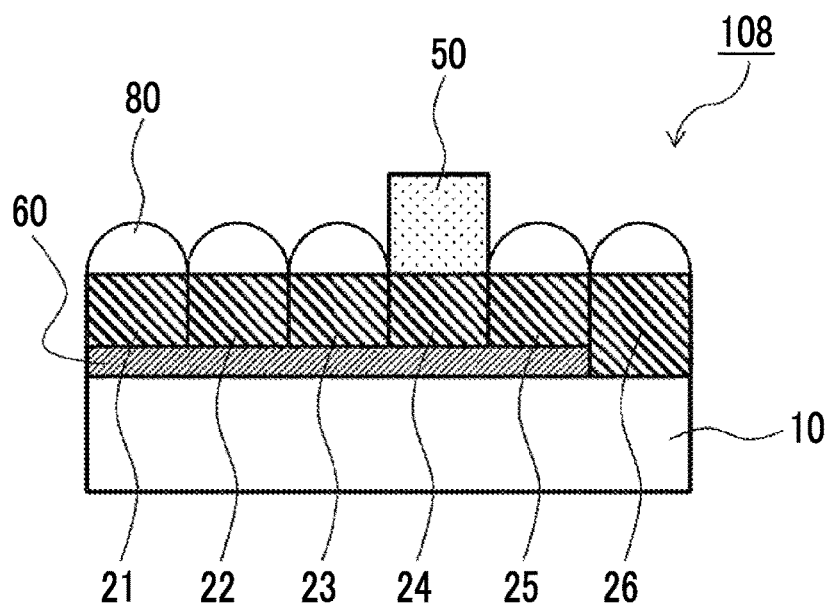
FIG. 8 is a schematic view showing an embodiment of a structure of the present invention.
Figure 9:
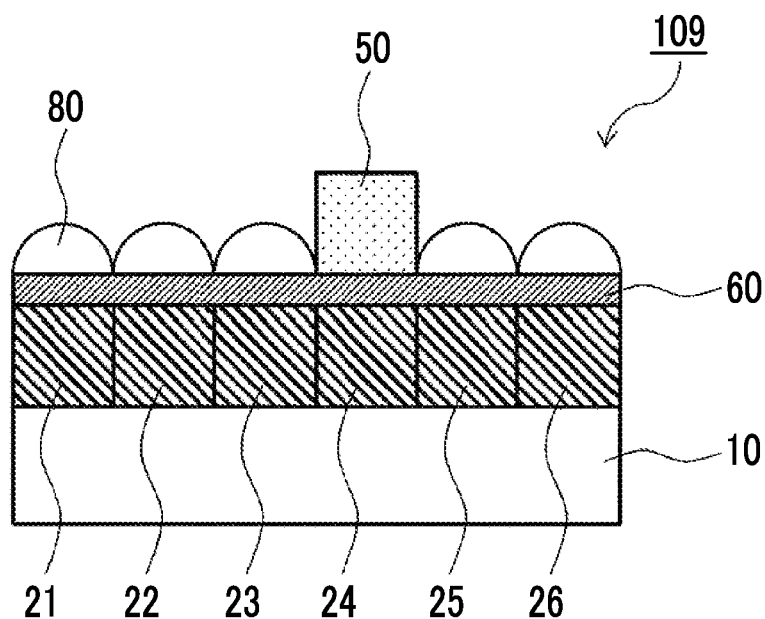
FIG. 9 is a schematic view showing an embodiment of a structure of the present invention.

The structure 107 shown in FIG. 7 has the same configuration as the structure 101 shown in FIG. 1 other than that the near-infrared cutting layer 60 is provided between the support 10 and the filter layers 21 to 26. The structure 108 shown in FIG. 8 has the same configuration as the structure 101 shown in FIG. 1 other than that the near-infrared cutting layer 60 is provided between the support 10 and the filter layers 21 to 25. In the structure shown in FIG. 8, the near-infrared cutting layer 60 is not provided only on the light path on the light emission side of the filter layer 26 among the second optical filter layers, but an aspect is also possible in which the near-infrared cutting layer 60 is provided between the support 10 and the filter layer 26, and the near-infrared cutting layer 60 is not provided between any of the filter layers 21 to 23, and 25 and the support 10. In addition, an aspect is also possible in which the near-infrared cutting layer 60 is not provided between two or more filter layers among the filter layers 21 to 23, 25, and 26 and the support 10. The structure 109 shown in FIG. 9 has the same configuration as the structure 101 shown in FIG. 1 other than that the near-infrared cutting layer 60 is provided on the surface of the filter layers 21 to 26. The structure 109 shown in FIG. 9 is provided with the near-infrared cutting layer 60 on the surface of the filter layers 21 to 26. However, an aspect is also possible in which the near-infrared cutting layer 60 is not provided on the surface of one or more filter layers of the filter layers 21 to 23, 25 and 26 which are the second optical filter layers.

Figure 10:
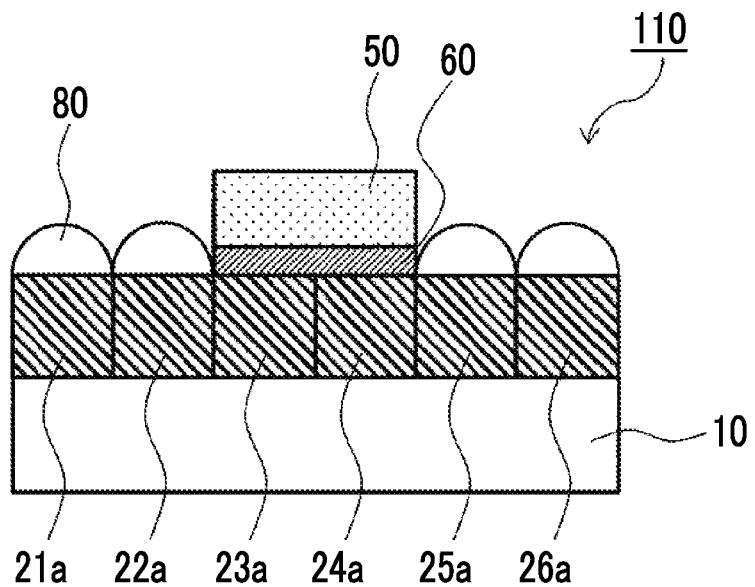
FIG. 10 is a schematic view showing an embodiment of a structure of the present invention.

The structure 110 shown in FIG. 10 has the same configuration as the structure 102 shown in FIG. 2 other than that the near-infrared cutting layer 60 is provided between the light scattering layer 50 and the filter layers 23a and 24a. In FIG. 10, the near-infrared cutting layer 60 may be provided on the surface of the light scattering layer 50 by changing the lamination order of the near-infrared cutting layer 60 and the light scattering layer 50. Further, although not shown, the interlayer may further be provided between the light scattering layer 50 and the near-infrared cutting layer 60 and/or between the filter layers 23a and 24a and the near-infrared cutting layer 60.

Figure 11:
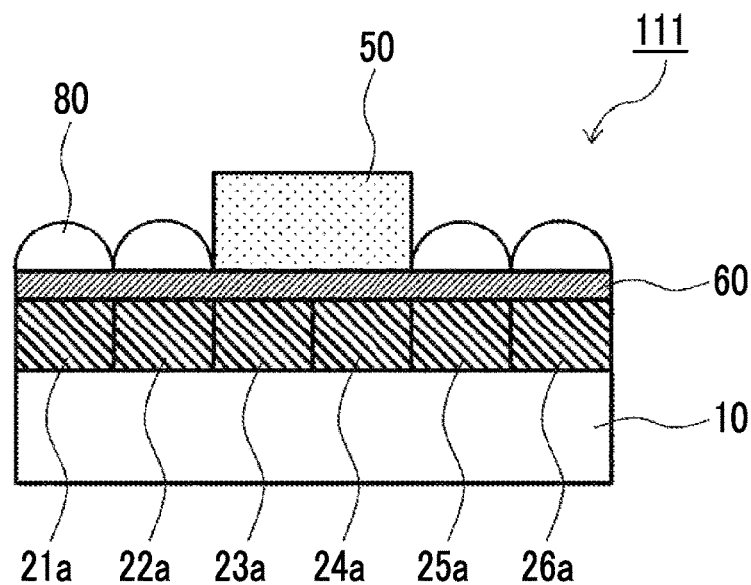
FIG. 11 is a schematic view showing an embodiment of a structure of the present invention.

The structure 111 shown in FIG. 11 has the same configuration as the structure 102 shown in FIG. 2 other than that the near-infrared cutting layer 60 is provided on the surface of the filter layers 21a to 26a. An aspect is also possible in which the structure 111 shown in FIG. 11 does not have the near-infrared cutting layer 60 on the surface of at least one of the filter layers 21a, 22a, 25a, or 26a which is the second optical filter layer. For example, an aspect is also possible in which the near-infrared cutting layer 60 is provided on the surface of the filter layers 21a to 25a, and the near-infrared cutting layer 60 is not provided on the surface of the filter layer 26a.

Figure 12:
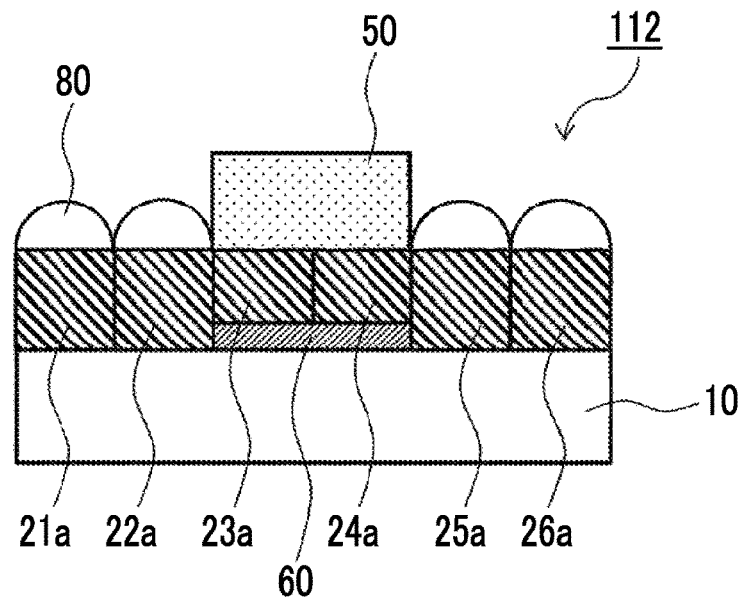
FIG. 12 is a schematic view showing an embodiment of a structure of the present invention.

The structure 112 shown in FIG. 12 has the same configuration as the structure 102 shown in FIG. 2 other than that the near-infrared cutting layer 60 is provided between the support 10 and the filter layers 23a and 24a. Although not shown, the interlayer may further be provided between the support 10 and the near-infrared cutting layer 60 and/or between the filter layers 23a and 24a and the near-infrared cutting layer 60.

Figure 13:
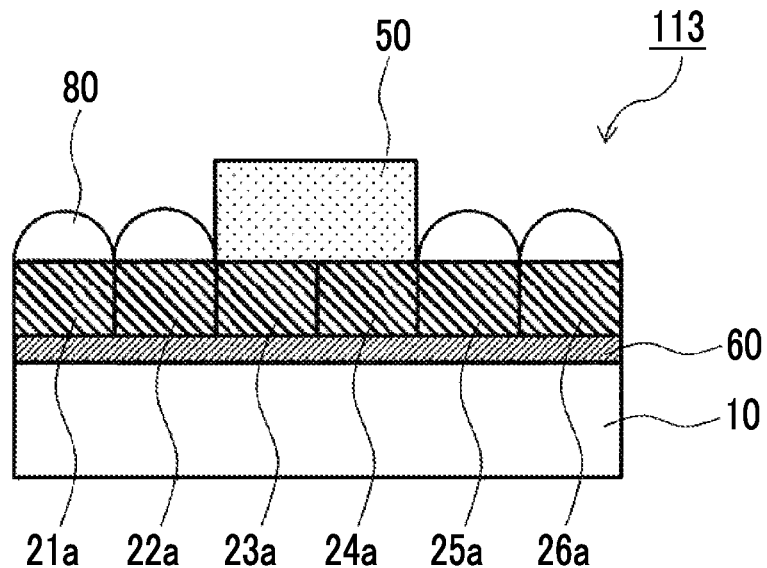
FIG. 13 is a schematic view showing an embodiment of a structure of the present invention.

The structure 113 shown in FIG. 13 has the same configuration as the structure 102 shown in FIG. 2 other than that the near-infrared cutting layer 60 is provided between the support 10 and the filter layers 21a to 26a. The structure 114 shown in FIG. 14 has the same configuration as the structure 102 shown in FIG. 2 other than that the near-infrared cutting layer 60 is provided between the support 10 and the filter layers 21a to 25a. In the structure 114 shown in FIG. 14, the near-infrared cutting layer 60 is not provided only on the light path on the light emission side of the filter layer 26a among the second optical filter layers. But an aspect is possible in which the near-infrared cutting layer 60 is provided between the support 10 and the filter layer 26a, and the near-infrared cutting layer 60 is not provided between the filter layers 21a, 22a, 25a and the support 10. In addition, an aspect is also possible in which the near-infrared cutting layer 60 is not provided between two or more of the filter layers 21a, 22a, 25a, and 26a, and the support 10.

Figure 15:
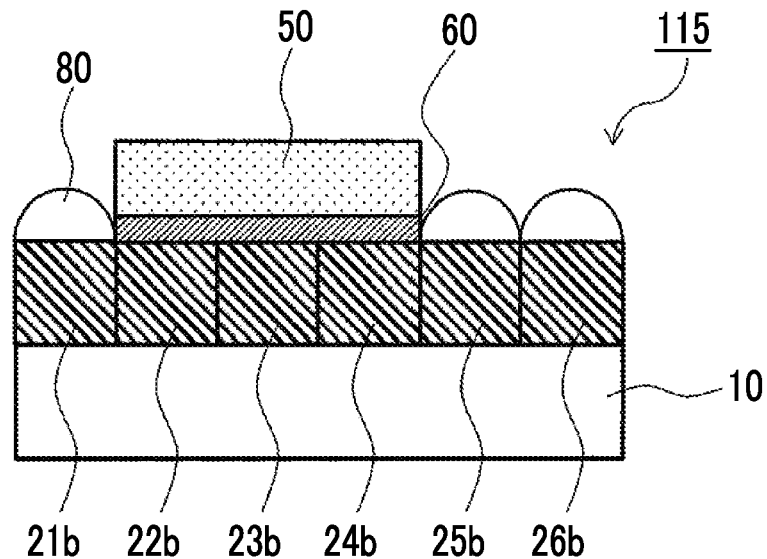
FIG. 15 is a schematic view showing an embodiment of a structure of the present invention.

The structure 115 shown in FIG. 15 has the same configuration as the structure 103 shown in FIG. 3 other than that the near-infrared cutting layer 60 is provided between the light scattering layer 50 and the filter layers 22b to 24b. In FIG. 15, the near-infrared cutting layer 60 may be provided on the surface of the light scattering layer 50 by changing the lamination order of the near-infrared cutting layer 60 and the light scattering layer 50. Further, although not shown, the interlayer may further be provided between the light scattering layer 50 and the near-infrared cutting layer 60 and/or between the filter layers 22b to 24b and the near-infrared cutting layer 60.

Figure 16:
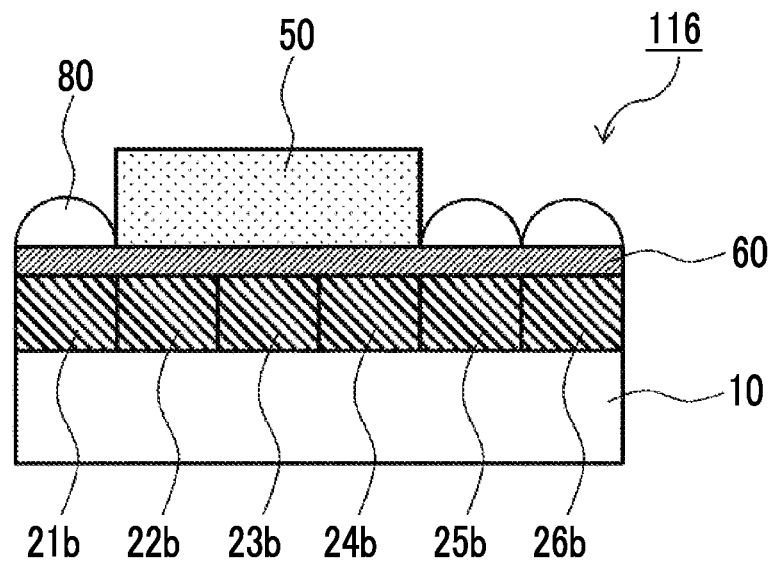
FIG. 16 is a schematic view showing an embodiment of a structure of the present invention.

The structural body 116 shown in FIG. 16 has the same configuration as the structural body 103 shown in FIG. 3 other than that the near-infrared cutting layer 60 is provided on the filter layers 21b to 26b. In addition, an aspect is also possible in which the structure 116 shown in FIG. 16 does not have the near-infrared cutting layer 60 on at least one filter layer of filter layers 21b, 25b, or 26b which is the second optical filter layer. For example, the near-infrared cutting layer 60 may be provided on the filter layers 21b to 25b, and the near-infrared cutting layer 60 may not be provided on the filter layer 26b.

Figure 17:
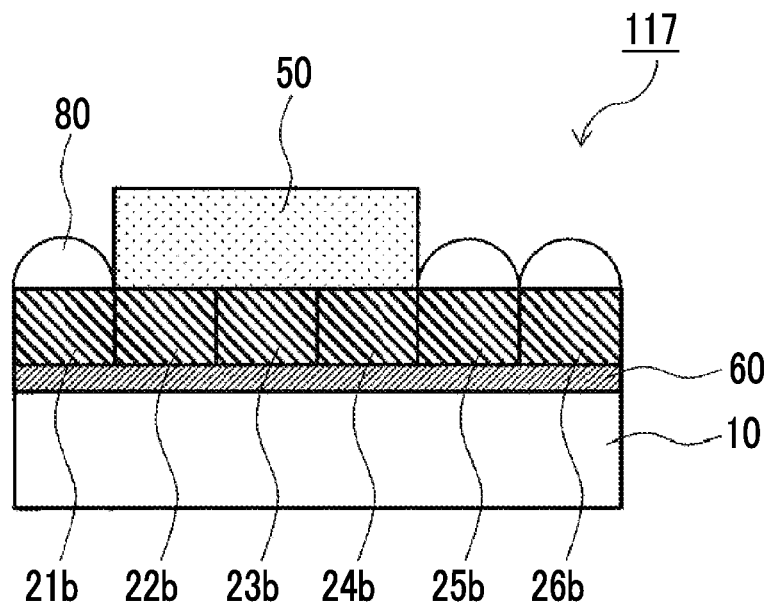
FIG. 17 is a schematic view showing an embodiment of a structure of the present invention.

The structure 117 shown in FIG. 17 has the same configuration as the structure 103 shown in FIG. 3 other than that the near-infrared cutting layer 60 is provided between the support 10 and the filter layers 21b to 26b. In the structure 117 shown in FIG. 17, the near-infrared cutting layer 60 may be provided only between the filter layers 22b to 24b as the first optical filter layer, and the support 10. In addition, the near-infrared cutting layer 60 may not be provided between the support 10 and at least one of the filter layers 21b, 25b, or 26b, which is the second optical filter layer.

The structure according to the embodiment of the present invention can be used after being incorporated into various optical sensors such as a solid-state imaging device, or image display devices (for example, a liquid crystal display device and an organic electroluminescence (organic EL) display device). For example, an optical sensor incorporating the structure of the embodiment of the present invention is not particularly limited. However, it can be preferably used for biometric authentication, monitoring, mobile, automotive, agricultural, medical, distance measurement, gesture recognition, and the like.

<Optical Sensor>

An optical sensor according to an embodiment of the present invention has the laminate according to the embodiment of the present invention. Examples of the optical sensor include a solid-state imaging element.

<Composition for Forming Light Scattering Layer>

Next, a composition (a composition for forming a light scattering layer) that can be preferably used for forming the light scattering layer in the structure of the embodiment of the present invention will be described.

<<White Pigment>>

The composition for forming a light scattering layer preferably contains a white pigment. With regard to the details of the white pigment, reference can be made to the white pigments described in the above-mentioned section of the light scattering layer, and a preferred range thereof is also the same. The content of the white pigment is preferably 1% to 75% by mass with respect to the total solid content of the composition for forming the light scattering layer. The lower limit is preferably 3% by mass or more, more preferably 5% by mass or more, still more preferably 25% by mass or more, and particularly preferably 35% by mass or more. The upper limit is preferably 60% by mass or less, more preferably 55% by mass or less, still more preferably 50% by mass or less, even still more preferably 45% by mass or less, and particularly preferably 42% by mass or less. In a case where the content of the white pigment is within the range, it is possible to form the light scattering layer having a good whiteness and light scattering. Furthermore, color mixing of the light scattering layer can be effectively suppressed in a case where the light scattering layer is formed on the first optical filter layer. The composition for forming the light scattering layer may include only one kind or two or more kinds of the white pigments. In a case where the composition for forming the light scattering layer includes two or more kinds of the white pigments, the total amount thereof preferably falls within the range.

<<Other Coloring Agent>>

The composition for forming a light scattering layer may contain, in addition to the white pigment, other coloring agent. By incorporating s other coloring agent, it is easy to control a* and b* in an L*a*b* color system of CIE 1976 in a case of forming a film with a thickness of 3 μm using the composition to preferred ranges. Examples of such other coloring agents include a chromatic coloring agent and a black coloring agent.

(Chromatic Coloring Agent)

The composition for forming a light scattering layer may contain a chromatic coloring agent. In the present invention, the chromatic coloring agent means a coloring agent (including a white pigment) other than the white coloring agent, and a coloring agent other than the black coloring agent. By incorporating the chromatic coloring agent into the composition for forming the light scattering layer, it is possible to stabilize visible evaluation of the color tint of the composition (L*, a*, and b* in an L*a*b* color system of CIE 1976) by aging, heating, or the like, for example. The chromatic coloring agent is preferably a coloring agent having a maximum absorption in a wavelength range of 400 nm or more and less than 650 nm.

The chromatic coloring agent may be either a chromatic pigment or a dye. The chromatic pigment is preferably an organic pigment. The organic pigment is not particularly limited, and known chromatic pigments can be used. Examples of the organic pigment include the following pigments, but the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all red pigments), C. I. Pigment Green 7, 10, 36, 37, 58, 59, and the like (all green pigments), C. I. Pigment Violet 1, 19, 23, 27, 32, 37, 42, and the like (all violet pigments), C. I. Pigment Blue 1, 2, 15, 15:1, 15:2, 15:3, 15:4, 15:6, 16, 22, 60, 64, 66, 79, 80, and the like (all blue pigments).

The organic pigments may be used singly or in combination of two or more kinds thereof.

The dye is not particularly limited, and known dyes can be used. In terms of the chemical structure, it is possible to use a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyrromethane-based dye, or the like. Incidentally, multimers of these dyes may be used. Further, the dyes described in JP2015-028144A and JP2015-034966A can also be used. In addition, an acidic dye and a derivative thereof can be suitably used as the dye. In addition, a direct dye, a basic dye, a mordant dye, an acidic mordant dye, an azoic dye, a dispersed dye, an oil-soluble dye, a food dye, and derivatives thereof can also be usefully employed. Specific examples of the acidic dye are shown below, but the present invention is not limited thereto. For example, the following dyes and derivatives of these dyes are included.

Acid Alizarin Violet N,

Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, 324:1, Acid Chrome violet K, Acid Fuchsin; acid green 1, 3, 5, 9, 16, 25, 27, 50, Acid Orange 6, 7, 8, 10, 12, 50, 51, 52, 56, 63, 74, 95, Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274, Acid Violet 6B, 7, 9, 17, 19, Acid Yellow 1, 3, 7, 9, 11, 17, 23, 25, 29, 34, 36, 42, 54, 72, 73, 76, 79, 98, 99, 111, 112, 114, 116, 184, 243, Food Yellow 3.

In addition to the above-described dyes, an azo-based acidic dye, a xanthene-based acidic dye, and a phthalocyanine-based acidic dye are also preferable, and acidic dyes such as C. I. Solvent Blue 44 and 38; C. I. Solvent Orange 45; and Rhodamine B and Rhodamine 110, and derivatives of these dyes are also preferably used.

In a case where the composition for forming the light scattering layer contains a chromatic coloring agent, the content of the chromatic coloring agent is preferably 0.1% to 70% by mass in the total solid content of the composition for forming the light scattering layer. The lower limit is more preferably 0.5% by mass or more, and particularly preferably 1.0% by mass or more. The upper limit is more preferably 60% by mass or less, and particularly preferably 50% by mass or less. In a case where the composition for forming the light scattering layer includes two or more kinds of the chromatic coloring agents, the total amount thereof preferably falls within the range.

(Black Coloring Agent)

The composition for forming the light scattering layer can contain a black coloring agent. The black coloring agent may be either an inorganic black coloring agent or an organic black coloring agent.

Examples of the organic black coloring agent include a bisbenzofuranone compound, an azomethine compound, a perylene compound, and an azo-based compound, and the bisbenzofuranone compound and the perylene compound are preferable. Examples of the bisbenzofuranone compound include those described in JP2010-534726A, JP2012-515233A, and JP2012-515234A, and are available as, for example, "Irgaphor Black" manufactured by BASF Corporation. Examples of the perylene compound include C. I. Pigment Black 31 and 32. Examples of the azomethine compound include those described in JP1989-170601A (JP-H01-170601A), JP1990-034664A (JP-H02-034664A), and the like, and are available as, for example, "CHROMOFINE BLACK A1103" manufactured by Dainichiseika Color & Chemicals Mfg. Co., Ltd.

The inorganic black coloring agent is not particularly limited and known inorganic black coloring agents can be used. Examples thereof include carbon black, titanium black, and graphite, and the inorganic black coloring agent is preferably carbon black or titanium black, and more preferably titanium black. The titanium black is a black particle containing a titanium atom, and preferably lower titanium oxide, titanium oxynitride, or the like. The titanium black can have a surface modified, as desired, for the purpose of improvement of dispersibility, suppression of an aggregating property, and the like. It is possible to coat a surface of the titanium black with silicon oxide, titanium oxide, germanium oxide, aluminum oxide, magnesium oxide, or zirconium oxide. In addition, it is also possible to perform a treatment using a water-repellant as shown in JP2007-302836A. Specific examples of the black pigment include C. I. Pigment Black 1 and 7, and a titanium black pigment.

It is preferable that in titanium black, the primary particle diameters of the respective particles and the average primary particle diameter thereof are both small. Specifically, the average primary particle diameter is preferably in the range of 10 to 45 nm.

The specific surface area of titanium black is not particularly limited, but a value thereof as measured by a BET (Brunauer, Emmett, Teller) method is preferably from 5 to 150 m$^2$/g, and more preferably from 20 to 120 m$^2$/g. Examples of commercially available product of titanium black include titanium black 10S, 12S, 13R, 13M, 13M-C, 13R-N, and 13M-T (trade names, manufactured by Mitsubishi Materials Corporation), and Tilack D (trade name: manufactured by Akokasei Co., Ltd.).

The titanium black can also be used as a dispersion. Examples thereof include a dispersion that includes titanium black particles and silica particles, and the content ratio of Si atoms to Ti atoms in the dispersion is adjusted to the range of 0.20 to 0.50. With regard to the dispersion, reference can be made to the description in paragraph Nos. 0020 to 0105 of JP2012-169556A, the contents of which are incorporated herein by reference.

<<Resin>>

The composition for forming the light scattering layer preferably includes a resin. The resin is blended in, for example, an application for dispersing particles such as a pigment in the composition or an application as a binder. Incidentally, a resin which is used mainly for dispersing particles in a composition is also referred to as a dispersant. However, such uses of the resin are only exemplary, and the resin can also be used for other purposes, in addition to such uses.

The weight-average molecular weight (Mw) of the resin is preferably 1,000 to 200,000, and more preferably 2,000 to 100,000. The weight-average molecular weight (Mw) within the ranges is preferable from the viewpoints of compatibility and whitening.

The content of the resin is preferably 5% to 90% by mass, and more preferably 10% to 60% by mass, with respect to the total solid content of the composition for forming a light scattering layer. The content within these ranges is preferable from the viewpoints of a pattern shape, heat resistance, and L*. One kind or two or more kinds of the resins may be included. In a case where two or more kinds of the resins are used, the total amount thereof preferably falls within the range.

(Binder)

The composition for forming the light scattering layer preferably includes a binder as the resin. By incorporating the binder, the film characteristics are improved. As the binder, any of known binders can be used. For example, (meth) acrylic resin, (meth) acrylamide resin, epoxy resin, ene-thiol resin, polycarbonate resin, polyether resin, polyarylate resin, polysulfone resin, polyethersulfone resin, polyphenylene resin, polyarylene ether phosphine oxide Resin, polyimide resin, polyamide imide resin, polyolefin resin, cyclic olefin resin, polyester resin, styrene resin, siloxane resin, and the like can be exemplified. The components may be used singly or in combination of two or more kinds thereof. As cyclic olefin resin, norbornene resin can be preferably used from a viewpoint of heat resistance improvement. As a commercial item of norbornene resin, ARTON series (for example, ARTON F4520) made from JSR Co., Ltd. and the like are exemplified, for example. Moreover, as an epoxy resin, mer proof G-0150M, G-0105SA, G-0130SP, G-0250SP, G-1005S, G-1005SA, G-1010S, G-2050M, G-01100, G-01758 (Nippon Oil Co., Ltd., epoxy group-containing polymer) can also be used. The weight-average molecular weight (Mw) of the resin is preferably 1,000 to 200,000, and more preferably 2,000 to 100,000.

In the present invention, it is also preferable to use, as a binder, a resin having a refractive index of 1.5 or less for light of wavelength of 589 nm. According to this aspect, it is easy to produce a film excellent in whiteness. As such a resin, a fluorine resin, a polysiloxane resin, and the like can be exemplified, it is preferable that it is polysiloxane resin (it is preferable that polysiloxane is main frame). As the polysiloxane-based resin, a polysiloxane-based resin obtained by condensing and hydrolyzing a compound represented by Formula (1), or a polysiloxane-based resin obtained by hydrolyzing and condensing the compound represented by Formula (1) and another silane compound can be used. With regard to the details of the polysiloxane-based resin, reference can be made to the descriptions in paragraph Nos. 0014 to 0035 of JP2014-066988A, the contents of which are incorporated herein by reference.

$R^1{}_2Si(OR^2)_2$   Formula (1)

In Formula (1), $R^1$'s each independently an alkyl group or a phenyl group, and $R^2$'s each independently represent a hydrogen atom or an alkyl group.

In the present invention, an alkali-soluble resin can also be used as a binder. By using an alkali-soluble resin, an alkali-developable composition can be obtained. As alkali-soluble resin, resin which has an acidic radical can be exemplified. As an acid group, for example, a carboxyl group, a phosphoric acid group, a sulfo group, phenolic hydroxyl group and the like can be exemplified, and a carboxyl group is preferable. The acid group may be of one kind or of two or more kinds.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

As the alkali soluble resin, a polymer having a carboxyl group in a side chain is preferable. Specific examples include alkali-soluble phenol resin such as methacrylic acid copolymer, acrylic acid copolymer, itaconic acid copolymer, crotonic acid copolymer, maleic acid copolymer, partially esterified maleic acid copolymer, novolac resin, an acidic cellulose derivative having a carboxyl group in a side chain, a resin obtained by adding an acid anhydride to a polymer having a hydroxyl group. In particular, a copolymer of a (meth)acrylic acid and another monomer which is copolymerizable therewith is preferable as the alkali-soluble resin. Other monomers copolymerizable with (meth) acrylic acid includes alkyl (meth)acrylate, aryl (meth)acrylate, and a vinyl compound and the like. As alkyl (meth) acrylate and aryl (meth) acrylate, methyl (meth) acrylate, ethyl (meth) acrylate, propyl (meth) acrylate, butyl (meth) acrylate, isobutyl (meth) acrylate, pentyl (meth) acrylate, hexyl (meth) acrylate, octyl (meth) acrylate, phenyl (meth) acrylate, benzyl (meth) acrylate, tolyl (meth) acrylate, naphthyl (meth) acrylate, cyclohexyl (meth) acrylate, and the like, as vinyl compounds, styrene, α-methylstyrene, vinyl toluene, glycidyl methacrylate, acrylonitrile, vinyl acetate, N-vinyl pyrrolidone, tetrahydrofurfuryl methacrylate, polystyrene macromonomer, polymethylmethacrylate macromonomer, and the like are included. As other monomers, N-substituted maleimide monomers described in JP-H10-300922A, such as N-phenyl maleimide, N-cyclohexyl maleimide and the like can also be used. These other monomers copolymerizable with (meth) acrylic acid may be only one type, or two or more types.

As the alkali-soluble resin, a benzyl (meth)acrylate/(meth)acrylic acid copolymer, benzyl (meth)acrylate/(meth) acrylic acid/2-hydroxyethyl (meth)acrylate copolymer, or a multicomponent copolymer including benzyl (meth)acrylate/(meth)acrylic acid/other monomers can also be preferably used. Further, copolymers obtained by copolymerizing 2-hydroxyethyl (meth)acrylate, a 2-hydroxypropyl (meth) acrylate/polystyrene macromonomer/benzyl methacrylate/ methacrylic acid copolymer described in JP1995-140654A (JP-H07-140654A), a 2-hydroxy-3-phenoxypropyl acrylate/ polymethyl methacrylate macromonomer/benzyl methacrylate/methacrylic acid copolymer, a 2-hydroxyethyl methacrylate/polystyrene macromonomer/methyl methacrylate/ methacrylic acid copolymer, a 2-hydroxyethyl methacrylate/ polystyrene macromonomer/benzyl methacrylate/ methacrylic acid copolymer, and the like can also be preferably used.

An alkali-soluble resin having a polymerizable group may be used as the alkali-soluble resin. According to this aspect, the solvent resistance of a film thus obtained tends to be improved. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

It is also preferable that the alkali-soluble resin includes a polymer obtained by polymerizing monomer components including a compound represented by Formula (ED1) and/or a compound represented by Formula (ED2) (these compounds are hereinafter also referred to as an "ether dimer" in some cases). With regard to the polymer obtained by polymerizing monomer components including an ether dimer, reference can be made to paragraph 0022 to 0031 of JP2015-034961A, the contents of which are incorporated herein by reference.

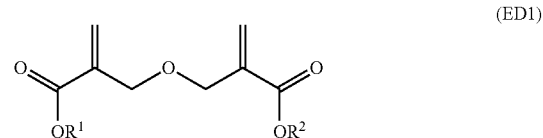

(ED1)

In Formula (ED1), $R^1$ and $R^2$ each independently represent a hydrogen atom, or a hydrocarbon group having 1 to 25 carbon atoms, which may have a substituent.

(ED2)

In Formula (ED2), R represents a hydrogen atom or an organic group having 1 to 30 carbon atoms. With regard to the specific examples of Formula (ED2), reference can be made to the descriptions in JP2010-168539A.

With regard to the specific examples of the ether dimer, reference can be made to paragraph No. 0317 of JP2013-029760A, the contents of which are incorporated herein by reference. The ether dimers may be of one kind or of two or more kinds thereof.

The alkali-soluble resin may include a repeating unit derived from a compound represented by Formula (X).

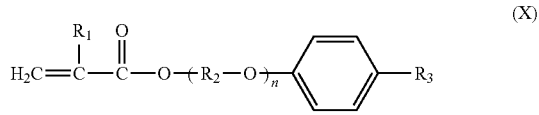

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

Specific examples of the alkali-soluble resin include the following resins. Other examples thereof include the resins described in paragraph No. 0037 of JP2015-034961A. Among these resins, an alkali-soluble resin having a polymerizable group, such as C-2, is preferable from the viewpoint of solvent resistance.

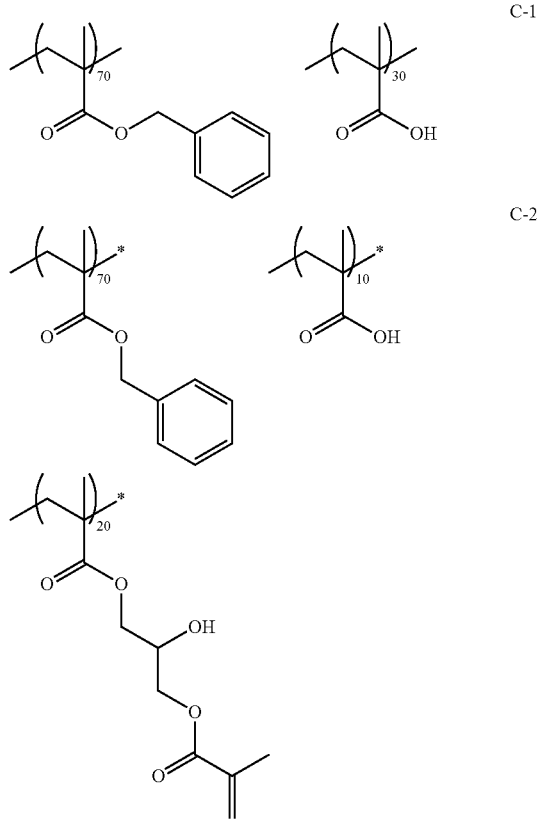

(Dispersant)

The composition for forming a light scattering layer can contain a dispersant as the resin. The dispersant preferably includes at least one selected from an acidic resin, a basic resin, or an amphoteric resin, and more preferably at least one selected from the acidic resin or the amphoteric resin. According to the aspect, the dispersibility of pigment is good.

In the present invention, the acidic resin is a resin having an acid group, which has an acid value of 5 mgKOH/g or more and an amine value of less than 5 mgKOH/g. It is preferable that the acidic resin does not have a basic group. Examples of the acid group contained in the acidic resin include a carboxyl group, a phosphoric acid group, a sulfo group, and a phenolic hydroxyl group, with the phosphoric acid group and the carboxyl group being preferable. The acid value of the acidic resin is preferably 5 to 200 mgKOH/g. The lower limit is more preferably 10 mgKOH/g or more, and still more preferably 20 mgKOH/g or more. The upper limit is more preferably 100 mgKOH/g or less, and still more preferably 60 mgKOH/g or less. Further, the amine value of the acidic resin is preferably 2 mgKOH/g or less, and more preferably 1 mgKOH/g or less.

In the present invention, the basic resin is a resin having a basic group, which has an amine value of 5 mgKOH/g or more and an acid value of less than 5 mgKOH/g. It is preferable that the basic resin does not have an acid group. As the basic group contained in the basic resin, an amino group is preferable. The amine value of the basic resin is preferably 5 to 200 mgKOH/g, more preferably 5 to 150 mgKOH/g, and still more preferably 5 to 100 mgKOH/g.

In the present invention, the amphoteric resin is a resin having an acid group and a basic group, which has an acid value of 5 mgKOH/g or more and an amine value of 5 mgKOH/g or more. Examples of the acid group include the above-mentioned groups, with the carboxyl group being preferable. As the basic group, an amino group is preferable. The amphoteric resin preferably has an acid value of 5 mgKOH/g or more and an amine value of 5 mgKOH/g or more. The acid value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The amine value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The ratio of the acid value to the amine value of the amphoteric resin, acid value:amine value, is preferably 1:4 to 4:1, and more preferably 1:3 to 3:1.

Examples of the dispersant include a polymer dispersant [for example, a resin having an amine group (a polyamidoamine and a salt thereof), an oligoimine-based resin, a polycarboxylic acid and a salt thereof, a high-molecular-weight unsaturated acid ester, a modified polyurethane, a modified polyester, a modified poly(meth)acrylate, a (meth) acrylic copolymer, and a naphthalene sulfonic acid/formalin polycondensate]. The polymer dispersants can further be classified into a linear polymer, a terminal-modified polymer, a graft type polymer, and a cutting type polymer, depending on its structure.

The dispersant is preferably a resin having a site having an adsorptive ability onto a pigment (hereinafter also totally referred to as an "adsorptive site"). Examples of the adsorptive site include a monovalent substituent having at least one group selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. The adsorption site is preferably an acid group. Among those, the adsorptive site is preferably at least one of a phosphorus atom-containing group or a carboxyl group. Examples of the phosphorus atom-containing group include a phosphoric acid ester group, a polyphosphoric acid ester group, and a phosphoric acid group. With regard to the details of the adsorptive site, reference can be made to paragraph Nos. 0073 to 0080 of JP2015-034961A, the contents of which are incorporated herein by reference.

In the present invention, the resin (dispersant) is preferably a resin represented by Formula (111).

In Formula (111), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. n $A^1$'s and n $R^2$'s may be same as or different from each other, respectively. M represents a positive number of 8 or less, n represents an integer of 1 to 9, and m+n satisfies an integer of 3 to 10. $P^1$ represents a monovalent polymer chain. m $P^1$'s may be the same as or different from each other.

With regard to the resin represented by the Formula (111), reference can be made to the descriptions in paragraph No. 0039 of JP2007-277514A (paragraph No. 0053 of the corresponding US2010/0233595A), the descriptions in paragraph Nos. 0081 to 0117 of JP2015-034961A, and the descriptions in JP5909468B, JP5894943B, and JP5894944B, the contents of which are incorporated herein by reference.

In the present invention, as the resin (dispersant), a graft copolymer including a repeating unit represented by any one of Formulae (11) to (14) can also be used.

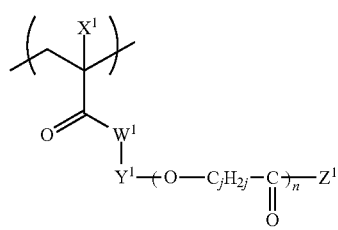

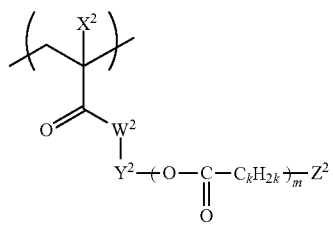

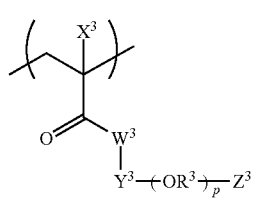

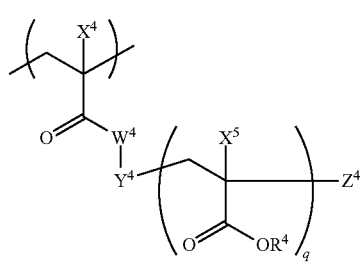

In Formulae (11) to (14), $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p is 2 to 500, $R^3$'s which are present in plural numbers may be the same as or different from each other, and in Formula (14), in a case where q is 2 to 500, $X^5$'s and $R^4$'s which are present in plural numbers may be the same as or different from each other.

With regard to the graft copolymer, reference can be made to the descriptions in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

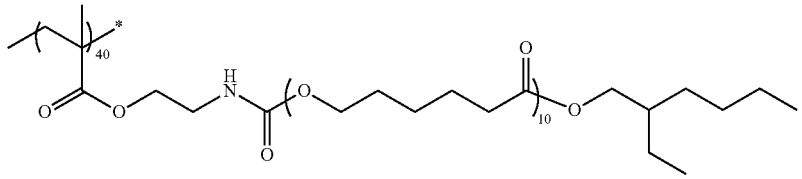

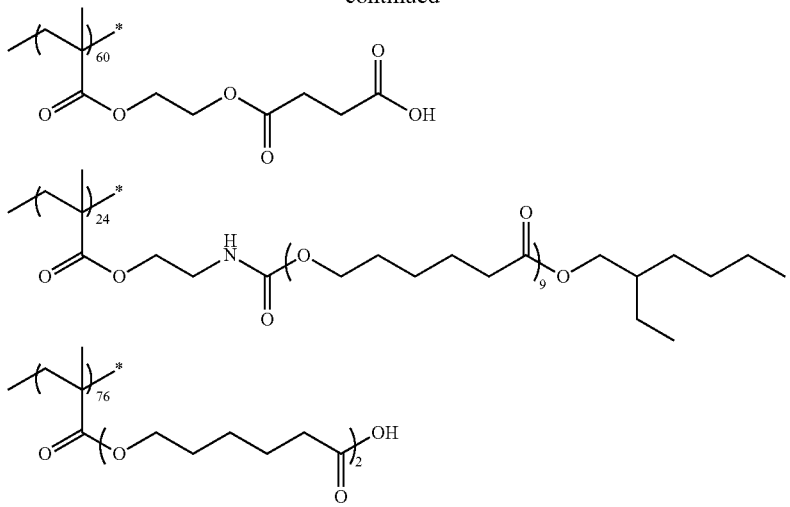

In the present invention, as the resin (dispersant), an oligoimine-based dispersant having a basic nitrogen atom in at least one of the main chain or a side chain is also preferable. As the oligoimine-based dispersant, a resin including a repeating unit having a partial structure X having a functional group with a pKa of 14 or less and a side chain including an oligomer chain or polymer chain Y having 40 to 10,000 atoms, and having a basic nitrogen atom in at least one of the main chain or the side chain is preferable. This resin interacts with the pigment at both the nitrogen atom and the functional group having a partial structure X and a pKa of 14 or less. And it is possible to disperse the pigment uniformly in the composition by functioning the oligomer chain or polymer chain Y as a steric repulsion group to achieve good dispersibility. In addition, the interaction between the oligomer chain or polymer chain Y and the solvent can suppress sedimentation of the white pigment for a long time.

Here, the basic nitrogen atom is not particularly limited as long as it is a nitrogen atom exhibiting basicity, but it is preferable that the resin contains a structure having a nitrogen atom with a pKb of 14 or less, and more preferably contains a structure having a nitrogen atom with a pKb of 10 or less. In the present invention, the pKb (base strength) refers to a pKb at a water temperature of 25° C., is one of the indices for quantitatively representing the intensity of a base, and has the same definition as the basicity constant. The base strength pKb and the acid strength pKa are in a relationship of pKb=14-pKa.

With regard to the oligoimine-based dispersant, reference can be made to the descriptions in paragraph Nos. 0118 to 0190 of JP2015-034961A, the contents of which are incorporated herein by reference. As specific examples of the oligoimine-based dispersant, for example, the following resins or the resins described in paragraph Nos. 0169 to 0190 of JP2015-034961A can be used.

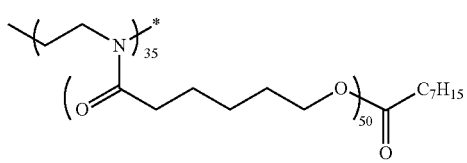

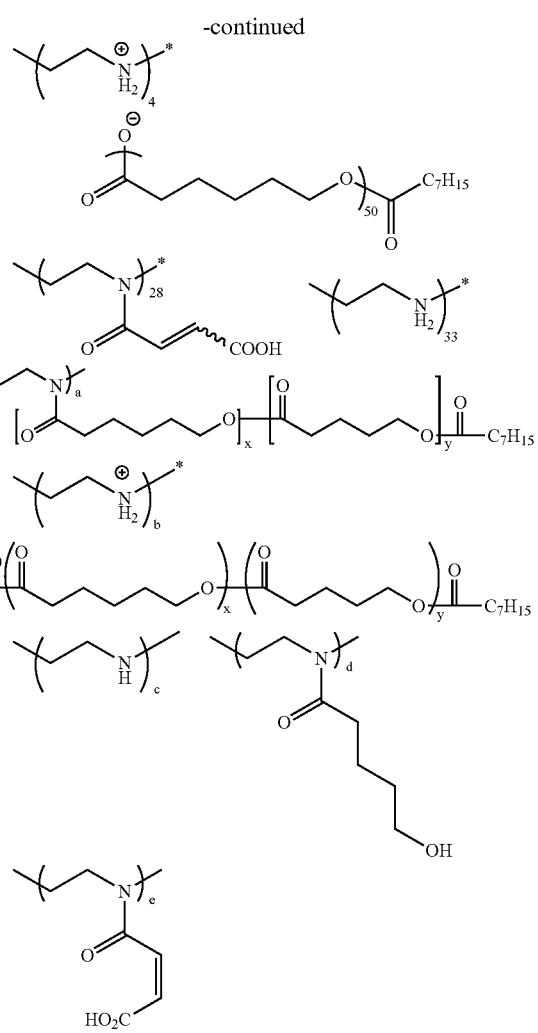

The dispersant is also available as a commercially available product, and as such specific examples, Solsperse 36000, 41000 (Lubrizol Co., Ltd. product), light ester P-1

M, light ester P-2 M (Kyoeisha Chemical) and the like can be exemplified. In addition, dispersing agent described in paragraphs 0041 to 0130 of JP2014-130338A can also be used, the contents of which are incorporated herein. The dispersants can be used singly or in combination of two or more kinds thereof. For the dispersant, the resin described for the binder as described above can also be used. Further, for the dispersant, a resin having a refractive index to light at a wavelength of 589 nm of 1.5 or less may be used.

The content of the dispersant is preferably 1% to 80% by mass with respect to the total solid content of the composition for forming the light scattering layer, from the viewpoints of a pattern shape and adhesiveness. The upper limit is preferably 70% by mass or less, and more preferably 60% by mass or less, with respect to the total solid content of the composition for forming the light scattering layer. The lower limit is preferably 1.5% by mass or more, and more preferably 2% by mass or more.

Furthermore, the content of the dispersant is preferably 1 to 100 parts by mass with respect to 100 parts by mass of the white pigment. The upper limit is preferably 80 parts by mass or less, and more preferably 60 parts by mass or less. The lower limit is preferably 2.5 parts by mass or more, and more preferably 5 parts by mass or more.

Moreover, the content of the dispersant is preferably 1 to 100 parts by mass with respect to 100 parts by mass of the white pigment. The upper limit is preferably 80 parts by mass or less, and more preferably 60 parts by mass or less. The lower limit is preferably 2.5 parts by mass or more, and more preferably 5 parts by mass or more.

In addition, the content of the dispersant is preferably 1 to 100 parts by mass with respect to 100 parts by mass of titanium oxide. The upper limit is preferably 80 parts by mass or less, and more preferably 60 parts by mass or less. The lower limit is preferably 2.5 parts by mass or more, and more preferably 5 parts by mass or more.

<<Solvent>>

The composition for forming a light scattering layer preferably contains a solvent. The solvent can be constituted with various organic solvents. Examples of organic solvents include, for example, esters, ethers, ketones, aromatic hydrocarbons and the like. With regard to the details of these, reference can be made to paragraph 0223 of WO2015/166779A, the content of which is incorporated herein. Further, ester solvents substituted with a cyclic alkyl group and ketone solvents substituted with a cyclic alkyl group can also be preferably used. Specific examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclohexyl acetate, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, g-butyrolactone, methyl lactate, ethyl lactate, butyl diglycol acetate, and 3-methoxybutyl acetate. Further, 3-methoxy-N, N-dimethylpropanamide and 3-butoxy-N, N-dimethylpropanamide are also preferable from the viewpoint of solubility improvement. These organic solvents may be used individually or as a mixture. However, aromatic hydrocarbons (benzene, toluene, xylene, ethylbenzene, and the like) as a solvent may be better to be reduced due to environmental reasons, and the like. (for example, it can be 50 ppm by mass (parts per million) or less), 10 ppm by mass or less, or 1 ppm by mass or less based on the total amount of organic solvent).

In the present invention, a solvent having a small metal content is preferably used as the solvent. The metal content of the solvent is preferably, for example, 10 parts per billion (ppb) by mass or less. As desired, a solvent having a metal content at a level of parts per trillion (ppt) by mass may be used, and such a high-purity solvent is provided by, for example, Toyo Gosei Co., Ltd. (The Chemical Daily (Kagaku Kogyo Nippo), Nov. 13, 2015).

Examples of a method for removing impurities such as metals from the solvent include distillation (molecular distillation, thin film distillation, or the like) and filtration using a filter. As for the filter pore diameter of the filter used for the filtration, the pore size is preferably 10 µm or less, more preferably 5 µm or less, and still more preferably 3 µm or less. As for the materials of a filter, a polytetrafluoroethylene-made filter, a polyethylene-made filter, or a nylon-made filter is preferable.

The solvent may include isomers (compounds having the same number of atoms and different structures). Further, one kind or a plurality of kinds of the isomers may be included.

The content of the solvent is preferably an amount in which the concentration of the solid content of the composition for forming the light scattering layer becomes 25% to 70% by mass, and more preferably an amount in which the concentration of the solid content of the composition for forming the light scattering layer becomes 30% to 60% by mass.

<<Curable Compound>>

The composition for forming a light scattering layer preferably contains a curable compound.

For the curable compound, a compound which can be crosslinked (the crosslinking includes polymerization and condensation) by a radical, an acid, or heat can be used. Examples of the curable compound used in the present invention include a compound having an ethylenically unsaturated bond-containing group, a compound having an epoxy group, and a compound having a methylol group, with the compound having an ethylenically unsaturated bond-containing group being preferable. Examples of the ethylenically unsaturated bond-containing group include a vinyl group, a (meth)allyl group, and a (meth)acryloyl group, and the curable compound is preferably the (meth)acryloyl group.

In the present invention, the curable compound is preferably a radically polymerizable compound. Examples of the radically polymerizable compound include a compound having a group having an ethylenically unsaturated bond. Hereinafter, in a case where a polymerizable compound is referred unless otherwise specified, it means a radically polymerizable compound.

The content of the curable compound is preferably 1% to 70% by mass with respect to the total solid content of the composition for forming the light scattering layer. The lower limit is preferably 3% by mass or more, and more preferably 5% by mass or more. The upper limit is preferably 60% by mass or less, and more preferably 50% by mass or less. The content within these ranges is preferable from the viewpoints of a pattern shape, heat resistance, and L*. The curable compounds used in the composition for forming the light scattering layer may be of one kind or two or more kinds thereof. In a case where the curable compounds are of two or more kinds thereof, the total amount thereof preferably falls within the range.

In a case where a polymerizable compound is used as the curable compound, the content of the polymerizable compound is preferably 1% to 70% by mass with respect to the total solid content of the composition for forming the light scattering layer. The lower limit is preferably 3% by mass or more, and more preferably 5% by mass or more. The upper limit is preferably 60% by mass or less, and more preferably 50% by mass or less. The polymerizable compound used in the composition for forming the light scattering layer may be of one kind or of two or more kinds thereof. In a case where the curable compounds are of two or more kinds thereof, the total amount thereof preferably falls within the range.

In addition, the content of the polymerizable compound is preferably 10% to 100% by mass, and more preferably 30% to 100% by mass, with respect to the total mass of the curable compound.

(Polymerizable Compound)

The polymerizable compound is preferably a compound having at least one ethylenically unsaturated bond-containing group, and more preferably a compound having at least one terminal ethylenically unsaturated bond-containing group, or preferably two or more terminal ethylenically unsaturated bond-containing groups. Further, the polymerizable compound is preferably a compound having 6 or more ethylenically unsaturated bond-containing groups, more preferably a compound having 3 or 4 ethylenically unsaturated bond-containing groups, and still more preferably a compound having 3 or 4 ethylenically unsaturated bond-containing groups.

The polymerizable compound may be in any form of a monomer and a polymer, with the monomer being preferable. The monomer type polymerizable compound preferably has a molecular weight of 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, more preferably a trifunctional to hexafunctional (meth)acrylate compound, and still more preferably a trifunctional or tetrafunctional (meth)acrylate compound, from the viewpoint of a pattern shape. According to this aspect, the solvent resistance of the obtained film, the adhesiveness to a substrate, or the pattern shape can be improved. Further, the polymerizable compound is preferably a hexafunctional or higher (meth)acrylate compound.

Specific examples of the polymerizable compounds include the compounds described in paragraph Nos. 0248 to 0251 of JP2007-269779A.

Furthermore, a compound obtained by adding ethylene oxide or propylene oxide to a polyfunctional alcohol, followed by (meth)acrylation, which is described in JP1998-062986A (JP-H10-062986A), can also be used as the polymerizable compound.

As the polymerizable compound, pentaerythritol tetraacrylate (NK ESTER A-TMMT as a commercially available product; manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), or dipentaerythritol hexa(meth)acrylate (KAYARAD DPHA as a commercially available product; manufactured by Nippon Kayaku Co., Ltd.) is preferable, and pentaerythritol tetraacrylate is more preferable from the viewpoint of a pattern shape. Further, as the polymerizable compound, it is also preferable to use Alonics TO-2349 (manufactured by Toagosei Co., Ltd.), NK ester A-DPH-12E (manufactured by Shin-Nakamura Chemical Co., Ltd.), or the like.

The polymerizable compound may have an acid group such as a carboxyl group, a sulfo group, and a phosphoric acid group. Examples of the commercially available products of the polymerizable compound having an acid group include ARONIX series M-305, M-510, and M-520 as a polybasic acid-modified acryl oligomer manufactured by TOAGOSEI, CO., LTD. The acid value of the polymerizable compound having an acid group is preferably 0.1 to 40 mgKOH/g. The lower limit is preferably 5 mgKOH/g or more. The upper limit is preferably 30 mgKOH/g or less.

Moreover, it is also a preferred aspect that the polymerizable compound is a compound having a caprolactone structure. The polymerizable compound having a caprolactone structure is not particularly limited as long as it has a caprolactone structure in a molecule thereof. Examples thereof include e-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and e-caprolactone. With regard to the polymerizable compound having a caprolactone structure, reference can be made to the descriptions in paragraph Nos. 0091 to 0107 of JP2016-006475A, the contents of which are incorporated herein by reference. Examples of the commercially available product of the polymerizable compound include SR-494 which is a tetrafunctional acrylate having four ethyleneoxy chains, manufactured by Sartomer, and DPCA-60 which is a hexafunctional acrylate having six pentyleneoxy chains, and TPA-330 which is a trifunctional acrylate having three isobutyleneoxy chains, manufactured by Nippon Kayaku Co., Ltd.

As the polymerizable compound, the urethane acrylates described in JP1973-041708B (JP-S48-041708B), JP1976-037193A (JP-S51-037193A), JP1990-032293B (JP-H02-032293B), and JP1990-016765B (JP-H02-016765B) or urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. In addition, the addition-polymerizable compounds having an amino structure or a sulfide structure in a molecule, which are described in JP1988-277653A (JP-S63-277653A), JP1988-260909A (JP-S63-260909A), and JP1989-105238A (JP-H01-105238A), are also preferable.

The polymerizable compound is a commercially available product, Urethane Oligomer UAS-10, UAB-140 (manufactured by Sanyo Kokusaku Pulp Co., Ltd.), U-4HA, U-6LPA, UA-32P, U-10HA, U-10PA, UA-122P, UA-1100H, UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600, AI-600 (manufactured by Kyoeisha Chemical Co., Ltd.), UA-9050, UA-9048 (manufactured by BASF Corporation.), 8UH-1006, 8UH-1012 (manufactured by Taisei Fine Chemical Co., Ltd.), and the like.

Furthermore, it is another preferred aspect that the polymerizable compound is a polymerizable compound having a Si atom in the molecule thereof. Examples of a commercially available product of the polymerizable compound is a polymerizable compound having a Si atom in the molecule thereof include EBECRYL 1360 (manufactured by Daicel-Allnex Ltd.) which is a siloxane bond-containing polyfunctional acrylate, and VINYLTRIISOPROPENOXYSILANE (manufactured by AZmax Co., Ltd.) which is a Si atom-containing polyfunctional vinyl compound.

As for these polymerizable compounds, details of the method of use such as the structure of the compounds, single use or use of a combination, and the amount to be added may be arbitrarily set in accordance with the final performance design of the curable compositions. For example, from the viewpoint of sensitivity, a structure having a high content of unsaturated groups per one molecule is preferable, and in many cases, bifunctionality or higher functionality is preferred. Further, from the viewpoint of increasing the strength of a cured film, a trifunctional or higher compound is desirable, and in addition, it is also effective to use a method of controlling both the sensitivity and the strength by using a combination of compounds with at least one of functionalities or polymerizable groups being different. In addition, it is also preferable to use a polymerizable compound having a different ethylene oxide chain form as a trifunctional or higher compound in combination. According to this aspect, it is possible to form a pattern having controllable and excellent developability of the composition for forming the light scattering layer. Further, at least one of the selection or the method of use of the polymerizable compounds is also an important factor for at least one of the compatibility with or the dispersibility of other components (for example, a photopolymerization initiator and a resin) contained in the composition for forming the light scattering layer, and for example, the compatibility or the like can be improved by using a low-purity compound or using a combination of two or more kinds of other components.

(Compound Having Epoxy Group)

For the composition for forming a light scattering layer, a compound having an epoxy group can also be used as the curable compound. According to this aspect, the solvent resistance of the obtained film can be improved. Examples of the compound having an epoxy group include a monofunctional or polyfunctional glycidyl ether compound and a polyfunctional aliphatic glycidyl ether compound. Further, a compound having an alicyclic epoxy group can also be used.

Examples of the compound having an epoxy group include a compound having one or more epoxy groups per molecule, and the number of epoxy groups per molecule is preferably 1 to 100. The upper limit can be set to, for example, 10 or less, or to 5 or less. The lower limit is preferably 2 or more.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low molecular compound (for example, further, a molecular weight of less than 1,000) or a polymer compound (macromolecule) (for example, a molecular weight of 1,000 or more, and in the case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 10,000 or less, more preferably 5,000 or less, and still more preferably 3,000 or less. It is preferable that the compound having an epoxy group is an aliphatic epoxy resin from the viewpoint of solvent resistance.

Commercially available products of the compound having an epoxy group include EHPE 3150 (manufactured by Daicel Co., Ltd.), EPICLONN-695 (manufactured by DIC Corporation), and the like. In addition, as the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A can also be used, and the contents of the publications are incorporated herein by reference.

<<Polymerization Initiator>>

The composition for forming a light scattering layer preferably includes a polymerization initiator.

The content of the polymerization initiator is preferably 0.1% to 50% by mass with respect to the total solid content of the composition for forming a light scattering layer from the viewpoints of solvent resistance and a coloration property, more preferably 0.5 to 30% by mass, and still more preferably 1% to 20% by mass. The composition may have one kind or two or more kinds of the polymerization initiators. In a case where two or more kinds of the resins are used, the total amount thereof preferably falls within the range.

As the polymerization initiator, a photopolymerization initiator or a thermal polymerization initiator is preferable, with the photopolymerization initiator being preferable. The thermal polymerization initiator is not particularly limited, known compounds can be used.

(Photopolymerization Initiator)

The composition for forming a light scattering layer can contain a photopolymerization initiator. In particular, in a case where the composition for forming the light scattering layer includes a polymerizable compound, it is preferable that the composition contains a photopolymerization initiator. The photopolymerization initiator is not particularly limited, and can be appropriately selected from known photopolymerization initiators. For example, a compound having photosensitivity with respect to light rays from an ultraviolet region to a visible light region is preferable. Further, the photopolymerization initiator is preferably a photoradical polymerization initiator.

The photopolymerization initiator includes, for example, a halogenated hydrocarbon derivative (for example, a compound having a triazine skeleton, a compound having an oxadiazole skeleton, and the like), an acyl phosphine compound, a hexaarylbiimidazole, an oxime compound, an organic peroxide, a thio compounds, a ketone compound, an aromatic onium salts, an α-hydroxy ketone compounds, an α-amino ketone compounds and the like. Furthermore, from the viewpoint of exposure sensitivity, the photo radical polymerization initiator is a trihalomethyl triazine compound, a benzyl dimethyl ketal compound, an α-hydroxy ketone compound, an α-amino ketone compound, an acyl phosphine compound, a phosphine oxide compound, a metallocene compound, an oxime compound, a triaryl imidazole dimer, an onium compound, a benzothiazole compound, a benzophenone compound, an acetophenone compound, a cyclopentadiene-benzene-iron complex, a halomethyl oxadiazole compound, and a 3-aryl substituted coumarin compound are preferable, and a compound selected from an oxime compound, an α-hydroxy ketone compound, an α-amino ketone compound, and an acyl phosphine compounds are more preferable, and an oxime compounds is still more preferable. As the photopolymerization initiator, the reference can be made to the description in paragraph 0065 to 0111 of JP2014-130173A, and the contents of which are incorporated herein by reference. Furthermore, as the photopolymerization initiator, KAYACURE DETX-S (manufactured by Nippon Kayaku Co., Ltd.) can also be used.

Examples of commercially available α-hydroxy ketone compounds include IRGACURE-184, DARO CUR-1173, IRGACURE-500, IRGACURE-2959, IRGACURE-127 (manufactured by BASF Corporation) and the like. Examples of commercially available α-amino ketone compounds include IRGACURE-907, IRGACURE-369, IRGACURE-379, and IRGACURE-379EG (manufactured by BASF Corporation) and the like. Examples of commercially available products of acyl phosphine compounds include IRGACURE-819, DAROCUR-TPO (manufactured by BASF Corporation) and the like.

As the specific examples of the oxime compounds, the compound described in JP2001-233842A, the compound described in JP2000-080068A, the compound described in JP2006-342166A, or the compound described in JP2016-021012A can be used. In the present invention, examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Furthermore, examples of the oxime compound also include the compounds described in J. C. S. Perkin II (1979), pp. 1653-1660, J. C. S. Perkin II (1979), pp. 156-162, Journal of Photopolymer Science and Technology (1995), pp. 202-232, and JP2000-066385A, JP2000-080068A, JP2004-534797A, and JP2006-342166A, and the like. As the commercially available products thereof, IRGACURE OXE01, IRGACURE OXE02, IRGACURE-OXE03, and IRGACURE-OXE04 (manufactured by BASF) and IRGACURE OXE02 (manufactured by BASF) are also suitably used. In addition, TR-PBG-304 (manufactured by Changzhou Tronly New Electronic Materials Co., Ltd.), ADEKA OPTOMER N-1919 (manufactured by ADEKA Corporation, or the photopolymerization initiator 2 described in JP2012-014052A) can also be used. Further, as the oxime compound, it is also preferable to use a compound having no coloration property or a compound having high transparency and being hard to discolor. Examples of commercially available products include Adeka ARKules NCI-730, NCI-831, NCI-930 (manufactured by ADEKA Corporation) and the like.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

In the present invention, an oxime compound having a nitro group can also be used as the photopolymerization initiator. The oxime compound having a nitro group is preferably used in the form of a dimer. Specific examples of the oxime compound having a nitro group include the compounds described in paragraph Nos. 0031 to 0047 of JP2013-114249A and paragraph Nos. 0008 to 0012, and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

(C-1)

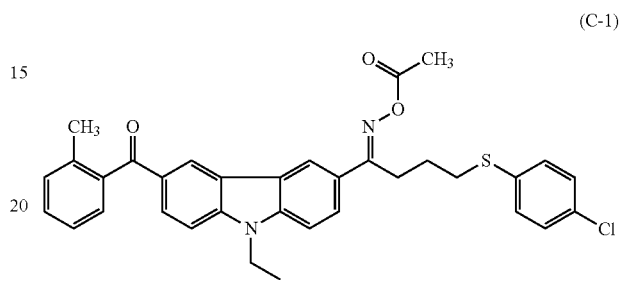

(C-2)

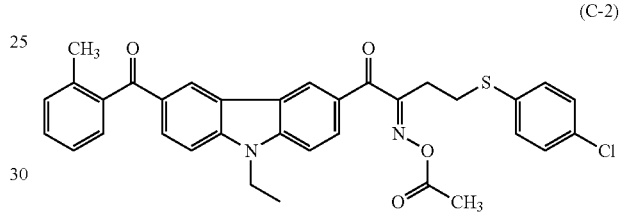

(C-3)

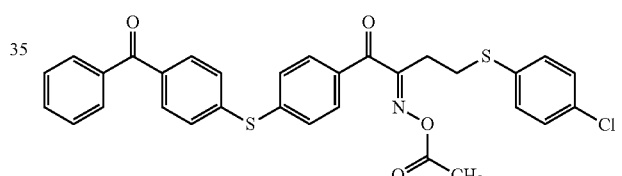

(C-4)

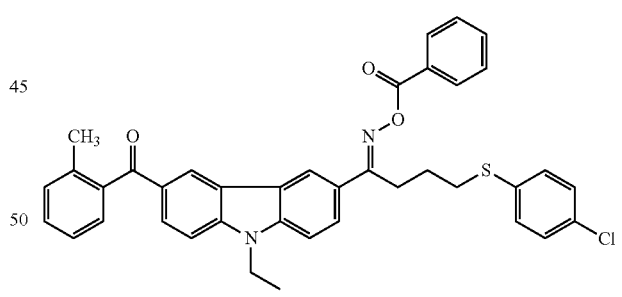

(C-5)

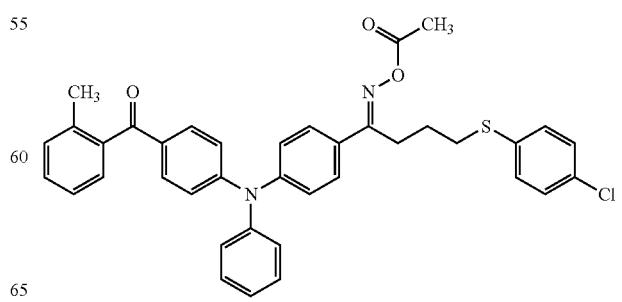

(C-6)
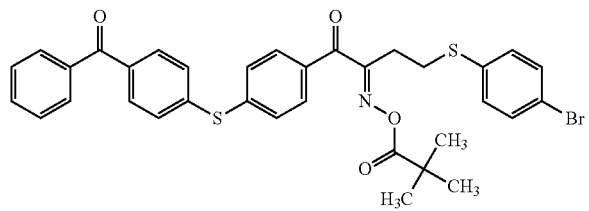
(C-11)
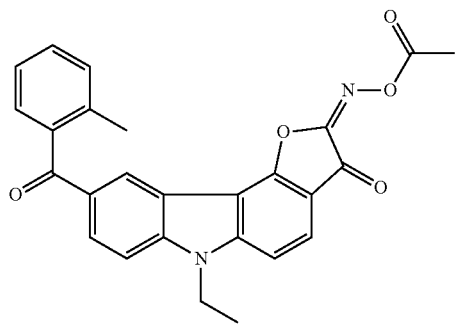
(C-7)
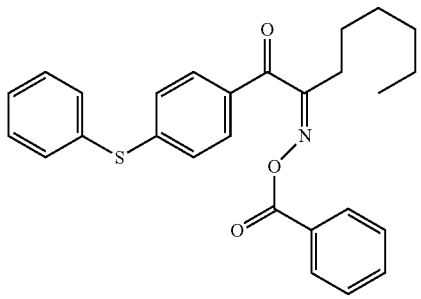
(C-12)
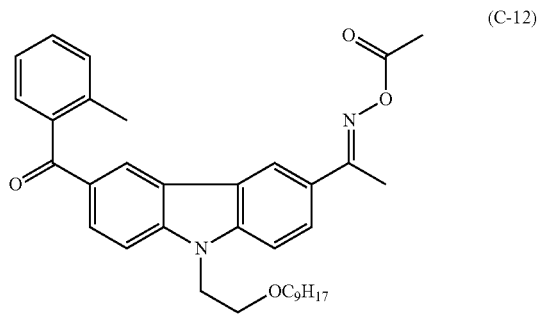
(C-8)
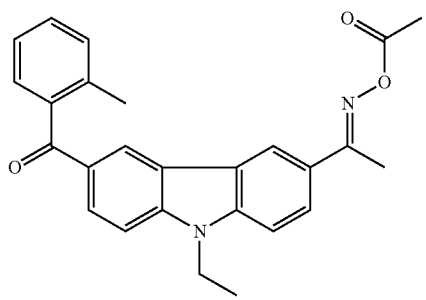
(C-13)
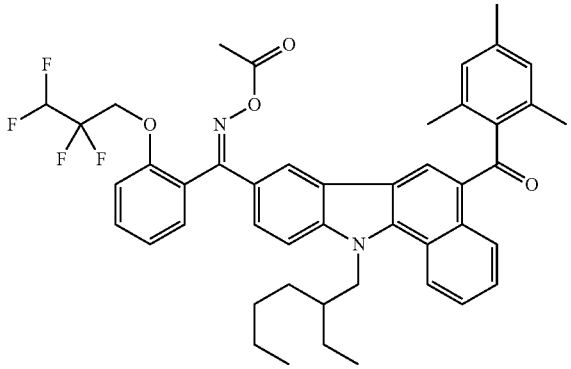
(C-9)
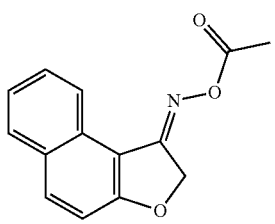
(C-14)
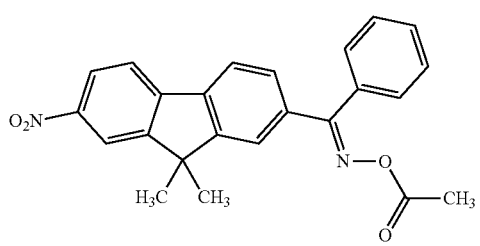
(C-10)
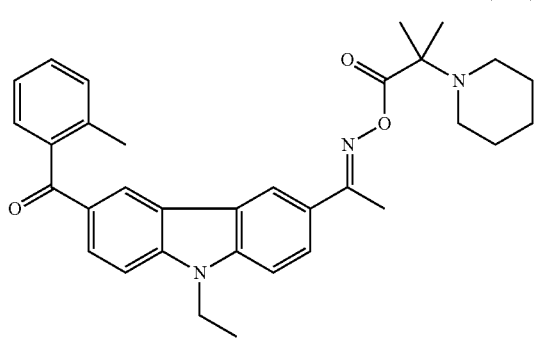
(C-15)
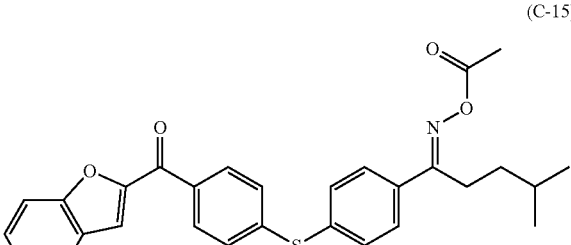
The oxime compound is the compound having a maximum absorption in a wavelength region of preferably 350 nm to 500 nm, more preferably the compound having a maximum absorption in a wavelength region of 360 nm to 480 nm. Moreover, the oxime compound is preferably a compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000.

The molar light absorption coefficient of the compound can be measured using a known method. For example, it is preferable to measure at a concentration of 0.01 g/L using an ethyl acetate solvent with a spectrophotometer (Cary-5 spectrophotometer manufactured by Varian).

In the present invention, it is also preferable that the photopolymerization initiator is used in combination of two or more kinds thereof. For example, it is preferable to use a combination of a photopolymerization initiator with a light absorption coefficient at 365 nm in methanol of $1.0 \times 10^3$ mL/gcm or more and a photopolymerization initiator with a light absorption coefficient at 365 nm in methanol of $1.0 \times 10^2$ mL/gcm or less and a light absorption coefficient at 254 nm in methanol of $1.0 \times 10^3$ mL/gcm or more. As a specific example, combined use of an α-amino ketone compound and an oxime compound can be exemplified. According to this aspect, it is possible to produce a film having excellent curability even under a low-temperature condition. For example, in the pattern forming step, by exposing the composition for forming the light scattering layer in two steps before the developing step and after the developing step, the composition for forming the light scattering layer can be suitably cured with the initial exposure, and approximately the entirety of the composition for forming the light scattering layer can be cured by the next exposure. As a result, the curability of the composition for forming the light scattering layer can be improved even under the low-temperature condition.

<<Coloration Inhibitor>>

The composition for forming a light scattering layer can contain a coloration inhibitor. The color inhibitors described in the present specification can also be used as antioxidants and polymerization inhibitors. Examples of the coloration inhibitor include a phenol compound, a phosphorous acid ester compound, and a thioether compound, and the coloration inhibitor is more preferably a phenol compound having a molecular weight of 500 or more, a phosphorous acid ester compound having a molecular weight of 500 or more, or a thioether compound having a molecular weight of 500 or more is more preferable. Further, the coloration inhibitor is preferably a phenol compound, and more preferably a phenol compound having a molecular weight of 500 or more.

As the phenol compound, any of phenol compounds known as the phenol-based coloration inhibitor can be used. Preferred examples of the phenol compound include a hindered phenol compound. Particularly, a compound having a substituent at a site (ortho-position) adjacent to the phenolic hydroxyl group is preferable. The above-mentioned substituent is preferably a substituted or unsubstituted alkyl group having 1 to 22 carbon atoms. Further, a compound having a phenol group and a phosphorous acid ester group in the same molecule is also preferable.

As the phenol-based hydroxyl group-containing compound, in particular, multi-substituted phenol compounds are preferably used. The multi-substituted phenol-based compounds are mainly classified into three types having different substitution positions and structures, based on reactivity to peroxy radicals captured due to stable phenoxy radical generation, as follows: a hindered type of Formula (A), a semi-hindered type of Formula (B), and a less-hindered type of Formula (C).

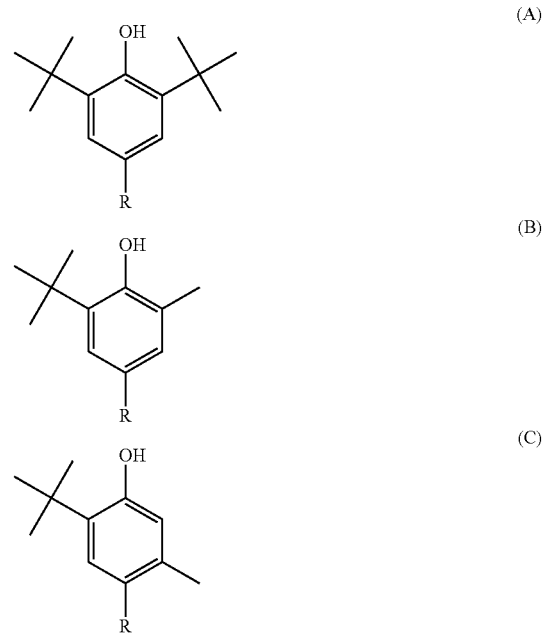

In Formulae (A) to (C), R is a hydrogen atom or a substituent. R is preferably a hydrogen atom, a halogen atom, an amino group which may have a substituent, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent, and more preferably the amino group which may have a substituent, the alkyl group which may have a substituent, the aryl group which may have a substituent, the alkoxy group which may have a substituent, the aryloxy group which may have a substituent, the alkylamino group which may have a substituent, or the arylamino group which may have a sub stituent.

In a more preferred aspect, the compound is a composite type coloration inhibitor in which a plurality of structures expressing a coloration-preventing function, represented by Formulae (A) to (C) are present, in the same molecule, and specifically, the compound preferably has 2 to 4 structures expressing a coloration-preventing function, represented by Formulae (A) to (C) in the same molecule. Among these, the semi-hindered type of Formula (B) is more preferable from the viewpoint of a coloration property.

Examples of the phenol-based hydroxyl group-containing compound include a compound selected from the group consisting of paramethoxyphenol, di-t-butyl-paracresol, pyrogallol, t-butylcatechol, 4,4-thiobis(3-methyl-6-t-butylphenol), 2,2'-methylenebis(4-methyl-6-t-butylphenol), phenol resins, and cresol resins.

As representative examples of the coloring inhibitor which is available as a commercially available product, examples of (A) include Sumilizer BHT (manufactured by Sumitomo Chemical Co., Ltd.), Irganox 1010 and 1222 (manufactured by BASF), and ADK STAB AO-20, AO-50, and AO-60 (manufactured by ADEKA Corporation). Examples of (B) include Sumilizer BBM-S (manufactured by Sumitomo Chemical Co., Ltd.), Irganox 245 (manufactured by BASF), ADK STAB AO-80 (manufactured by ADEKA Corporation). Examples of (C) include ADK STAB AO-30 and AO-40 (manufactured by ADEKA Corporation).

Examples of the phosphorous acid ester compound include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-ditert-butyl-6-methylphenyl) phosphite.
Representative examples of the phosphorous acid ester compound that can be available as a commercially available product include ADEKA STAB PEP-36A (manufactured by ADEKA Corporation).

As the thioether compound, for example, dialkylthiodipropionates such as dilauryl thiodipropionate, dimyristyl thiodipropionate, and distearyl thiodipropionate, and pentaerythritol tetra(b-alkylthiopropionic acid)esters; pentaerythritol tetrakis(3-laurylthiopropionate), dilauryl-3,3'-thiodipropionate, dimyristyl-3,3'-thiodipropionate, distearyl-3,3'-thiodipropionate, and the like; tetrakis[methylene-3-(laurylthio)propionate]methane, bis(methyl-4-[3-n-alkyl(C12/C14)thiopropionyloxy]5-t-butylphenyl)sulfide, ditridecyl-3,3'-thiodipropionate, dilauryl-3,3'-thiodipropionate, dimyristyl-3,3'-thiodipropionate, distearyl-3,3'-thiodipropionate, lauryl/stearyl thiodipropionate, 4,4'-thiobis(6-t-butyl-m-cresol), 2,2'-thiobis(6-t-butyl-p-cresol), and distearyl-disulfide are preferable.

Representative examples of the thioether compound that is available as a commercially available product include ADEKA STAB AO-412S (CAS: 29598-76-3, manufactured by ADEKA Corporation), ADEKA STAB AO-503 (CAS: 10595-72-9, manufactured by ADEKA Corporation), and KEMINOX PLS (CAS: 29598-76-3, manufactured by Chemipro Kasei Kaisha, Ltd.).

In addition to the above-mentioned representative example, other examples of a commercially available product of the coloration inhibitor include ADEKA STAB AO-50F, ADEKA STAB AO-60G, and ADEKA STAB AO-330 (ADEKA Corporation).

Moreover, as a coloration inhibitor,
N-oxide compounds such as 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide;
piperidine-1-oxyl free radical compounds such as piperidine-1-oxyl free radical, 2,2,6,6-tetramethylpiperidine-1-oxyl free radical, 4-oxo-2,2,6,6-tetramethylpiperidine-1-oxyl free radical, 4-hydroxy-2,2,6,6-tetramethylpiperidine-1-oxyl free radical, 4-acetamido-2,2,6,6-tetramethylpiperidine-1-oxyl free radical, 4-maleimido-2,2,6,6-tetramethylpiperidine-1-oxyl free radical, and 4-phosphonooxy-2,2,6,6-tetramethylpiperidine-1-oxyl free radical;
Pyrrolidine 1-oxyl free radical compounds such as 3-carboxyproxyl free radical and 3-carboxy-2,2,5,5-tetramethylpyrrolidine 1-oxyl free radical;
N-nitrosophenylhydroxyamines such as N-nitrosophenylhydroxyamine cerous salt and N-nitrosophenylhydroxyamine aluminum salt;
diazonium compounds such as hydrogen sulfate of 4-diazophenyldimethylamine, tetrafluoroborate of 4-diazodiphenylamine and hexafluorophosphate of 3-methoxy-4-diazodiphenyl amine;

cationic dyes;

nitro group-containing compounds;

transition metal compounds such as $FeCl_3$ and $CuCl_2$ can also be used. The details of these include the compounds described in paragraphs 0211 to 0223 of JP2015-034961A, the contents of which are incorporated herein by reference.

From the viewpoints of a coloration property and solvent resistance, the content of the coloration inhibitor is preferably 0.01% to 20% by mass, more preferably 0.1% to 15% by mass, and particularly preferably 0.3% to 5% by mass, with respect to the total solid content of the composition for forming the light scattering layer. The coloration inhibitor may be of one kind or of two or more kinds. In a case where the curable compounds are of two or more kinds thereof, the total amount thereof preferably falls within the range.

<<Ultraviolet Absorber>>

The composition for forming a light scattering layer can contain an ultraviolet absorber. An ultraviolet absorber is preferably a conjugated diene-based compound, and more preferably a compound represented by Formula (I).

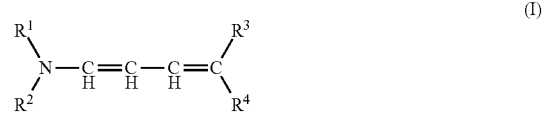

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, but do not represent a hydrogen atom at the same time in any case.

Each of $R^3$ and $R^4$ independently represents an electron-withdrawing group. R3 and R4 are preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, and a sulfamoyl group. Further, $R^3$ and $R^4$ may be bonded to each other to form a cyclic electron withdrawing group. As the cyclic electron withdrawing group which $R^3$ and $R^4$ mutually bond and form, the 6-membered ring containing two carbonyl groups can be exemplified, for example.

With regard to the descriptions of the substituent of the ultraviolet absorber represented by Formula (I), reference can be made to paragraph Nos. 0024 to 0033 of WO2009/123109A (paragraph Nos. 0040 to 0059 of the corresponding US2011/0039195A), the contents of which are incorporated herein by reference. With regard to specific preferred examples of the compound represented by Formula (I), reference can be made to the exemplary compounds (1) to (14) in paragraph Nos. 0034 to 0037 of WO2009/123109A (paragraph No. 0060 of the corresponding US2011/0039195A), the contents of which are incorporated herein by reference. Specific examples of the ultraviolet absorber represented by Formula (I) include the following compound.

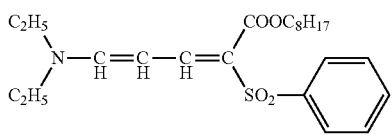

From the viewpoints of a pattern shape and solvent resistance, the content of the ultraviolet absorber is preferably 0.1% to 10% by mass, more preferably 0.1% to 7% by mass, particularly preferably 0.1% to 5% by mass, and still more preferably 0.1% to 3% by mass, with respect to the total solid content of the composition for forming the light scattering layer. Further, in the present invention, the ultraviolet absorber may be of one kind or of two or more kinds thereof. In a case where the curable compounds are of two or more kinds thereof, the total amount thereof preferably falls within the range.

As the ultraviolet absorber, UVINUL A (manufactured by BASF) can also be used. Further, as the ultraviolet absorber, ultraviolet absorbers such as an aminodiene compound, a salicylate compound, a benzophenone compound, a benzotriazole compound, an acrylonitrile compound, and a triazine compound can be used, and specific examples thereof include the compounds described in JP2013-068814A. As the benzotriazole compound, MYUA series (manufactured by Miyoshi Oil & Fat Co., Ltd.; (The Chemical Daily (Kagaku Kogyo Nippo), Feb. 1, 2016) may be used.

<<Adhesive>>

The composition for forming a light scattering layer can contain an adhesive. The adhesive is not particularly limited, and known adhesives can be used. Examples of the adhesive include a silane coupling agent.

In the present invention, the silane coupling agent means a silane compound having a hydrolyzable group and other functional groups. Further, the hydrolyzable group refers to a substituent which can be directly linked to a silicon atom to generate a siloxane bond by at least one of a hydrolysis reaction or a condensation reaction. Examples of the hydrolyzable group include a halogen atom, an alkoxy group, and an acyloxy group, with the alkoxy group being preferable. That is, the silane coupling agent is preferably a compound having an alkoxysilyl group. Further, a functional group other than the hydrolyzable group preferably has a group which interacts with a resin or forms a bond, and thus, exhibits affinity. Examples thereof include a (meth)acryloyl group, a phenyl group, a mercapto group, an epoxy group, and an oxetanyl group, with the (meth)acryloyl group and the epoxy group being preferable. That is, the silane coupling agent is preferably a compound having at least one of an alkoxysilyl group, a (meth)acryloyl group, or an epoxy group. The number of carbon atoms of the alkoxy groups in the alkoxysilyl group is preferably 1 to 5, more preferably 1 to 3, and particularly preferably 1 or 2. The number of alkoxysilyl groups contained in the same molecule is preferably 2 or more, and more preferably 2 or 3. Moreover, as the silane coupling agent, the followings can be used: a compound described in paragraphs Nos. 0018 to 0036 of JP2009-288703A, a compound described in paragraphs Nos. 0056 to 0066 of JP2009-242604A, a compound described in paragraphs Nos. 0011 to 0037 of JP2009-288703A, and the contents of which are incorporated herein by reference.

The content of the adhesive is preferably 0.01% to 10% by mass, more preferably 0.1% to 7% by mass, and particularly preferably 1% to 5% by mass, with respect to the total solid content of the composition for forming the light scattering layer. The content within these ranges is preferable from the viewpoints of adhesiveness and defects. Further, in the present invention, the adhesive contained in the composition may be of one kind or of two or more kinds. In a case where the curable compounds are of two or more kinds thereof, the total amount thereof preferably falls within the range.

<<Chain Transfer Agent>>

The composition for forming a light scattering layer can contain a chain transfer agent. Examples of the chain transfer agent include an alkyl N,N-dialkylaminobenzoate ester and a thiol compound, with the thiol compound being preferable. As the chain transfer agent, the thiol compound is preferably a compound having 2 or more (preferably 2 to 8, and more preferably 3 to 6) mercapto groups in the molecule thereof. Specific examples of the thiol compound include a heterocycle-containing thiol compound such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6 (1H,3H, 5H)-trione, and an aliphatic thiol compound such as pentaerythritoltetrakis(3-mercaptobutyrate) and 1,4-bis(3-mercaptobutyryloxy)butane. Furthermore, examples of the commercially available product of the chain transfer agent include PEMP (manufactured by SC Organic Chemical Co., Ltd., thiol compound), SANCELER M (manufactured by Sanshin Chemical Industry Co., Ltd., thiol compound), and KARENZ MT BD1 (manufactured by Showa Denko K. K., a thiol compound). Moreover, it is also preferable to use the compound of the following structure.

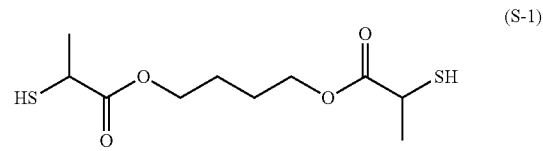

(S-1)

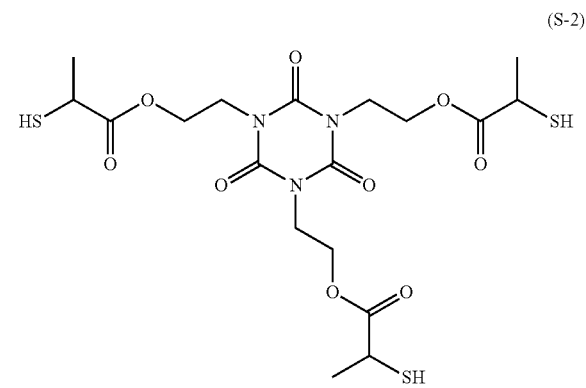

(S-2)

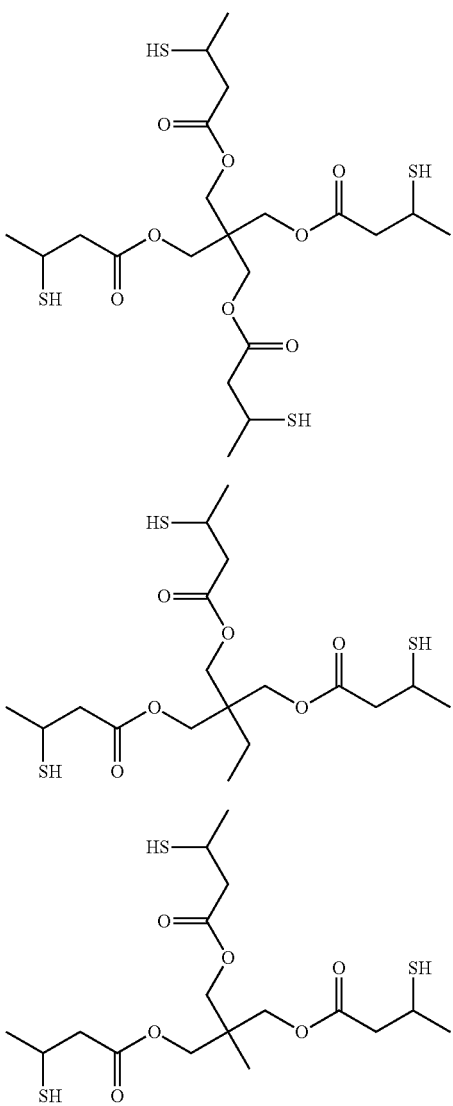

(S-3)
(S-4)
(S-5)

The content of the chain transfer agent is preferably 0.2% to 5.0% by mass, and more preferably 0.4% to 3.0% by mass, with respect to the total solid content of the composition for forming the light scattering layer. Further, the content of the chain transfer agent is preferably 1 to 40 parts by mass, and more preferably 2 to 20 parts by mass, with respect to 100 parts by mass of the polymerizable compound. The chain transfer agent may be of one kind or of two or more kinds thereof. In a case where the curable compounds are of two or more kinds thereof, the total amount thereof preferably falls within the range.

<<Sensitizer>>

The composition for forming a light scattering layer may contain a sensitizer for the purposes of improving radical generation efficiency of the photopolymerization initiator, and shifting the sensitive wavelength to a longer wavelength. The sensitizer preferably sensitizes the photopolymerization initiator by the electron transfer mechanism or the energy transfer mechanism. Examples of the sensitizer include a compound having a maximum absorption wavelength in the wavelength region of 300 to 450 nm. Specifically, reference can be made to the descriptions in paragraph Nos. 0231 to 0253 of JP2010-106268A (paragraph Nos. 0256 to 0273 of the corresponding US2011/0124824A), the contents of which are incorporated herein by reference.

The content of the sensitizer is preferably 0.1% to 20% by mass, and more preferably 0.5% to 15% by mass, with respect to the total solid content of the composition for forming the light scattering layer. The sensitizer may be of one kind or of two or more kinds thereof. In a case where the curable compounds are of two or more kinds thereof, the total amount thereof preferably falls within the range.

<<Co-Sensitizer>>

It is also preferable that the composition for forming a light scattering layer further contains a co-sensitizer. The co-sensitizer has functions of further improving the sensitivity of a photopolymerization initiator or a sensitizer to active radiation, suppressing the polymerization inhibition of the polymerizable compound due to oxygen, and the like. With regard to the co-sensitizer, specifically, reference can be made to the descriptions in paragraph Nos. 0254 to 0257 of JP2010-106268A (paragraph Nos. 0277 to 0279 of the corresponding US2011/0124824A), the contents of which are incorporated herein by reference.

From the viewpoint of increasing the polymerization growth rate and the curing rate, the content of the co-sensitizer is preferably 0.1% to 30% by mass, more preferably 1% to 25% by mass, and still more preferably 1.5% to 20% by mass, with respect to the total solid content of the composition for forming the light scattering layer. The co-sensitizer may be of one kind or of two or more kinds thereof. In a case where the curable compounds are of two or more kinds thereof, the total amount thereof preferably falls within the range.

<<Surfactant>>

From the viewpoint of further improving coatability, various surfactants may be incorporated into the composition for forming a light scattering layer. As the surfactant, various surfactants such as a fluorine-based surfactant, a nonionic surfactant, a cationic surfactant, an anionic surfactant, and a silicon-based surfactant can be used.

By incorporating a fluorine-based surfactant into the composition for forming the light scattering layer, liquid characteristics (in particular, fluidity) in a case of preparation of a coating liquid using the composition are further improved, and thus, the evenness of coating thickness or a liquid saving property can be further improved. That is, in a case where a film is formed using a coating liquid to which a composition containing a fluorine-based surfactant has been applied, the interface tension between a surface to be coated and the coating liquid is reduced to improve wettability with respect to the surface to be coated, and enhance coatability with respect to the surface to be coated. Thus, a film with an even thickness which exhibits a small extent of thickness unevenness can be more suitably formed.

The fluorine content in the fluorine-based surfactant is preferably 3% to 40% by mass, more preferably 5% to 30% by mass, and particularly preferably 7% to 25% by mass. The fluorine-based surfactant having a fluorine content which falls within the above-mentioned range is effective in terms of the thickness evenness of the coating film and the liquid saving property, and the solubility in the composition is also good.

Specific examples of the fluorine-based surfactant include the surfactants described in paragraph Nos. 0060 to 0064 of JP2014-041318A (paragraph Nos. 0060 to 0064 of the pamphlet of the corresponding WO2014/017669A) and the like, and the surfactants described in paragraph Nos. 0117 to 0132 of JP2011-132503A, and the contents of the publications are incorporated herein by reference. Examples of a commercially available product of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all manufactured by ASAHI GLASS Co., Ltd.), and PolyFox PF636, PF656, PF6320, PF6520, and PF7002 (manufactured by OMNOVA Solutions Inc.).

In addition, as the fluorine-based surfactant, an acrylic compound which is a molecular structure having a functional group containing a fluorine atom, in which upon application of heat thereto, the functional group is cut and the fluorine atom is volatilized, can also be suitably used. Examples of such a fluorine-based surfactant include MEGAFACE DS series (manufactured by DIC Corporation, The Chemical Daily (Kagaku Kogyo Nippo), Feb. 22, 2016) (Nikkei Business Daily, Feb. 23, 2016), for example, MEGAFACE DS-21, which can be used.

As the fluorine-based surfactant, a block polymer can also be used. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also preferably used. The following compounds are also exemplified as a fluorine-based surfactant for use in the present invention.

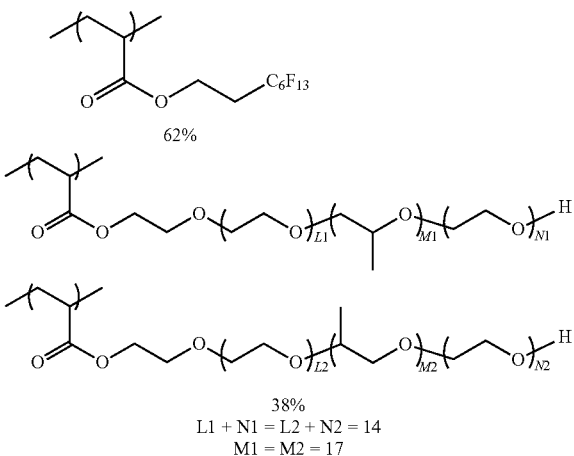

The weight-average molecular weight of the compounds is preferably 3,000 to 50,000, and is, for example, 14,000. % expressing the proportions of repeating units is % by mole.

Furthermore, for the fluorine-based surfactant, a fluorine-containing polymer having an ethylenically unsaturated group in a side chain can also be used. Specific examples thereof include the compounds described in paragraph Nos. 0050 to 0090 and paragraph Nos. 0289 to 0295 of JP2010-164965A, such as MEGAFACE RS-101, RS-102, RS-718K, and RS-72-K, all manufactured by DIC Corporation. For the fluorine-based surfactant, the compounds described in paragraph Nos. 0015 to 0158 of JP2015-117327A can also be used.

Examples of the silicon-based surfactant include SILICONE DC3PA, SILICONE SH7PA, SILICONE DC11PA, SILICONE SH21PA, SILICONE SH28PA, SILICONE SH29PA, SILICONE SH30PA, and SILICONE SH8400 (all manufactured by Toray Dow Corning Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The surfactant may be used singly or in combination of two or more kinds thereof. The content of the surfactant is preferably 0.001% by mass to 2.0% by mass, and more preferably 0.005% to 1.0% by mass, with respect to the total solid content of the composition for forming the light scattering layer.

<<Other Additives>>

The composition for forming a light scattering layer may contain known additives such as a plasticizer and a sensitizer. Examples of the plasticizer include dioctyl phthalate, didodecyl phthalate, triethylene glycol dicaprylate, dimethyl glycol phthalate, tricresyl phosphate, dioctyl adipate, dibutyl sebacate, and tryacetyl glycerin. The content of the plasticizer is preferably 10% by mass or less with respect to the total amount of the polymerizable compound and the resin.

In addition, the composition for forming a light-scattering layer related to the present invention described above can also be used for light-scattering layer formation uses other than the structure of the embodiment of the present invention. For example, the composition for forming a light scattering layer may be used to form a light diffusion layer on the light path of an optical sensor (in particular, the optical sensor for detecting the light other than visible light such as ultraviolet light and the near-infrared ray). By forming the light diffusion layer on the light path of the optical sensor, for example, the dependence on the incidence angle in each wavelength can be reduced, and intensity of the incidence ray can be made uniform in any angle, thereby more appropriate sensing performance can be obtained. In particular, it is suitably used for a multispectral optical sensor having many types of incidence ray.

In addition, the light diffusion layer may be formed on the light emitting element using the composition for forming the light scattering layer. By forming the light diffusion layer on the light emitting element, for example, it becomes possible to make the light source a plane light source with uniform intensity, and suitable as a sensor light source used for use such as authentication where information is required for the plane.

In a case where the composition for forming the light scattering layer according to the present invention is used for the above-mentioned use, it is desirable to appropriately adjust the pigment particle diameter and the like in the composition for forming the light scattering layer according to the wavelength to be scattered.

<Composition for Forming Colored layer>

Next, the composition (composition for a colored layer formation) which can be preferably used for formation of the colored layer in the structure of the embodiment of the present invention is described. The composition for forming the colored layer preferably includes a chromatic coloring agent. The chromatic coloring agent may be either a pigment or a dye. The details of the chromatic coloring agent include those described above. The content of the chromatic coloring agent is preferably 0.1% to 70% by mass with respect to the total solid content of the composition for forming the colored layer. The lower limit is preferably 0.5% by mass or more, and more preferably 1.0% by mass or more. The upper limit is preferably 60% by mass or less, and more preferably 50% by mass or less.

The composition for forming the colored layer may further include additives such as a resin, a curable compound, a polymerization initiator, a solvent, a surfactant, a polymerization inhibitor, an ultraviolet absorber, a coloration inhibitor, an adhesive, a chain transfer agent, a sensitizer and a coagent and the like. Regarding these details, the above-mentioned material used for the composition for forming a light-scattering layer described above is included, and a preferred range thereof is also the same. The preferable content of these materials is also the same as the content in the composition for forming the light scattering layer.

<Composition for Forming Transparent Layer>

Next, a composition (composition for forming a transparent layer) which can be preferably used for formation of a transparent layer in the structure of the embodiment of the present invention is described. The composition for forming a transparent layer preferably contains a resin. As a resin, the above-mentioned material used for a composition for forming a light scattering layer described above can be exemplified, and preferable range is also the same. The preferable content of the resin is also the same as the content in the composition for forming the light scattering layer. The composition for forming the transparent layer can also contain oxide particles (also referred to as inorganic particles) further including at least one element selected from Ti, Zr, Sn, Sb, Cu, Fe, Mn, Pb, Cd, As, Cr, Hg, Zn, Al, Mg, Si, P, or S. In a case where the above-mentioned inorganic particles are contained, the content of the inorganic particles is preferably 20 to 70% by mass with respect to the solid content of the composition for forming the transparent layer. The lower limit is preferably 25% by mass or more, and more preferably 30% by mass or more. The upper limit is more preferably 65% by mass or less, and still more preferably 60% by mass or less. The composition for forming the transparent layer may further include additives such as a resin, a curable compound, a polymerization initiator, a solvent, a surfactant, a polymerization inhibitor, an ultraviolet light absorber, a coloration inhibitor, an adhesive, a chain transfer agent, a sensitizer and a coagent and the like. Regarding these details, the above-mentioned material used for the composition for forming a light-scattering layer described above is included, and a preferred range thereof is also the same. The preferable content of these materials is also the same as the content in the composition for forming the light scattering layer.

<Composition for Forming Near-Infrared Transmission Layer>

Next, the composition for the near-infrared transmission layer formation which can be preferably used for formation of the near-infrared transmission layer in the structure of the embodiment of the present invention is described. In the composition for forming the near-infrared transmission layer, A min/B max which is the ratio of the minimum value A min of absorbance in the wavelength range of 400 to 640 nm and the maximum value B max of absorbance in the range of wavelength 1100 to 1300 nm, is preferably 5 or more and preferably 7.5 or more, more preferably 15 or more, and still more preferably 30 or more.

In the composition for forming the near-infrared transmission layer, the condition of the above-mentioned absorbance can be suitably achieved, for example, by adjusting the kind of a light-cutting material described below and the content thereof.

The absorbance $A\lambda$ at a certain wavelength $\lambda$, is defined by the following equation (1).

$$A\lambda = -\log(T\lambda/100) \qquad (1)$$

$A\lambda$ is the absorbance at wavelength $\lambda$, and $T\lambda$, is the transmittance (%) at wavelength $\lambda$.

In the present invention, the value of absorbance may be a value measured in the state of a solution, or may be a value of a film formed using a composition. In the case of measuring the absorbance in the state of a film, it is preferable to coat the composition on a glass substrate by a method such as spin coating such that the thickness of the film after drying becomes a predetermined thickness and to measure using a film prepared by drying at 100° C. for 120 seconds by using a hot plate. The thickness of the film can be measured using a stylus profilometer (DEKTAK150 manufactured by ULVAC, Inc.) on a substrate having the film.

Also, the absorbance can be measured using a conventionally known spectrophotometer. The measurement conditions of the absorbance are not particularly limited, it is preferable to measure the maximum value B of the absorbance in the wavelength range of 1100 to 1300 nm under the conditions of adjusting such that the minimum value A of the absorbance in the wavelength range of 400 to 640 nm is 0.1 to 3.0. The measurement error can be further reduced by measuring the absorbance under such conditions. The method of adjusting the minimum value A of the absorbance in the wavelength range of 400 to 640 nm to be 0.1 to 3.0 is not particularly limited. For example, in the case of measuring the absorbance in the state of the composition, there is a method of adjusting the light path length of the sample cell. Moreover, in the case of measuring the absorbance in the state of the film, the method of adjusting a film thickness, and the like can be exemplified.

The composition for forming the near-infrared transmission layer preferably contains the light-cutting material. The light-cutting material is preferably a coloring material that absorbs light in the violet to a red wavelength region. The light-cutting material is preferably the color material that cuts light in a wavelength region of 400 to 640 nm. In addition, the light-cutting material is preferably a color material that transmits light of a wavelength of 1100 to 1300 nm. The light-cutting material preferably satisfies at least one requirement of the following (A) or (B).

(1): A black color is formed by a combination of two or more the chromatic coloring agent, including two or more the chromatic coloring agent.

(2): Contains an organic black coloring agent. In the aspect of (2), it is also preferable to further contain the chromatic coloring agent.

It is preferable that the light-cutting material has an AB ratio in which the minimum value A of the absorbance in the wavelength range of 400 to 640 nm and the minimum value B of the absorbance in the range of wavelength 1100 to 1300 nm is 4.5 or more. The above characteristics may be satisfied by one type of material, or may be satisfied by combination of a plurality of materials. For example, in the case of the above aspect (1), it is preferable that a plurality of chromatic coloring agents are combined to satisfy the above-mentioned spectral characteristics. Moreover, in the case of the aspect of the above described (2), the organic type black coloring agent may satisfy spectral characteristics described above. Further, the above-mentioned spectral characteristics may be satisfied by a combination of the organic black coloring agent and the chromatic coloring agent.

The light-cutting material preferably contains two or more selected from a red coloring agent, a blue coloring agent, a yellow coloring agent, a purple coloring agent and a green coloring agent. That is, the light-cutting material preferably forms a black color by a combination of two or more types of coloring agents selected from the red coloring agent, the blue coloring agent, the yellow coloring agent, the purple coloring agent and the green coloring agent. Examples of preferable combinations include the following.

(1) An aspect containing the red coloring agent and the blue coloring agent.

(2) An aspect containing the red coloring agent, the blue coloring agent, and the yellow coloring agent.

(3) An aspect containing the red coloring agent, the blue coloring agent, the yellow coloring agent, and the purple coloring agent.

(4) An aspect containing the red coloring agent, the blue coloring agent, the yellow coloring agent, the purple coloring agent, and the green coloring agent.

(5) An aspect containing the red coloring agent, the blue coloring agent, the yellow coloring agent, and the green coloring agent.

(6) An aspect containing the red coloring agent, the blue coloring agent, and the green coloring agent.

(7) An aspect containing the yellow coloring agent and the purple coloring agent.

In the aspect of the above (1), the mass ratio of the red coloring agent and the blue coloring agent is preferably the red coloring agent: the blue coloring agent=20 to 80: 20 to 80, more preferably 20 to 60: 40 to 80, and still more preferably 20 to 50:50 to 80.

In the aspect of the above (2), the mass ratio of the red coloring agent, the blue coloring agent and the yellow coloring agent is preferably the red coloring agent: the blue coloring agent: the yellow coloring agent=10 to 80: 20 to 80: 10 to 40, more preferably 10 to 60: 30 to 80: 10 to 30, and still more preferably 10 to 40: 40 to 80: 10 to 20.

In the aspect of the above (3), the mass ratio between the red coloring agent, the blue coloring agent, the yellow coloring agent and the purple coloring agent is preferably the red coloring agent: the blue coloring agent: the yellow coloring agent: the purple coloring agent=10 to 80: 20 to 80: 5 to 40: 5 to 40, more preferably 10 to 60: 30 to 80: 5 to 30: 5 to 30, and still more preferably 10 to 40: 40 to 80: 5 to 20: 5 to 20.

In the aspect of the above (4), the mass ratio of the red coloring agent, the blue coloring agent, the yellow coloring agent, the purple coloring agent and the green coloring agent is preferably the red coloring agent: the blue coloring agent: the yellow coloring agent: the purple coloring agent: the green coloring agent=10 to 80: 20 to 80: 5 to 40: 5 to 40: 5 to 40, more preferably 10 to 60:30 to 80: 5 to 30: 5 to 30: 5 to 30, and still more preferably 10 to 40: 40 to 80: 5 to 20: 5 to 20: 5 to 20.

In the aspect of the above (5), the mass ratio of the red coloring agent, the blue coloring agent, the yellow coloring agent and the green coloring agent is preferably the red coloring agent: the blue coloring agent: the yellow coloring agent: the green coloring agent=10 to 80: 20 to 80: 5 to 40: 5 to 40, more preferably 10 to 60: 30 to 80: 5 to 30: 5 to 30, and still more preferably 10 to 40: 40 to 80: 5 to 20: 5 to 20.

In the aspect of the above (6), mass ratio of a red coloring agent, the blue coloring agent, and the green coloring agent is preferably the red coloring agent: the blue coloring agent: the green coloring agent=10 to 80: 20 to 80: 10 to 40, more preferably 10 to 60: 30 to 80: 10 to 30, and still more preferably 10 to 40: 40 to 80: 10 to 20.

In the aspect of the above (7), the mass ratio of the yellow coloring agent to the purple coloring agent is preferably the yellow coloring agent: the purple coloring agent=10 to 50: 40 to 80, more preferably 20 to 40: 50 to 70, and still more preferably 30 to 40: 60 to 70.

As the yellow coloring agent, C.I. Pigment Yellow 139, 150, 185 is preferable, and C.I. Pigment Yellow 139, 150 is more preferable and C.I. Pigment Yellow 139 is still more preferable. As the blue coloring agent, C.I. Pigment Blue 15: 6 is preferable. As the purple coloring agent, C.I. Pigment Violet 23 is preferable. As the red coloring agent, Pigment Red 122, 177, 224, and 254 is preferable, Pigment Red 122, 177, and 254 is more preferable, and Pigment Red 254 is still more preferable. As the green coloring agent, C.I. Pigment Green 7, 36, 58, 59 is preferable.

In the present invention, in a case where the organic black coloring agent is used as the light-cutting material, it is preferable to use in combination with the chromatic coloring agent. By using the organic black coloring agent and the chromatic coloring agent in combination, excellent spectral characteristics can be easily obtained. Examples of the chromatic coloring agent used in combination with the organic black coloring agent include the red coloring agent, the blue coloring agent, the purple coloring agent and the like, and the red coloring agent and the blue coloring agent are preferable. The components may be used singly or in combination of two or more kinds. The mixing ratio of the chromatic coloring agent and the organic black coloring agent is preferable in which the chromatic coloring agent is preferably 10 to 200 parts by mass, and more preferably 15 to 150 parts by mass, with respect to 100 parts by mass of the organic black coloring agent.

In the present invention, the content of the pigment in the light-cutting material is preferably 95% by mass or more, more preferably 97% by mass or more, and still more preferably 99% by mass or more with respect to the total amount of the light-cutting material.

In the composition for forming the near-infrared transmission layer, the content of the light-cutting material is preferably 5 to 50% by mass with respect to the solid content of the composition for forming the near-infrared transmission layer. The lower limit is preferably 9% by mass or more, and more preferably 13% by mass or more. The upper limit is preferably 40% by mass or less, and more preferably 30% by mass or less.

The composition for forming the near-infrared transmission layer can further contain the near-infrared absorber. In the composition for forming the near-infrared transmission layer, the near-infrared absorber has a role of limiting transmitted light (near-infrared ray) on a longer wavelength side. As the near-infrared absorber, the near-infrared absorber described in the near-infrared cutting layer described above is included, a preferred range is also the same. In a case where the composition for forming the infrared transmission layer contains the near-infrared absorber, the content of the near-infrared absorber is preferably 1 to 30% by mass with respect to the solid content of the composition for forming the near-infrared transmission layer. The upper limit is preferably 20% by mass or less, and more preferably 10% by mass or less. The lower limit is preferably 3% by mass or more, and more preferably 5% by mass or more. The total amount of the near-infrared absorber and the light-cutting material is preferably 10 to 70% by mass of the solid content of the composition for forming the near-infrared transmission layer. The lower limit is preferably 20% by mass or more, and more preferably 25% by mass or more. In addition, the content of the near-infrared absorber in the total amount of the near-infrared absorber and the light-cutting material is preferably 5 to 40% by mass. The upper limit is preferably 30% by mass or less, and more preferably 25% by mass or less. The lower limit is preferably 10% by mass or more, and more preferably 15% by mass or more.

The composition for forming the near-infrared transmission layer may further include additives such as a resin, a curable compound, a polymerization initiator, a solvent, a surfactant, a polymerization inhibitor, an ultraviolet light absorber, a coloration inhibitor, an adhesive, a chain transfer agent, a sensitizer, a coagent, and the like. Regarding these details, the above-mentioned material used for the composition for forming a light-scattering layer described above is included, and a preferred range thereof is also the same. The preferable content of these materials is also the same as the content in the composition for forming the light scattering layer.

<Composition for Forming Near-Infrared Cutting Layer>

Next, a composition (composition for forming a near-infrared cutting layer) which can be preferably used for formation of the near-infrared cutting layer configured with a layer containing a near-infrared absorber in the structure of the embodiment of the present invention will be described. The composition for forming the near-infrared cutting layer contains the near-infrared absorber. Examples of the near-infrared absorber include a compound having a maximum absorption wavelength in the wavelength range of 700 to 1,500 nm. With regard to the details of the near-infrared absorber, reference can be made to the above-mentioned materials, and a preferred range thereof is also the same. The content of the near-infrared absorber can be appropriately adjusted depending on the types of the near-infrared absorber. For example, the content is preferably 10% to 50% by mass, and more preferably 20% to 40% by mass, with respect to the solid content of the composition for forming the near-infrared cutting layer. Further, for example, in a case of the tungsten oxide containing an alkali metal, the content is preferably 10% to 50% by mass, and more preferably 20% to 40% by mass, with respect to the total solid content of the composition for forming the near-infrared cutting layer. Incidentally, in a case of an organic colorant such as a pyrrolopyrrole compound, a cyanine compound, a phthalocyanine compound, a tetraazaporphyrin compound, a diimmonium compound, and a squarylium compound, the content is preferably 10% to 50% by mass, and more preferably 20% to 40% by mass, with respect to the total solid content of the composition for forming the near-infrared cutting layer. In addition, in a case of the copper complex, the content is preferably 10% to 50% by mass, and more preferably 20% to 40% by mass, with respect to the total solid content of the composition for forming the near-infrared cutting layer.

The composition for forming the near-infrared cutting layer may further include additives such as a resin, a curable compound, a polymerization initiator, a solvent, a surfactant, a polymerization inhibitor, an ultraviolet light absorber, a coloration inhibitor, an adhesive, a chain transfer agent, a sensitizer, a coagent, and the like. Regarding these details, the above-mentioned material used for the composition for forming a light-scattering layer described above is included, and a preferred range thereof is also the same. The preferable content of these materials is also the same as the content in the composition for forming the light scattering layer.

<Composition for Forming Ultraviolet Cutting Layer>

Next, a composition for forming an ultraviolet cutting layer which can be preferably used for forming the ultraviolet cutting layer will be described. The composition for forming the ultraviolet cutting layer preferably contains an ultraviolet absorber. Examples of the ultraviolet absorber include the materials described above. The content of the ultraviolet absorber is preferably 0.01 to 10% by mass, and more preferably 0.01 to 5% by mass, with respect to the total solid content of the composition for forming the ultraviolet cutting layer.

The composition for forming the ultraviolet cutting layer may further include additives such as a resin, a curable compound, a polymerization initiator, a solvent, a surfactant, a polymerization inhibitor, an ultraviolet light absorber, a coloration inhibitor, an adhesive, a chain transfer agent, a sensitizer, a coagent, and the like. Regarding these details, the above-mentioned material used for the composition for forming a light-scattering layer described above is included, and a preferred range thereof is also the same. The preferable content of these materials is also the same as the content in the composition for forming the light scattering layer.

<Accommodating Container of Composition>

There is no limitation in particular, known accommodating containers can be used as an accommodating container of each composition described above. In addition, as the accommodating container, for the purpose of suppressing the mixing of impurities into the raw materials and the composition, it is preferable to use a multilayer bottle in which the inner wall of the container is configured with six types and six layers of resin, or to use a bottle in which the inner wall of the container is configured with six types and seven layers of resin. As such a container, for example, the container described in JP2015-123351A can be exemplified.

<Method of Preparing Composition>

The composition described above can be prepared by mixing the above-mentioned components. At the time of preparation of the composition, the composition may be prepared by dissolving or dispersing all the components simultaneously in a solvent, or, as desired, may be also prepared as the components by preparing two or more solutions or dispersion liquid in which the respective components are appropriately blended in advance to mix them at the time of use (at the time of application).

<Method for Producing Structure>

The structure of the embodiment of the present invention can be produced through the steps of forming a first optical filter layer, forming a second optical filter layer, and forming a light scattering layer. The formation order of each layer is not particularly limited. For example, an aspect that forms each layer in the order of the first optical filter layer, the second optical filter layer, and the light scattering layer, an aspect that forms each layer in the order of the second optical filter layer, the first optical filter layer, and the light scattering layer, an aspect that forms each layer in the order of the light scattering layer, the first optical filter layer, and the second optical filter layer, and an aspect that forms each layer in the order of the light scattering layer, the second optical filter layer, and the first optical filter layer can be exemplified. Among them, an aspect in which each layer is formed in the order of the first optical filter layer, the second optical filter layer, and the light scattering layer is preferable from the viewpoint of coating suitability and processing suitability. In addition, the first optical filter layer and the second optical filter layer may be formed simultaneously. Moreover, the process of forming the near-infrared cutting layer may be included.

Each layer in the structure of the embodiment of the present invention can be manufactured through a step of forming the composition layer by applying the composition forming each layer to the support or the like, a step of drying the composition layer, and the like. A step of forming a pattern may further be included.

As the method of applying the composition, known methods can be used. Examples thereof include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as a discharge system printing such as ink jet (for example, an on-demand mode, a piezo mode, and a thermal mode), and nozzle jet, flexographic printing, screen printing, gravure printing, reverse offset printing, and metal mask printing; a transfer method using a mold or the like; and a nanoimprint method. Examples of the application method employing ink-jet include the method (in particular, pp. 115 to 133) described in "Extension of Use of Injector-Infinite Possibilities in Patent-" (February, 2005, S.B. Research Co., Ltd.) and the methods described in JP2003-262716A, JP2003-185831A, JP2003-261827A, JP2012-126830A, JP2006-169325A, and the like.

In the step of drying the composition layer, it is preferable that the drying conditions vary depending on the types or blend amounts of the respective components, and the like. The drying conditions are preferably as follows: the temperature is 60° C. to 150° C., and the time is 30 seconds to 15 minutes.

The composition layer after drying may be further subjected to a step of forming a pattern, as desired. Examples of the pattern formation method include a pattern formation method using a photolithography and a pattern formation method using a dry etching method. Examples of the pattern forming method using the photolithography include a method including a step of pattern shape exposing the composition layer and a step of removing the unexposed area by development to form a pattern. Moreover, as a pattern formation method by the dry etching method, it is preferable to include the step of curing the composition layer to form a cured product layer, the step of forming a photoresist layer on the cured product layer, the step of obtaining a resist pattern by patterning the photoresist layer by exposing and developing, and the step of forming a pattern by dry etching the cured product layer using the resist pattern as an etching mask.

In the case of forming a pattern by photolithography, the composition layer is then patternwise exposed. For example, the composition layer can be exposed to a pattern shape by exposing the composition layer through a mask having a predetermined mask pattern using an exposure device such as a stepper. Thus, the exposed area can be cured. As the radiation (light) which can be used during the exposure, ultraviolet rays such as g-rays and i-rays (particularly preferably i-rays) are preferably used. For example, the irradiation dose (exposure dose) is preferably 0.03 to 2.5 J/cm$^2$, and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume or less, 5% by volume or less, and in particular, substantially oxygen-free) or in a high-oxygen atmosphere having an oxygen concentration of more than 21% by volume (for example, 22% by volume or more, further, 30% by volume or more, and in particular, 50% by volume or more), other than under the atmosphere. Further, the exposure illuminance can be appropriately set, and can be usually selected from the range of 1,000 W/m$^2$ to 100,000 W/m$^2$ (for example, 5,000 W/m$^2$ or more, further, 15,000 W/m$^2$ or more, and in particular, 35,000 W/m$^2$ or more). The oxygen concentration and the exposure illuminance may be appropriately combined with conditions, for example, the illuminance may be 10,000 W/m$^2$ at an oxygen concentration of 10% by volume, and may be 20,000 W/m$^2$ at an oxygen concentration of 35% by volume.

Next, the unexposed area is removed by development to form a pattern. The removal of the unexposed area by development can be carried out using a developer. Thus, the composition layer of the unexposed area is eluted into the developer, and as a result, only a photocured portion remains. As the developer, an alkali developer causing no damage on an underlying circuit or the like is preferable. As the developer, a solvent described in the present specification may also be used to perform development. The temperature of the developer is preferably, for example, 20° C. to 30° C. The development time is preferably 20 to 180 seconds, and more preferably 20 to 90 seconds.

As a developer, an alkaline aqueous solution obtained by diluting an alkaline agent with pure water is preferably used. For example, organic alkaline compounds such as aqueous ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis (2-hydroxyethyl) ammonium hydroxide, choline, pyrrole, piperidine, 1,8-diazabicyclo [5.4.0]-7-undecen, and the like, and inorganic alkaline compounds such as sodium hydroxide, potassium hydroxide, sodium carbonate, sodium hydrogen carbonate, sodium silicate, and sodium metasilicate can be exemplified. As the alkaline agent, a compound having a large molecular weight is preferable in terms of environment and safety. The concentration of the alkaline agent in the alkaline aqueous solution is preferably 0.001 to 10% by mass, and more preferably 0.01 to 1% by mass. Furthermore, a surfactant may also be included in the developer. Examples of the surfactant include the surfactant described in the compositions described above. The developer may be prepared once as a concentrate liquid and diluted to a concentration required for use, from the viewpoint of transportation and storage convenience. The dilution ratio is not particularly limited, and can be set, for example, in the range of 1.5 to 100 times. Incidentally, in a case where a developer formed of such an aqueous alkaline solution is used, it is preferable that washing (rinsing) with pure water is performed after development.

After development, at least one of heating (post bake) or exposure may further be carried out. According to this aspect, curing of the film can further be performed to produce the film which has been more rigidly cured. In a case where post-baking is performed, the heating temperature is preferably 100° C. to 260° C. The lower limit is more preferably 120° C. or higher, and particularly preferably 160° C. or higher. The upper limit is more preferably 240° C. or lower, and particularly preferably 220° C. or lower. In a case where the heating temperature is within the range, a film having excellent strength is easily obtained. The heating time is preferably 1 to 180 minutes. The lower limit is more preferably 3 minutes or more. The upper limit is more preferably 120 minutes or less. A heating device is not particularly limited and can be appropriately selected from well-known devices, and examples thereof include a dry oven, a hot plate, and an infrared heater.

A pattern by the dry etching method can be formed by method that cures the composition layer on the support to form a cured product layer, forms a patterned photoresist layer on the cured product layer, and then, carries out dry etching the patterned photoresist layer using etching gas as a mask with respect to the cured material layer. In formation of the photoresist layer, it is preferable to perform a pre-baking process further. In particular, as a process for forming the photoresist, it is desirable that the heat treatment after exposure and the heat treatment (post-bake treatment) after development are performed. With regard to the pattern formation by the dry etching method, reference can be made to the description in paragraphs Nos. 0010 to 0067 of JP 2013-064993A, the contents of which are incorporated herein by reference.

EXAMPLES

Hereinbelow, the present invention will be specifically described with reference to Examples, but the present invention is not limited to these Examples. In addition, "parts" and "%" are on a mass basis unless otherwise specified.

<Measurement of Weight-Average Molecular Weight (Mw)>

The weight-average molecular weight (Mw) of a resin was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 μL (sample concentration: 0.1% by mass)

Device name: HLC-8220GPC manufactured by Tosoh Corporation

Detector: Refractive index (RI) detector

Calibration curve base resin: Polystyrene

<Method for Measuring Acid Value>

The acid value is a representation of the mass of potassium hydroxide required to neutralize acidic components per gram of the solid content. A measurement sample was dissolved in a mixed solvent of tetrahydrofuran/water=9/1 (mass ratio), and the obtained solution was titration by neutralization with a 0.1 mol/L aqueous sodium hydroxide solution, using a potentiometric titrator (trade name: AT-510, manufactured by Kyoto Denshi K. K.) at 25° C. By using the inflection point in a titration pH curve as a titration end point, an acid value was calculated by the following equation.

$$A = 56.11 \times Vs \times 0.5 \times f/w$$

A: Acid value (mgKOH/g)

Vs: Used amount (mL) of a 0.1-mol/L aqueous sodium hydroxide solution required for titration f: Titer of a 0.1-mol/L aqueous sodium hydroxide solution w: Mass (g) (in terms of a solid content) of a measurement sample <Method for Measuring Amine Value>

The amine value is a representation of the mass of potassium hydroxide (KOH) equivalent to the basic components per gram of the solid content. A measurement sample was dissolved in a mixed solvent of acetic acid, and the obtained solution was titration by neutralization with a 0.1-mol/L perchloric acid/acetic acid solution, using a potentiometric titrator (trade name: AT-510, manufactured by Kyoto Denshi K. K.) at 25° C. By using the inflection point in a titration pH curve as a titration end point, an amine value was calculated by the following equation.

$$B = 56.11 \times Vs \times 0.1 \times f/w$$

B: Amine Value (mgKOH/g)

Vs: Used amount (mL) of a 0.1-mol/L perchloric acid/acetic acid solution required for titration f: Titer of a 0.1-mol/L perchloric acid/acetic acid solution w: Mass (g) (in terms of a solid content) of a measurement sample <Measurement of Average Primary Particle Diameter of White Pigment>

The average primary particle diameter of the white pigment was determined by observing the white pigment with a transmission electron microscope (TEM), and measuring a portion in which the particles of the white pigment were not aggregated (primary particles). Specifically, primary particles of the white pigment were taken using a transmission electron microscope, and then an image treatment was performed with an image treatment device to measure the particle size distribution of the white pigment. As the average primary particle diameter of the white pigment, the arithmetic mean diameter on the basis of the number calculated from the particle size distribution was taken as an average primary particle diameter. An electron microscope (H-7000) manufactured by Hitachi High-Technologies Corporation was used as the transmission electron microscope, and LUZEX AP manufactured by NIRECO Corporation was used as the image treatment device.

<Measurement of Refractive Index of White Pigment>

(Preparing of Dispersion Liquid)

Firstly, dispersion was performed using a white pigment and a resin (dispersant) with a known refractive index, and propylene glycol monomethyl ether acetate (PGMEA). Thereafter, the prepared dispersion liquid and a resin having a known refractive index were mixed to prepare coating liquids having concentrations of the white pigment in the total solid content of the coating liquid of 10% by mass, 20% by mass, 30% by mass, and 40% by mass, respectively. After these coating liquids were used on a silicon wafer to form a film in 300 nm, and then the refractive index of the obtained film was measured using ellipsometry (Lambda Ace RE-3300 (trade name), Dainippon Screen Mfg. Co., Ltd.). Thereafter, by plotting the concentration of the white pigment and the refractive index on a graph, and the refractive index of the white pigment was derived.

<Composition for Forming Light Scattering Layer>

A mixed solution with the raw materials described in the following table was subjected to the dispersion treatment under the following conditions, using Ultra Apex Mill manufactured by Kotobuki Industries Co., Ltd. as a circulation-type dispersing device (beads mill), thereby obtaining a dispersion liquid. After initiating the dispersion, the average particle diameter of the particles was measured every 30 minutes. The average particle diameter of the particles decreased over the dispersion time, but a change amount thereof gradually decreased. At a point of time that the change amount d50 (integrated value 50%) in the particle size distribution has disappeared, dispersion was finished.

Bead diameter: Diameter of 0.2 mm

Bead filling ratio: 65% by volume

Circumferential speed: 6 m/sec

Pump supply amount: 10.8 kg/hour
Cooling water: Tap water
Inner volume of beads mill annular passage: 0.15 L
Amount of mixed liquid to be subjected to dispersion treatment: 0.65 kg

TABLE 1

|  | White pigment | | Dispersant | | Solvent | |
| --- | --- | --- | --- | --- | --- | --- |
|  | Type | Addition amount (parts by mass) | Type | Addition amount (parts by mass) | Type | Addition amount (parts by mass) |
| Dispersion liquid 1 | A-1 | 38.5 | H-1 | 11.5 | PGMEA | 50 |
| Dispersion liquid 2 | A-2 | 38.5 | H-1 | 11.5 | PGMEA | 50 |
| Dispersion liquid 3 | A-3 | 38.5 | H-1 | 11.5 | PGMEA | 50 |
| Dispersion liquid 4 | A-4 | 38.5 | H-1 | 11.5 | PGMEA | 50 |
| Dispersion liquid 5 | A-5 | 38.5 | H-1 | 11.5 | PGMEA | 50 |
| Dispersion liquid 12 | A-12 | 38.5 | H-1 | 11.5 | PGMEA | 50 |
| Dispersion liquid 13 | A-13 | 38.5 | H-1 | 11.5 | PGMEA | 50 |
| Dispersion liquid 14 | A-14 | 38.5 | H-1 | 11.5 | PGMEA | 50 |
| Dispersion liquid 19 | A-4 | 31.3 | H-1 | 18.8 | PGMEA | 50.0 |
| Dispersion liquid 20 | A-4 | 45.5 | H-1 | 4.5 | PGMEA | 50.0 |
| Dispersion liquid 21 | A-4 | 38.5 | H-2 | 11.5 | PGMEA | 50 |
| Dispersion liquid 22 | A-4 | 38.5 | H-3 | 11.5 | PGMEA | 50 |
| Dispersion liquid 23 | A-4 | 38.5 | H-4 | 11.5 | PGMEA | 50 |
| Dispersion liquid 25 | A-20 | 38.5 | H-1 | 11.5 | PGMEA | 50 |
| Dispersion liquid 26 | A-21 | 38.5 | H-1 | 11.5 | PGMEA | 50 |
| Dispersion liquid 27 | A-22 | 38.5 | H-1 | 11.5 | PGMEA | 50 |
| Dispersion liquid 28 | A-23 | 38.5 | H-1 | 11.5 | PGMEA | 50 |
| Dispersion liquid 29 | A-24 | 38.5 | H-1 | 11.5 | PGMEA | 50 |
| Dispersion liquid 30 | A-25 | 38.5 | H-1 | 11.5 | PGMEA | 50 |
| Dispersion liquid 31 | A-26 | 38.5 | H-1 | 11.5 | PGMEA | 50 |
| Dispersion liquid 32 | A-27 | 38.5 | H-1 | 11.5 | PGMEA | 50 |
| Dispersion liquid 33 | A-4 | 38.5 | H-1/H-5 | 9/2.5 | PGMEA Cyclohexanone | 35 15 |
| Dispersion liquid 34 | A-4 | 38.5 | H-1/H-6 | 9/2.5 | PGMEA BDGAC | 35 15 |

(White Pigment)
As the white pigment, the following white pigment was used.

TABLE 2

| | Product name | Material | Surface treating agent | Manufacturer | Average primary particle diameter | Density (g/cm³) | Refractive index |
| --- | --- | --- | --- | --- | --- | --- | --- |
| A-1 | TTO-80A | Titanium oxide | Aluminum hydroxide | Manufactured By Ishihara Sangyo Kaisha, Ltd. | 60 nm | 4.1 | 2.7 |
| A-2 | PT-401M | Titanium oxide | None | Manufactured By Ishihara Sangyo Kaisha, Ltd. | 70 nm | 4.1 | 2.7 |
| A-3 | MPT-140 | Titanium oxide | Aluminum hydroxide | Manufactured By Ishihara Sangyo Kaisha, Ltd. | 74 nm | 4.1 | 2.7 |
| A-4 | MPT-141 | Titanium oxide | Aluminum hydroxide | Manufactured By Ishihara Sangyo Kaisha, Ltd. | 91 nm | 4.1 | 2.7 |
| A-5 | PT-401L | Titanium oxide | None | Manufactured By Ishihara Sangyo Kaisha, Ltd. | 130 nm | 4.1 | 2.7 |
| A-12 | MT-700B | Titanium oxide | None | Manufactured By TAYCA CORPORATION | 80 nm | 4.1 | 2.7 |
| A-13 | MT-700Z | Titanium oxide | Aluminum hydroxide, Stearic acid | Manufactured By TAYCA CORPORATION | 80 nm | 4.1 | 2.7 |
| A-14 | MT-700BS | Titanium oxide | Hydrogen dimethicone | Manufactured By TAYCA CORPORATION | 80 nm | 4.1 | 2.7 |
| A-20 | A-220 | Titanium oxide | Aluminum hydroxide, | Manufactured By Ishihara Sangyo Kaisha, Ltd. | 160 nm | 4.1 | 2.7 |
| A-21 | PT-501R | Titanium oxide | None | Manufactured By Ishihara Sangyo Kaisha, Ltd. | 180 nm | 4.1 | 2.7 |
| A-22 | R-21 | Titanium oxide | Aluminum oxide, silica | Manufactured By Sakai Chemical Industry Co., Ltd. | 200 nm | 4.1 | 2.7 |
| A-23 | R-62N | Titanium oxide | Aluminum oxide, silica | Manufactured By Sakai Chemical Industry Co., Ltd. | 260 nm | 4.1 | 2.7 |
| A-24 | R-45M | Titanium oxide | Aluminum oxide, silica | Manufactured By Sakai Chemical Industry Co., Ltd. | 290 nm | 4.1 | 2.7 |
| A-25 | SW-100 | Strontium titanate | None | Manufactured By Titan Kogyo, Ltd. | 80 nm | 4.8 | 2.4 |
| A-26 | Zincox Super F-1 | Zinc oxide | None | Manufactured By Hakusui Tech Co., Ltd. | 100 nm | 5.6 | 2.0 |
| A-27 | TTO-55C | Titanium oxide | Aluminum hydroxide, stearic acid | Manufactured By Ishihara Sangyo Kaisha, Ltd. | 30 nm to 50 nm | 4.1 | 2.7 |

(Dispersant)

H-1: Solsperse 36000, manufactured by The Lubrizol Corporation

H-2: Solsperse 41000, manufactured by The Lubrizol Corporation

H-3: Resin having the following structure (acid value=32 mgKOH/g and Mw=15,000). The numerical values shown together with the respective repeating units represent the mole ratio of the respective repeating units. The numerical values shown together with the repeating sites of the side chain represent the repetition numbers of the repeating sites.

H-4: Resin having the following structure (acid value=32 mgKOH/g, amine value=45 mgKOH/g, and Mw=15,000). The numerical values shown together with the respective repeating units represent the mole ratio of the respective repeating units. The numerical values shown together with the repeating sites of the side chain represent the repetition numbers of the repeating sites. The wavy line bond represents a cis/trans mixture.

H-5: Light ester P-1M, manufactured by Kyoeisha Chemical Co., Ltd.
H-6: Light ester P-2M, manufactured by Kyoeisha Chemical Co., Ltd.

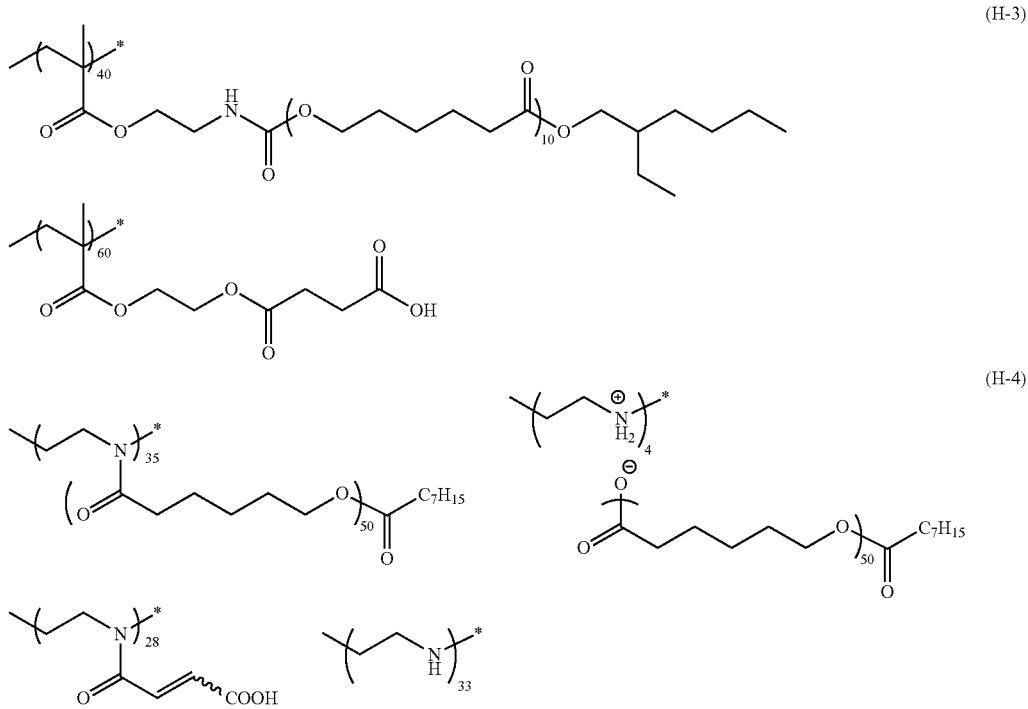

(Solvent)
PGMEA: Propylene glycol monomethyl ether acetate
BDGAC: Butyl diglycol acetate (Preparation of Composition for Forming Light Scattering Layer)

The raw materials described in the following table were mixed to prepare a composition for forming a light scattering layer.

TABLE 3

| | Dispersion liquid | | | Alkali-soluble resin | | Polymerizable compound | | Photopolymerization initiator | |
|---|---|---|---|---|---|---|---|---|---|
| | Type | Parts by Mass | Content of white pigment (% by Mass with respect to total solid content) | Type | Parts by Mass | Type | Parts by Mass | Type | Parts by Mass |
| Composition 1-1 | Dispersion liquid 4 | 52 | 43.1 | C-1 | 8.4 | D-1 | 9.3 | E-1 | 2.8 |
| Composition 1-2 | Dispersion liquid 4 | 52 | 42.8 | C-1 | 8.4 | D-1 | 9.3 | E-1 | 2.8 |
| Composition 1-3 | Dispersion liquid 4 | 52 | 42.8 | C-1 | 8.4 | D-1 | 9.3 | E-1 | 2.8 |
| Composition 1-4 | Dispersion liquid 4 | 52 | 42.8 | C-1 | 8.4 | D-1 | 9.3 | E-1 | 2.8 |
| Composition 1-5 | Dispersion liquid 4 | 52 | 42.8 | C-1 | 8.4 | D-1 | 9.3 | E-1 | 2.8 |
| Composition 1-6 | Dispersion liquid 4 | 52 | 40.9 | C-1 | 8.4 | D-1 | 9.3 | E-1 | 2.8 |
| Composition 1-7 | Dispersion liquid 4 | 52 | 40.9 | C-1 | 8.4 | D-1 | 9.3 | E-1 | 2.8 |
| Composition 1-8 | Dispersion liquid 4 | 52 | 42.7 | C-2 | 8.4 | D-2 | 9.3 | E-1 | 2.8 |
| Composition 1-9 | Dispersion liquid 4 | 52 | 40.6 | C-1 | 8.4 | D-1 | 9.3 | E-1 | 2.8 |
| Composition 1-10 | Dispersion liquid 4 | 52 | 40.6 | C-2 | 8.4 | D-1 | 9.3 | E-1 | 2.8 |
| Composition 1-11 | Dispersion liquid 4 | 52 | 40.6 | C-2 | 8.4 | D-2 | 9.3 | E-1 | 2.8 |
| Composition 1-12 | Dispersion liquid 4 | 52 | 40.6 | C-2 | 8.4 | D-2 | 9.3 | E-2 | 2.8 |
| Composition 1-13 | Dispersion liquid 4 | 52 | 40.6 | C-1/ C-2 | 3.0/ 5.4 | D-1/ D-2 | 2/ 7.3 | E-1/ E-4 | 0.5/ 2.3 |
| Composition 1-14 | Dispersion liquid 4 | 52 | 40.6 | C-2 | 8.4 | D-2 | 9.3 | E-3 | 2.8 |
| Composition 1-15 | Dispersion liquid 1 | 52 | 40.0 | C-2 | 8.4 | D-2 | 9.3 | E-1 | 2.8 |
| Composition 1-16 | Dispersion liquid 2 | 52 | 40.0 | C-2 | 8.4 | D-2 | 9.3 | E-1 | 2.8 |

TABLE 3-continued

| | | | | | | | | | | | |
|---|---|---|---|---|---|---|---|---|---|---|---|
| Composition 1-17 | Dispersion liquid 3 | 52 | 40.0 | C-2 | 8.4 | D-2 | 9.3 | E-1 | 2.8 | | |
| Composition 1-18 | Dispersion liquid 4 | 52 | 40.0 | C-2 | 8.4 | D-2 | 9.3 | E-1 | 2.8 | | |
| Composition 1-19 | Dispersion liquid 5 | 52 | 40.0 | C-2 | 8.4 | D-2 | 9.3 | E-1 | 2.8 | | |
| Composition 1-20 | Dispersion liquid 12 | 52 | 40.0 | C-2 | 8.4 | D-2 | 9.3 | E-1 | 2.8 | | |
| Composition 1-21 | Dispersion liquid 13 | 52 | 40.0 | C-2 | 8.4 | D-2 | 9.3 | E-1 | 2.8 | | |
| Composition 1-22 | Dispersion liquid 14 | 52 | 40.0 | C-2 | 8.4 | D-2 | 9.3 | E-1 | 2.8 | | |
| Composition 1-23 | Dispersion liquid 19 | 64 | 40.0 | C-2 | 2.3 | D-2 | 9.3 | E-1 | 2.8 | | |
| Composition 1-24 | Dispersion liquid 20 | 44 | 40.0 | C-2 | 12.4 | D-2 | 9.3 | E-1 | 2.8 | | |

| | Solvent | | Coloration Inhibitor | | Compound having epoxy group | | Ultraviolet absorber | | Adhesive | | Chain transfer agent | |
|---|---|---|---|---|---|---|---|---|---|---|---|---|
| | Type | Parts by Mass | Type | Parts by Mass | Type | Parts by Mass | Type | Parts by Mass | Type | Parts by Mass | Type | Parts by Mass |
| Composition 1-1 | PGMEA | 27.5 | — | | — | | — | | — | | — | |
| Composition 1-2 | PGMEA | 27.2 | F-1 | 0.3 | — | | — | | — | | — | |
| Composition 1-3 | PGMEA | 27.2 | F-2 | 0.3 | — | | — | | — | | — | |
| Composition 1-4 | PGMEA | 27.2 | F-3 | 0.3 | — | | — | | — | | — | |
| Composition 1-5 | PGMEA | 27.2 | F-4 | 0.3 | — | | — | | — | | — | |
| Composition 1-6 | PGMEA | 25.0 | F-3 | 0.3 | G-1 | 2.2 | — | | — | | — | |
| Composition 1-7 | PGMEA | 25.0 | F-3 | 0.3 | G-2 | 22 | — | | — | | — | |
| Composition 1-8 | PGMEA | 27.1 | F-3 | 0.3 | — | | J-1 | 0.1 | — | | — | |
| Composition 1-9 | PGMEA | 24.7 | F-3 | 0.3 | — | | — | | I-1 | 2.5 | — | |
| Composition 1-10 | PGMEA | 24.7 | F-3 | 0.3 | — | | — | | I-1 | 2.5 | — | |
| Composition 1-11 | PGMEA | 24.7 | F-3 | 0.3 | — | | — | | I-1 | 2.5 | — | |
| Composition 1-12 | PGMEA | 24.7 | F-3 | 0.3 | — | | — | | I-1 | 2.5 | — | |
| Composition 1-13 | PGMEA/cyclohexanone | 12.1/12.1 | F-3 | 0.3 | — | | — | | I-1 | 2.5 | — | |
| Composition 1-14 | PGMEA | 24.7 | F-3 | 0.3 | — | | — | | I-1 | 2.5 | — | |
| Composition 1-15 | PGMEA | 23.9 | F-3 | 0.3 | — | | — | | I-1 | 2.5 | K-1 | 0.8 |
| Composition 1-16 | PGMEA | 23.9 | F-3 | 0.3 | — | | — | | I-1 | 2.5 | K-1 | 0.8 |
| Composition 1-17 | PGMEA | 23.9 | F-3 | 0.3 | — | | — | | I-1 | 2.5 | K-1 | 0.8 |
| Composition 1-18 | PGMEA | 23.9 | F-3 | 0.3 | — | | — | | I-1 | 2.5 | K-1 | 0.8 |
| Composition 1-19 | PGMEA | 23.9 | F-3 | 0.3 | — | | — | | I-1 | 2.5 | K-1 | 0.8 |
| Composition 1-20 | PGMEA | 23.9 | F-3 | 0.3 | — | | — | | I-1 | 2.5 | K-1 | 0.8 |
| Composition 1-21 | PGMEA | 23.9 | F-3 | 0.3 | — | | — | | I-1 | 2.5 | K-1 | 0.8 |
| Composition 1-22 | PGMEA | 23.9 | F-3 | 0.3 | — | | — | | I-1 | 2.5 | K-1 | 0.8 |
| Composition 1-23 | PGMEA | 18.0 | F-3 | 0.3 | — | | — | | I-1 | 2.5 | K-1 | 0.8 |
| Composition 1-24 | PGMEA | 27.9 | F-3 | 0.3 | — | | — | | I-1 | 2.5 | K-1 | 0.8 |

TABLE 4

| | Dispersion liquid | | Content of white pigment (% by Mass with respect to total solid content) | Alkali-soluble resin | | Polymerizable compound | | Photopolymerization initiator | |
|---|---|---|---|---|---|---|---|---|---|
| | Type | Parts by Mass | | Type | Parts by Mass | Type | Parts by Mass | Type | Parts by Mass |
| Composition 1-25 | Dispersion liquid 20 | 60.5 | 54.9 | C-2 | 7.7 | D-2 | 6.8 | E-3 | 2 |
| Composition 1-26 | Dispersion liquid 20 | 33 | 30.1 | C-2 | 15.5 | D-2 | 11 | E-3 | 3.1 |
| Composition 1-27 | Dispersion liquid 21 | 52 | 40.0 | C-2 | 8.4 | D-2 | 9.3 | E-1 | 2.8 |
| Composition 1-28 | Dispersion liquid 22 | 52 | 40.0 | C-2 | 8.4 | D-2 | 9.3 | E-1 | 2.8 |
| Composition 1-29 | Dispersion liquid 23 | 52 | 40.0 | C-2 | 8.4 | D-2 | 9.3 | E-1 | 2.8 |
| Composition 1-30 | Dispersion liquid 25 | 52 | 40.0 | C-2 | 8.4 | D-2 | 9.3 | E-1 | 2.8 |
| Composition 1-31 | Dispersion liquid 26 | 52 | 40.0 | C-2 | 8.4 | D-2 | 9.3 | E-1 | 2.8 |
| Composition 1-32 | Dispersion liquid 27 | 52 | 40.0 | C-2 | 8.4 | D-2 | 9.3 | E-1 | 2.8 |
| Composition 1-33 | Dispersion liquid 28 | 52 | 40.0 | C-2 | 8.4 | D-2 | 9.3 | E-1 | 2.8 |
| Composition 1-34 | Dispersion liquid 29 | 52 | 40.0 | C-2 | 8.4 | D-2 | 9.3 | E-1 | 2.8 |
| Composition 1-35 | Dispersion liquid 30 | 52 | 40.0 | C-2 | 8.4 | D-2 | 9.3 | E-1 | 2.8 |
| Composition 1-36 | Dispersion liquid 31 | 52 | 40.0 | C-2 | 8.4 | D-2 | 9.3 | E-1 | 2.8 |
| Composition 1-37 | Dispersion liquid 4 / Dispersion liquid 3 | 40 / 12 | 40.0 | C-2 | 8.4 | D-2 | 9.3 | E-1 | 2.8 |
| Composition 1-38 | Dispersion liquid 4 / Dispersion liquid 12 | 40 / 12 | 40.0 | C-2 | 8.4 | D-2 | 9.3 | E-1 | 2.8 |
| Composition 1-39 | Dispersion liquid 32 | 52 | 40.0 | C-2 | 8.4 | D-2 | 9.3 | E-1 | 2.8 |
| Composition 1-40 | Dispersion liquid 33 | 52 | 40.0 | C-2 | 8.4 | D-2 | 9.3 | E-1 | 2.8 |
| Composition 1-41 | Dispersion liquid 34 | 52 | 40.0 | C-2 | 8.4 | D-2 | 9.3 | E-1 | 2.8 |

TABLE 4-continued

| | Solvent | | Coloration Inhibitor | | Compound having epoxy group | | Ultraviolet absorber | | Adhesive | | Chain transfer agent | |
|---|---|---|---|---|---|---|---|---|---|---|---|---|
| | Type | Parts by Mass | Type | Parts by Mass | Type | Parts by Mass | Type | Parts by Mass | Type | Parts by Mass | Type | Parts by Mass |
| Composition 1-25 | PGMEA | 19.6 | F-3 | 0.3 | — | | — | | I-1 | 2.5 | K-1 | 0.6 |
| Composition 1-26 | PGMEA | 34.6 | F-3 | 0.3 | — | | — | | I-1 | 2.5 | K-1 | 1 |
| Composition 1-27 | PGMEA | 23.9 | F-3 | 0.3 | — | | — | | I-1 | 2.5 | K-1 | 0.8 |
| Composition 1-28 | PGMEA | 23.9 | F-3 | 0.3 | — | | — | | I-1 | 2.5 | K-1 | 0.8 |
| Composition 1-29 | PGMEA | 23.9 | F-3 | 0.3 | — | | — | | I-1 | 2.5 | K-1 | 0.8 |
| Composition 1-30 | PGMEA | 23.9 | F-3 | 0.3 | — | | — | | I-1 | 2.5 | K-1 | 0.8 |
| Composition 1-31 | PGMEA | 23.9 | F-3 | 0.3 | — | | — | | I-1 | 2.5 | K-1 | 0.8 |
| Composition 1-32 | PGMEA | 23.9 | F-3 | 0.3 | — | | — | | I-1 | 2.5 | K-1 | 0.8 |
| Composition 1-33 | PGMEA | 23.9 | F-3 | 0.3 | — | | — | | I-1 | 2.5 | K-1 | 0.8 |
| Composition 1-34 | PGMEA | 23.9 | F-3 | 0.3 | — | | — | | I-1 | 2.5 | K-1 | 0.8 |
| Composition 1-35 | PGMEA | 23.9 | F-3 | 0.3 | — | | — | | I-1 | 2.5 | K-1 | 0.8 |
| Composition 1-36 | PGMEA | 23.9 | F-3 | 0.3 | — | | — | | I-1 | 2.5 | K-1 | 0.8 |
| Composition 1-37 | PGMEA | 23.9 | F-3 | 0.3 | — | | — | | I-1 | 2.5 | K-1 | 0.8 |
| Composition 1-38 | PGMEA | 23.9 | F-3 | 0.3 | — | | — | | I-1 | 2.5 | K-1 | 0.8 |
| Composition 1-39 | PGMEA | 23.9 | F-3 | 0.3 | — | | — | | I-1 | 2.5 | K-1 | 0.8 |
| Composition 1-40 | PGMEA | 23.9 | F-3 | 0.3 | — | | — | | I-1 | 2.5 | K-1 | 0.8 |
| Composition 1-41 | PGMEA | 23.9 | F-3 | 0.3 | — | | — | | I-1 | 2.5 | K-1 | 0.8 |

The raw materials described in the table are as follows.

(Dispersion Liquid)

Dispersion liquids 1 to 34: Dispersion liquids 1 to 34 above.

(Alkali-Soluble Resin)

C-1: Resin having the following structure (acid value=113 mgKOH/g and Mw=33,000). The numerical values shown together with the respective repeating units represent the mole ratio of the respective repeating units.

C-2: Resin having the following structure (acid value=32 mgKOH/g and Mw=14,000). The numerical values shown together with the respective repeating units represent the mole ratio of the respective repeating units.

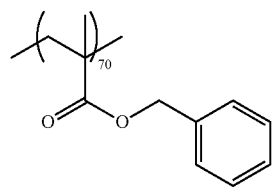

(C-1)

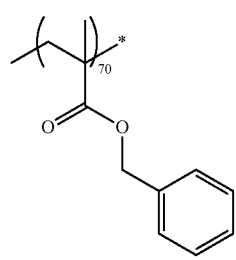

(C-2)

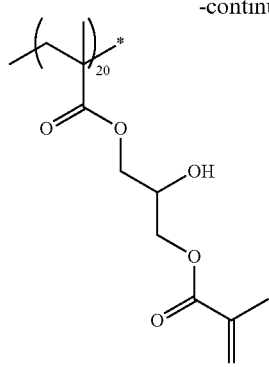

(Polymerizable Compound)

D-1: KAYARAD DPHA (manufactured by Nippon Kayaku Co., Ltd.)

D-2: NK ESTER A-TMMT (manufactured by Shin-Nakamura Chemical Co., Ltd.)

(Photopolymerization Initiator)

E-1: The following compound

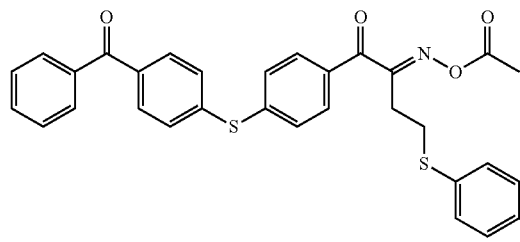

E-2: IRGACURE 379 (manufactured by BASF)
E-3: IRGACURE TPO (manufactured by BASF)
E-4: IRGACURE 819 (manufactured by BASF)

(Solvent)
PGMEA: Propylene glycol monomethyl ether acetate
(Coloration Inhibitor)
F-1: ADEKA STAB PEP-36A (manufactured by ADEKA Corporation, a compound having the following structure)
F-2: ADEKA STAB AO-50 (manufactured by ADEKA Corporation, a compound having the following structure)
F-3: ADEKA STAB AO-80 (manufactured by ADEKA Corporation, a compound having the following structure)
F-4: ADEKA STAB AO-4125 (manufactured by ADEKA Corporation, a compound having the following structure)

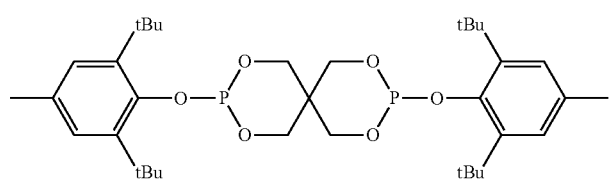

(F-1)

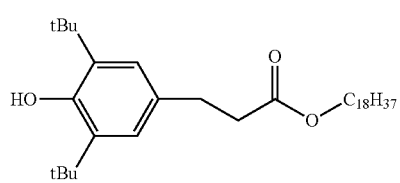

(F-2)

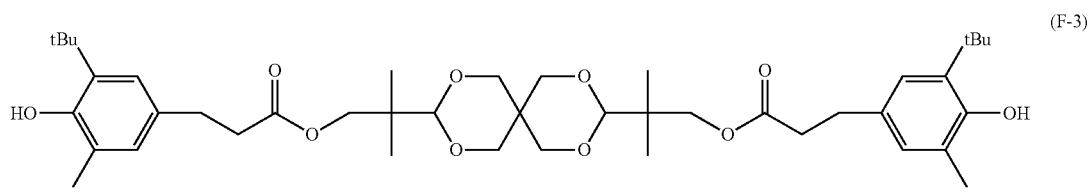

(F-3)

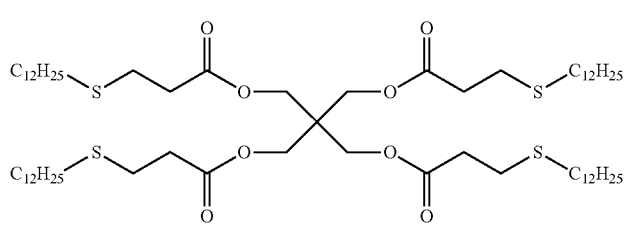

(F-4)

(Compound Having Epoxy Group)
G-1: EHPE 3150 (manufactured by Daicel Corporation)
G-2: EPICLON N-695 (manufactured by DIC Corporation)
(Ultraviolet Absorber)
J-1: Compound of the following structure
(Adhesive)
I-1: Compound of the following structure
(Chain Transfer Agent)
K-1: compound of the following structure

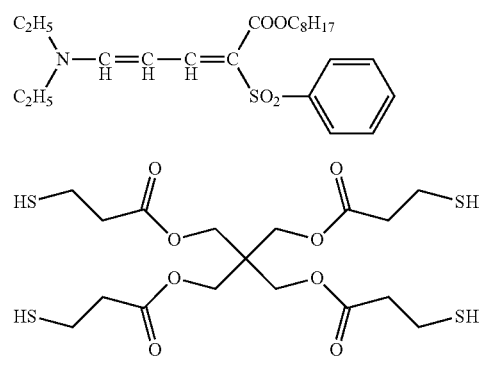

(J-1)

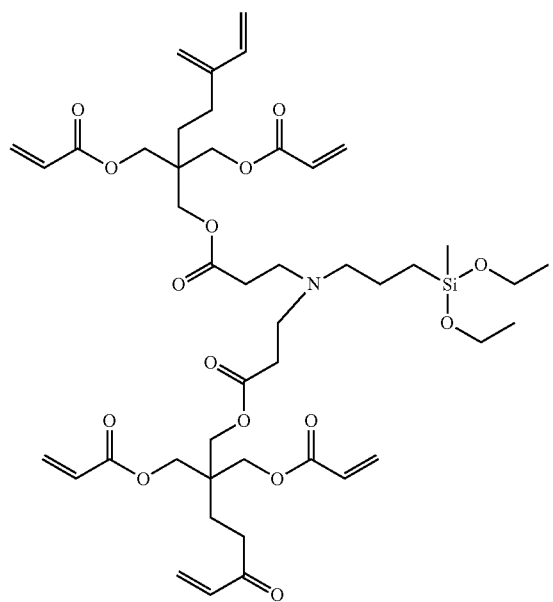

(K-1)

(I-1)

<Composition for Forming Near-Infrared Cutting Layer>
The raw materials shown below were mixed to prepare compositions A to F. The following YMS-01A-2, copper complex (Cu-1), copper complex (Cu-2), pyrrolopyrrole compound (pp-1), pyrrolopyrrole compound (pp-2), diimmonium compound (im-1) and squarylium compounds (sq-1) have a maximum absorption wavelength at a wavelength of 800 to 1,500 nm.

(Composition A)
Propylene glycol monomethyl ether acetate (PGMEA): 1.1 parts by mass 40% by mass PGMEA Solution of resin (I): 39.5 parts by mass
NK ESTER A-TMMT (manufactured by Shin-Nakamura Chemical Co., Ltd.): 6.8 parts by mass
IRGACURE 369 (manufactured by BASF): 1.6 parts by mass
KAYACURE DETX-S (manufactured by Nippon Kayaku Co., Ltd.): 0.6 parts by mass
Ultraviolet absorber ((J-1) above): 0.4 parts by mass
Surfactant (0.2% by mass PGMEA solution of the following polymer (Mw=14,000, % expressing the proportion of the repeating units is % by mole): 0.1 parts by mass

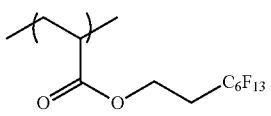

62%

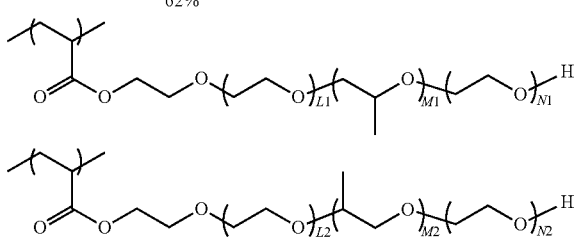

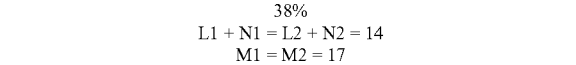

38%
$L_1 + N_1 = L_2 + N_2 = 14$
$M_1 = M_2 = 17$

YMS-01A-2 (cesium oxidation tungsten dispersion liquid, manufactured by Sumitomo Metal mining Co., Ltd.): 49.9 parts by mass
(Composition B)
Copper complex (Cu-1): 3.3 parts by mass
Copper complex (Cu-2): 9.8 parts by mass
Resin (II): 31 parts by mass
KBM-3066 (manufactured by Shin-Etsu silicones Co., Ltd.): 3.4 parts by mass
Aluminum acetylacetonate (manufactured by Sigma-Aldrich Co., LLC.): 0.01 parts by mass
IRGACURE OXE-01 (manufactured by BASF): 2.5 parts by mass
Cyclopentanone: 50 parts by mass
(Composition C)
Cyclohexanone: 64.8 parts by mass
40% by mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Pyrrolopyrrole compound (pp-1): 2.4 parts by mass
(Composition D)
Cyclohexanone: 64.8 parts by mass
40% by mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Pyrrolopyrrole compound (pp-2): 2.4 parts by mass (Composition E)
Cyclohexanone: 64.8 parts by mass
40% by mass PGMEA Solution of resin (I): 22.6 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Diimmonium compound (im-1): 2.4 parts by mass (Composition F)
Cyclohexanone: 68.7 parts by mass
40% by mass PGMEA Solution of resin (I): 16.1 parts by mass
KAYARAD DPHA (manufactured by Nippon Kayaku Co., Ltd.): 1.7 parts by mass
IRGACURE OXE-01 (manufactured by BASF): 1.9 parts by mass
MEGAFACE RS-72K (manufactured by DIC Corporation): 6.6 parts by mass
Squarylium compound (sq-1): 5 parts by mass Resin (I): Resin having the following structure (acid value=70 mgKOH/g, Mw=11,000). The numerical values shown together with the respective repeating units represent the mole ratio of the respective repeating units.

Resin (II): Resin having the following structure (Mw=16,000). The numerical values shown together with the respective repeating units represent the mole ratio of the respective repeating units.

Copper complex (Cu-1), copper complex (Cu-2), pyrrolopyrrole compound (pp-1), pyrrolopyrrole compound (pp-2), diimmonium compound (im-1), and squarylium compound (sq-1): The following compounds -continued (pp-2)
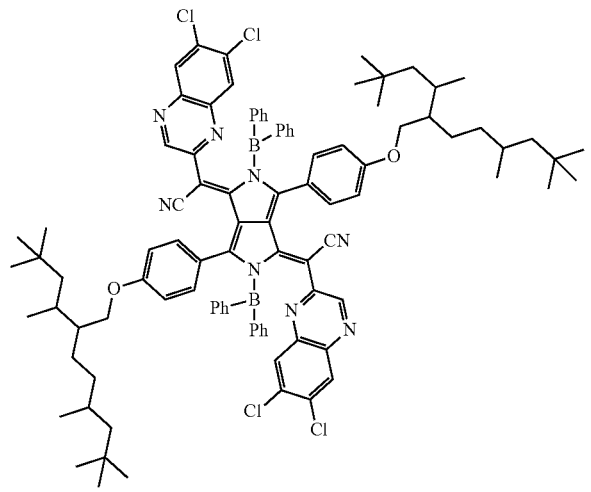

(im-1)
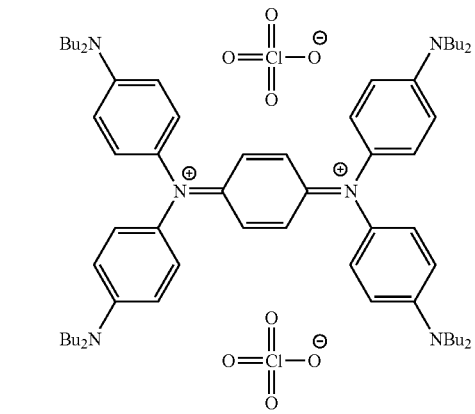

(sq-1)
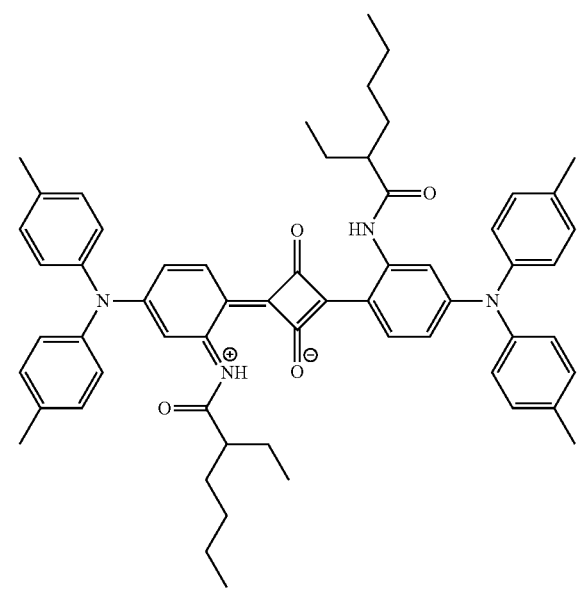

The following raw materials were mixed to prepare each composition.

<Composition for Forming Green Colored Layer (Green Composition)>
PGMEA: 25.49 parts by mass
Resin 1: 0.2 parts by mass
Polymerizable compound 1: 0.9 parts by mass
Polymerizable compound 2: 0.3 parts by mass
Photopolymerization initiator 1: 0.7 parts by mass
Ultraviolet absorber 1: 0.4 parts by mass
Surfactant 1: 0.01 parts by mass
Green dispersion: 72 parts by mass <Composition for Forming Red Colored layer (Red Composition)>
PGMEA: 47.29 parts by mass
Resin 1: 0.6 parts by mass
Polymerizable compound 3: 0.7 parts by mass
Photopolymerization initiator 1: 0.4 parts by mass
Surfactant 1: 0.01 parts by mass
Red dispersion: 51 parts by mass <Composition for Forming Blue Colored layer (Blue Composition)>
PGMEA: 51.19 parts by mass
Resin 1: 0.8 parts by mass
Polymerizable compound 1: 1.4 parts by mass
Polymerizable compound 3: 0.7 parts by mass
Photopolymerization initiator 1: 0.9 parts by mass
Surfactant 1: 0.01 parts by mass
Blue dispersion: 45 parts by mass <Composition for Forming Cyan Colored layer (Cyan composition)>
PGMEA: 58.88 parts by mass
Resin 2: 5.6 parts by mass
Polymerizable compound 4: 7.5 parts by mass
Photopolymerization initiator 1: 1.2 parts by mass
Ultraviolet absorber 1: 0.3 parts by mass
Surfactant 1: 0.01 parts by mass
Surfactant 2: 0.01 parts by mass
Cyan dispersion liquid: 26.5 parts by mass <Composition for Forming Magenta Colored layer (Magenta Composition)>
PGMEA: 80.99 parts by mass
Resin 1: 7 parts by mass
Polymerizable compound 4: 8.4 parts by mass
Photopolymerization initiator 1: 2.3 parts by mass
Ultraviolet absorber 1: 1.3 parts by mass
Surfactant 1: 0.01 parts by mass
Magenta dispersion liquid: 21 parts by mass <Composition for Forming Yellow Colored layer (Yellow Composition)>
PGMEA: 45.69 parts by mass
Resin 2: 5.6 parts by mass
Polymerizable compound 4: 6.9 parts by mass
Photopolymerization initiator 1: 1.1 parts by mass
Ultraviolet absorber 1: 1 part by mass
Surfactant 1: 0.01 parts by mass
Surfactant 2: 0.7 parts by mass
Yellow dispersion liquid: 39 parts by mass <Composition for Forming Near-Infrared Transmission Layer (IR-Pass Composition)>
PGMEA: 14.79 parts by mass
Resin 2: 1.3 parts by mass
Polymerizable compound 4: 1.9 parts by mass
Photopolymerization initiator 1: 1 part by mass
Surfactant 1: 0.01
Red dispersion liquid: 44 parts by mass
Blue dispersion liquid: 37 parts by mass <Composition for Forming Transparent Layer (Clear Composition)>
PGMEA: 75.89 parts by mass
Resin 1: 8.3 parts by mass
Polymerizable compound 5: 12.5 parts by mass
Photopolymerization initiator 1: 1.3 parts by mass
Ultraviolet absorber 1: 2 parts by mass
Surfactant 1: 0.01 parts by mass
<Composition for Forming Overcoat Layer>
PGMEA: 87.99 parts by mass
Resin 3: 12 parts by mass
Surfactant 1: 0.01 parts by mass
<Preparation of Composition for Forming Base Layer>
PGMEA: 87.99 parts by mass
Resin 3: 12 parts by mass
Surfactant 1: 0.01 parts by mass The raw materials used for the above-described composition are as follows.

A green dispersion liquid, a red dispersion liquid, a blue dispersion liquid, a magenta dispersion liquid, a cyan dispersion liquid, a yellow dispersion liquid: the raw materials described below are mixed by mass parts described in the column of dispersion liquid in the following table, and further 230 parts by mass of the zirconia beads having diameter of 0.3 mm are added, dispersion treatment is performed for 5 hours using a paint shaker, and the dispersion liquid obtained by separating the beads by filtration is used.

(Green Dispersion Liquid)
PGMEA: 83 parts by mass
C. I. Pigment Green 36: 8 parts by mass
C. I. Pigment Yellow 150: 5.5 parts by mass
Resin 4: 3 parts by mass
Resin 1: 0.5 parts by mass
(Red Dispersion Liquid)
PGMEA: 77.7 parts by mass
C. I. Pigment Red 254: 8.5 parts by mass
C. I. Pigment Yellow 139: 3.8 parts by mass
Pigment derivative 1: 2 parts by mass
Resin 5: 6 parts by mass
Resin 1: 2 parts by mass
(Blue Dispersion Liquid)
PGMEA: 82.7 parts by mass
C. I. Pigment Blue 15: 6:11 parts by mass
C. I. Pigment Violet 23: 3 parts by mass
Resin 6: 2 parts by mass
Resin 1: 1.3 parts by mass
(Cyan Dispersion Liquid)
PGMEA: 77.6 parts by mass
C. I. Pigment Green 7: 14 parts by mass
Pigment derivative 1: 1.4 parts by mass
Resin 4: 7 parts by mass
(Magenta Dispersion Liquid)
PGMEA: 69.6 parts by mass
C. I. Pigment Red 177: 19 parts by mass
Pigment derivative 1: 1.9 parts by mass
Resin 5: 9.5 parts by mass
(Yellow Dispersion Liquid)
PGMEA: 74.4 parts by mass
C. I. Pigment Yellow 150: 16 parts by mass
Pigment derivative 1: 1.6 parts by mass
Resin 5: 8 parts by mass Resin 1: Resin having the following structure (acid value=32 mgKOH/g, Mw=11,000). The numerical values shown together with the respective repeating units represent the mole ratio of the respective repeating units.

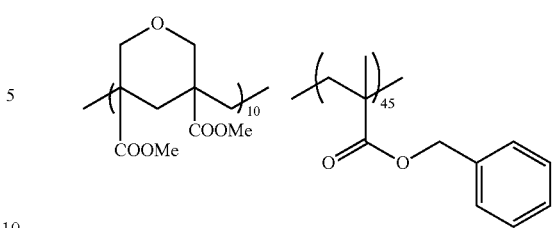

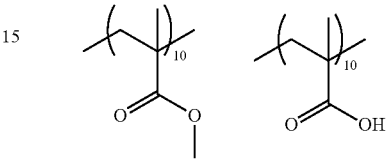

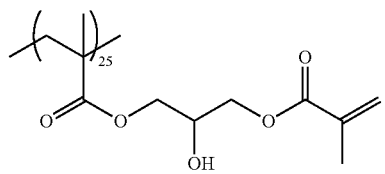

Resin 2: Resin having the following structure (acid value=112 mgKOH/g, Mw=30,000). The numerical values shown together with the respective repeating units represent the mole ratio of the respective repeating units.

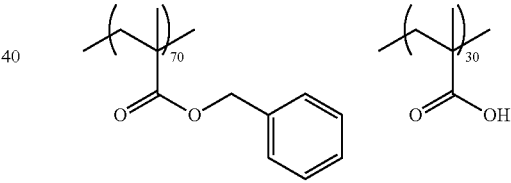

Resin 3: Cyclomer P (made by Daicel Ornex)

Resin 4: Resin having the following structure (acid value=36 mgKOH/g, Mw=21,000). The numerical values shown together with the respective repeating units represent the mole ratio of the respective repeating units. The numerical values shown together with the repeating sites of the side chain represent the repetition numbers of the repeating sites.

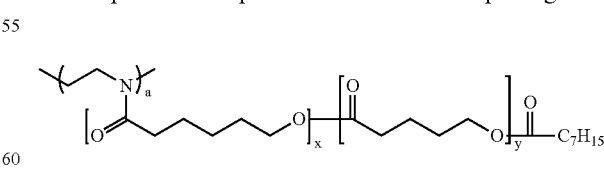

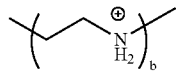

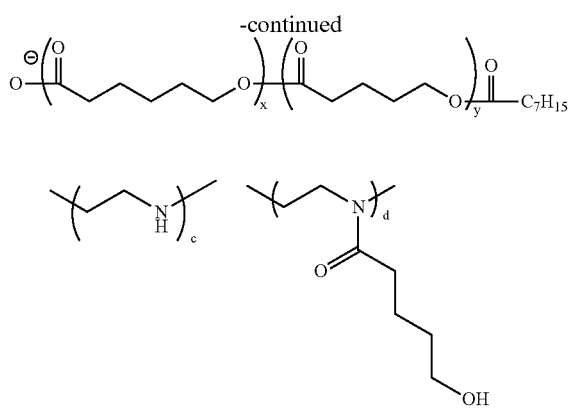
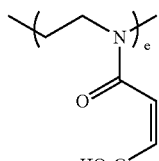

a/b/c/d/e = 36/4/35/1/24 (mol %)
x = 48 y = 12

Resin 5: Resin having the following structure (acid value=77 mgKOH/g, Mw=20,000). The numerical values shown together with the respective repeating units represent the mole ratio of the respective repeating units. The numerical values shown together with the repeating sites of the side chain represent the repetition numbers of the repeating sites.

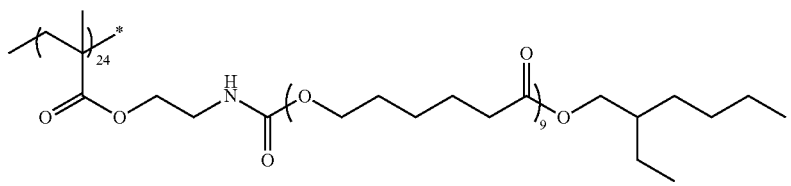

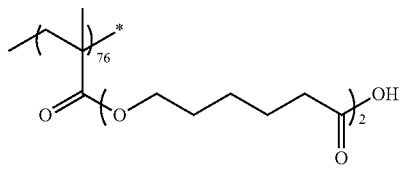

Resin 6: Solsperse 36000 made by Lubrizol
Pigment derivative 1: Compound of the following structure

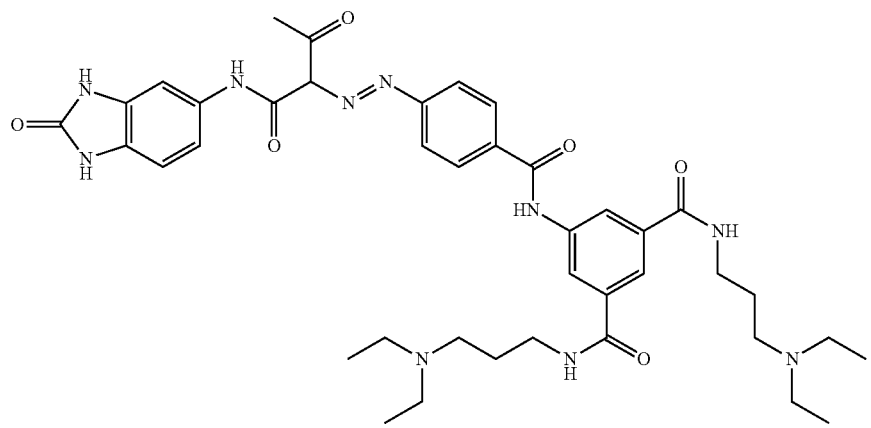 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Polymerizable compound 1: Alonics TO-2349 (manufactured by Toagosei Co., Ltd.)

Polymerizable compound 2: NK oligo UA-7200 (manufactured by Shin-Nakamura Chemical Co., Ltd.)

Polymerizable compound 3: NK ester A-DPH-12E (manufactured by Shin-Nakamura Chemical Co., Ltd.)

Polymerizable compound 4: KAYARAD DPHA (manufactured by Nippon Kayaku Co., Ltd.)

Polymerizable compound 5: Alonics M-510 (manufactured by Toagosei Co., Ltd.) Photopolymerization initiator 1: IRGACURE OXE-01 (manufactured by BASF) Ultraviolet absorber 1: the above-mentioned ultraviolet absorber (J-1) Surfactant 1: the following mixture (Mw=14,000, % expressing the proportion of the repeating units is % by mole)

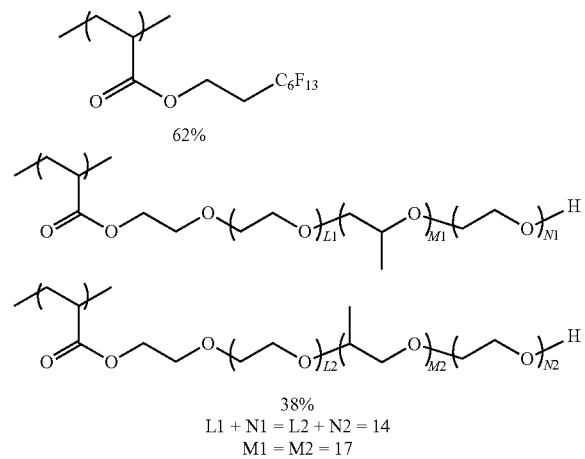

Surfactant 2: Pionin D6315 (manufactured by Takemoto Oil & Fat Co., Ltd.)

<Manufacturing of Structure>

The composition for forming an underlayer was coated on a silicon wafer using a spin coater such that the film thickness after drying becomes 0.1 μm, and heated at 230° C. for 10 minutes to form an underlayer. A first optical filter layer, a second optical filter layer, a light scattering layer, and a near-infrared cutting layer were formed using each of the compositions on the silicon wafer on which an underlayer was formed, to produce a structure. The light scattering layer having a thickness of 9 μm was formed by photolithography using the composition 1-1. In addition, in Examples 21 to 44, 46, and 47, the near-infrared cutting layer having a thickness of 1.5 μm was formed using a composition A by photolithography. Moreover, the filter layers 21 to 26, 21a to 26a and 21b to 26b were formed by photolithography using the compositions described in the following table. Among these, the film thickness of a filter layer (Green Colored layer) formed by using a green composition was 0.8 μm. The film thickness of a filter layer (red colored layer) formed using a red composition was 0.8 μm. The film thickness of a filter layer (blue colored layer) formed using a blue composition was 0.8 μm. The film thickness of a filter layer (yellow colored layer) formed using a yellow composition was 0.8 μm. The film thickness of a filter layer (magenta colored layer) formed using a magenta composition was 0.8 μm. The film thickness of a filter layer (cyan colored layer) formed using a cyan composition was 0.8 μm. The film thickness of a filter layer (transparent layer) formed using a clear composition was 0.8 μm. Additionally, the film thickness of a filter layer (near-infrared transmission layer) formed using an IR-Pass composition was 0.8 μm. The film thickness of a filter layer (near-infrared cutting layer) formed using a composition A was 1.5 μm. The pixel size of each filter layer (21 to 26, 21a to 26a, 21b to 26b) was 1.4 μm square.

TABLE 5

|  | Structure | Filter Layer 21(21a, 21b) | Filter Layer 22(22a, 22b) | Filter Layer 23(23a, 23b) |
|---|---|---|---|---|
| Example 1 | FIG. 1 | Green composition | Blue composition | Red composition |
| Example 2 | FIG. 1 | Blue composition | Red composition | Green composition |
| Example 3 | FIG. 1 | Red composition | Green composition | Blue composition |
| Example 4 | FIG. 1 | Cyan composition | Yellow composition | Magenta composition |
| Example 5 | FIG. 1 | Magenta composition | Cyan composition | Yellow composition |
| Example 6 | FIG. 1 | Yellow composition | Magenta composition | Cyan composition |
| Example 7 | FIG. 2 | Red composition | Blue composition | Green composition |
| Example 8 | FIG. 3 | Blue composition | Green composition | Green composition |
| Example 9 | FIG. 3 | Yellow composition | Cyan composition | Cyan composition |
| Example 10 | FIG. 3 | Cyan composition | Yellow composition | Yellow composition |
| Example 11 | FIG. 3 | Yellow composition | Magenta composition | Magenta composition |
| Example 12 | FIG. 2 | Blue composition | Green composition | Cyan composition |
| Example 13 | FIG. 2 | Blue composition | Green composition | Clear composition |
| Example 14 | FIG. 2 | Blue composition | Green composition | Magenta composition |
| Example 15 | FIG. 2 | Blue composition | Green composition | Yellow composition |
| Example 16 | FIG. 2 | Red composition | Green composition | Green composition |
| Example 17 | FIG. 2 | IR-Pass composition | IR-Pass composition | Clear composition |
| Example 18 | FIG. 2 | Red composition | Red composition | Clear composition |
| Example 19 | FIG. 2 | Cyan composition | Cyan composition | Clear composition |
| Example 20 | FIG. 2 | Yellow composition | Yellow composition | Yellow composition |
|  |  | Filter Layer 24(24a, 24b) | Filter Layer 25(25a, 25b) | Filter Layer 26(26a, 26b) |
| Example 1 |  | Green composition | Blue composition | Red composition |
| Example 2 |  | Blue composition | Red composition | Green composition |
| Example 3 |  | Red composition | Green composition | Blue composition |
| Example 4 |  | Cyan composition | Yellow composition | Magenta composition |
| Example 5 |  | Magenta composition | Cyan composition | Yellow composition |
| Example 6 |  | Yellow composition | Magenta composition | Cyan composition |
| Example 7 |  | Green composition | Blue composition | Red composition |

TABLE 5-continued

| | | | |
|---|---|---|---|
| Example 8 | Green composition | Green composition | Red composition |
| Example 9 | Cyan composition | Yellow composition | Magenta composition |
| Example 10 | Yellow composition | Cyan composition | Magenta composition |
| Example 11 | Magenta composition | Yellow composition | Cyan composition |
| Example 12 | Cyan composition | Green composition | Red composition |
| Example 13 | Clear composition | Green composition | Red composition |
| Example 14 | Magenta composition | Green composition | Red composition |
| Example 15 | Yellow composition | Green composition | Red composition |
| Example 16 | Green composition | Blue composition | IR-Pass composition |
| Example 17 | Clear composition | IR-Pass composition | IR-Pass composition |
| Example 18 | Clear composition | Red composition | Red composition |
| Example 19 | Clear composition | Cyan composition | Cyan composition |
| Example 20 | Yellow composition | Yellow composition | Yellow composition |

TABLE 6

| | Structure | Filter Layer 21(21a, 21b) | Filter Layer 22(22a, 22b) | Filter Layer 23(23a, 23b) |
|---|---|---|---|---|
| Example 21 | FIG. 4 | Green composition | Blue composition | Red composition |
| Example 22 | FIG. 4 | Blue composition | Red composition | Green composition |
| Example 23 | FIG. 4 | Red composition | Green composition | Blue composition |
| Example 24 | FIG. 4 | Cyan composition | Yellow composition | Magenta composition |
| Example 25 | FIG. 4 | Magenta composition | Cyan composition | Yellow composition |
| Example 26 | FIG. 4 | Yellow composition | Magenta composition | Cyan composition |
| Example 27 | FIG. 10 | Red composition | Blue composition | Green composition |
| Example 28 | FIG. 15 | Red composition | Green composition | Green composition |
| Example 29 | FIG. 15 | Blue composition | Green composition | Green composition |
| Example 30 | FIG. 15 | Yellow composition | Cyan composition | Cyan composition |
| Example 31 | FIG. 15 | Cyan composition | Yellow composition | Yellow composition |
| Example 32 | FIG. 15 | Yellow composition | Magenta composition | Magenta composition |
| Example 33 | FIG. 10 | Blue composition | Green composition | Cyan composition |
| Example 34 | FIG. 10 | Blue composition | Green composition | Clear composition |
| Example 35 | FIG. 10 | Blue composition | Green composition | Magenta composition |
| Example 36 | FIG. 10 | Blue composition | Green composition | Yellow composition |
| Example 37 | FIG. 10 | Red composition | Green composition | Green composition |
| Example 38 | FIG. 10 | IR-Pass composition | IR-Pass composition | Clear composition |
| Example 39 | FIG. 10 | Red composition | Red composition | Clear composition |
| Example 40 | FIG. 10 | Cyan composition | Cyan composition | Clear composition |

| | | Filter Layer 24(24a, 24b) | Filter Layer 25(25a, 25b) | Filter Layer 26(26a, 26b) |
|---|---|---|---|---|
| Example 21 | | Green composition | Blue composition | Red composition |
| Example 22 | | Blue composition | Red composition | Green composition |
| Example 23 | | Red composition | Green composition | Blue composition |
| Example 24 | | Cyan composition | Yellow composition | Magenta composition |
| Example 25 | | Magenta composition | Cyan composition | Yellow composition |
| Example 26 | | Yellow composition | Magenta composition | Cyan composition |
| Example 27 | | Green composition | Blue composition | Red composition |
| Example 28 | | Green composition | Blue composition | Red composition |
| Example 29 | | Green composition | Green composition | Red composition |
| Example 30 | | Cyan composition | Yellow composition | Magenta composition |
| Example 31 | | Yellow composition | Cyan composition | Magenta composition |
| Example 32 | | Magenta composition | Yellow composition | Cyan composition |
| Example 33 | | Cyan composition | Green composition | Red composition |
| Example 34 | | Clear composition | Green composition | Red composition |
| Example 35 | | Magenta composition | Green composition | Red composition |
| Example 36 | | Yellow composition | Green composition | Red composition |
| Example 37 | | Green composition | Blue composition | IR-Pass composition |
| Example 38 | | Clear composition | IR-Pass composition | IR-Pass composition |
| Example 39 | | Clear composition | Red composition | Red composition |
| Example 40 | | Clear composition | Cyan composition | Cyan composition |

TABLE 7

Figure 14:
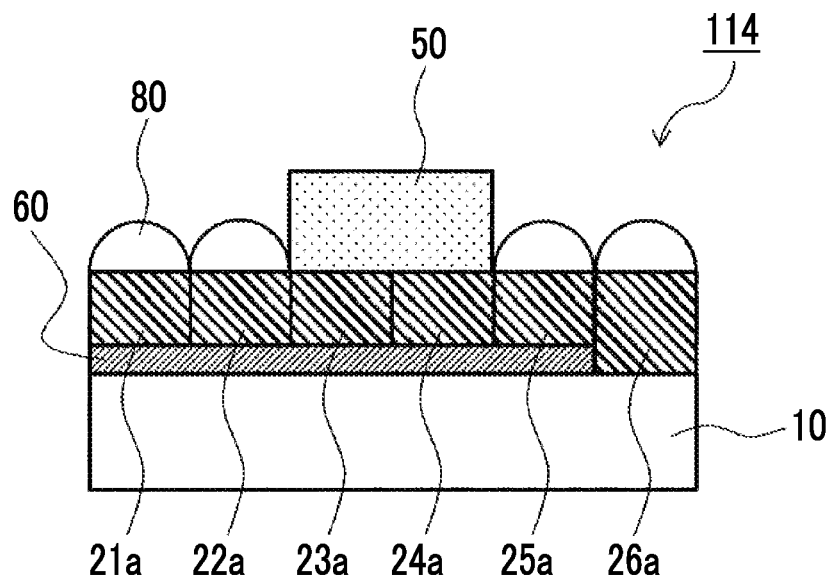
FIG. 14 is a schematic view showing an embodiment of a structure of the present invention.

| | Structure | Filter Layer 21(21a, 21b) | Filter Layer 22(22a, 22b) | Filter Layer 23(23a, 23b) |
|---|---|---|---|---|
| Example 41 | FIG. 10 | Yellow composition | Yellow composition | Yellow composition |
| Example 42 | FIG. 14 | Red composition | Green composition | Green composition |
| Example 43 | FIG. 13 | Red composition | Blue composition | Green composition |

TABLE 7-continued

| | | Filter Layer 21(21a, 21b) | Filter Layer 22(22a, 22b) | Filter Layer 23(23a, 23b) |
|---|---|---|---|---|
| Example 44 | FIG. 11 | Red composition | Blue composition | Green composition |
| Example 45 | FIG. 3 | Red composition | Green composition | Blue composition |
| Example 46 | FIG. 15 | Red composition | Green composition | Blue composition |
| Example 47 | FIG. 17 | Red composition | Green composition | Blue composition |
| Example 48 | FIG. 1 | Green composition | Blue composition | Red composition |
| Example 49 | FIG. 1 | Cyan composition | Yellow composition | Magenta composition |
| Example 50 | FIG. 3 | Blue composition | Composition A | Composition A |
| Example 51 | FIG. 3 | Magenta composition | Composition A | Composition A |
| Example 52 | FIG. 2 | Blue composition | Red composition | Composition A |
| Example 53 | FIG. 2 | IR-Pass composition | IR-Pass composition | Composition A |
| Example 54 | FIG. 2 | Red composition | Red composition | Composition A |
| Example 55 | FIG. 2 | Cyan composition | Cyan composition | Composition A |
| Example 56 | FIG. 2 | Yellow composition | Yellow composition | Composition A |

| | Filter Layer 24(24a, 24b) | Filter Layer 25(25a, 25b) | Filter Layer 26(26a, 26b) |
|---|---|---|---|
| Example 41 | Yellow composition | Yellow composition | Yellow composition |
| Example 42 | Green composition | Blue composition | IR-Pass composition |
| Example 43 | Green composition | Blue composition | Red composition |
| Example 44 | Green composition | Blue composition | Red composition |
| Example 45 | Red composition | Green composition | Blue composition |
| Example 46 | Red composition | Green composition | Blue composition |
| Example 47 | Red composition | Green composition | Blue composition |
| Example 48 | Composition A | Blue composition | Red composition |
| Example 49 | Composition A | Yellow composition | Magenta composition |
| Example 50 | Composition A | Green composition | Red composition |
| Example 51 | Composition A | Yellow composition | Cyan composition |
| Example 52 | Composition A | Green composition | IR-Pass composition |
| Example 53 | Composition A | IR-Pass composition | IR-Pass composition |
| Example 54 | Composition A | Red composition | Red composition |
| Example 55 | Composition A | Cyan composition | Cyan composition |
| Example 56 | Composition A | Yellow composition | Yellow composition |

The result of incorporating the structure of the embodiment to the optical sensor according to known method, the region in which the first optical filter layer is provided was able to function as a sensor part having a wider range of incident angles than the region in which the second optical filter layer is provided. The region in which the first optical filter layer was provided can be used suitably, for example, as an ambient light sensor, and thus, can detect ambient brightness and the like sensitively. Moreover, in the region in which the second optical filter layer was provided, sensing and imaging using visible light or a near-infrared rays were able to be suitably performed. In each of the Examples, even in a case where the underlayer was not formed on the silicon wafer, the same good effect as the Examples was obtained. Further, in each of the Examples, even in a case where the overcoat layer was formed on the surface of the structure using the composition for forming an overcoat layer, the same good effect as the Examples was obtained. In each example, even in a case where the light scattering layer is formed using any of the compositions 1-2 to 1-41 instead of the composition 1-1, the same effect as the examples was obtained. In examples 21 to 44, 46, and 47, even in a case where the near-infrared cutting layer is formed using any one of the compositions B to F instead of the composition A, the same effect as the examples was obtained. Further, in examples 48 to 56, even in a case where the near-infrared cutting layer is formed by using any of the compositions B to F instead of the composition A, the same effect as in the examples was obtained.

Additionally, in each of the light scattering layers formed using the compositions 1-1 to 1-41, the value of L* in the L*a*b* color system of CIE 1976 is 35 to 100, and the value of a* is −20 to 20 and the value of b* is −40 to 30.

EXPLANATION OF REFERENCES

10: Support
21 to 26, 21a to 26a, 21b to 26b: filter layers
50: Light scattering layer
60: Near-infrared cutting layer
80: Lens
101 to 117: Structure

What is claimed is:

1. An optical sensor comprising a structure,
the structure comprising:
a support;
a first optical filter layer provided on the support;
a light scattering layer provided on a light path of the first optical filter layer; and
a second optical filter layer provided on a region on the support different from a region where the first optical filter layer is provided,
wherein the light scattering layer includes a white pigment, and the light scattering layer is provided on a light incident side of the first optical filter layer and is not provided on a light path of the second optical filter layer, and
the content of the white pigment in the light scattering layer is 25% to 60% by mass with respect to the total solid content of the light scattering layer.

2. The optical sensor according to claim 1,
wherein each of the first optical filter layer and the second optical filter layer independently includes at least one selected from a colored layer, a transparent layer, an ultraviolet cutting layer, a near-infrared cutting layer, or a near-infrared transmission layer.

3. The optical sensor according to claim 2,
wherein the colored layer is a colored layer selected from a green colored layer, a red colored layer, a blue colored layer, a cyan colored layer, a magenta colored layer, and a yellow colored layer.

4. The optical sensor according to claim 1, wherein the second optical filter layer includes at least one selected from a colored layer or a near-infrared transmission layer.

5. The optical sensor according to claim 1, wherein the first optical filter layer includes at least one selected from a colored layer, a transparent layer, or a near-infrared cutting layer, and the second optical filter layer includes at least one selected from a colored layer or a near-infrared transmission layer.

6. The optical sensor according to claim 1, wherein the first optical filter layer includes a near-infrared cutting layer, and the second optical filter layer includes a colored layer.

7. The optical sensor according to claim 1, wherein the light scattering layer has a value of L* of 35 to 100, a value of a* of −20 to 20, and a value of b* of −40 to 30 in an L*a*b* color system of CIE 1976.

8. The optical sensor according to claim 1, wherein the light scattering layer has a value of L* of 35 to 100, a value of a* of −10 to 0, and a value of b* of −35 to 0 in an L*a*b* color system of CIE 1976.

9. The optical sensor according to claim 1, wherein the white pigment is particles that have an average primary particle diameter of 50 to 150 nm.

10. The optical sensor according to claim 1, wherein the white pigment is titanium oxide.

11. The optical sensor according to claim 1, wherein the light scattering layer has 30% to 60% by mass of particles having an average primary particle diameter of 50 to 150 nm with respect to a total solid content of the light scattering layer.

12. The optical sensor according to claim 1, further comprising:
a near-infrared cutting layer that cuts at least a part of light in a wavelength range of 800 to 1,500 nm on the light path of the first optical filter layer.

13. The optical sensor according to claim 12, wherein the near-infrared cutting layer includes a compound having a maximum absorption wavelength in a wavelength range of 800 to 1,500 nm.

14. The optical sensor according to claim 12, wherein the near-infrared cutting layer contains at least one selected from the group consisting of a tungsten oxide containing an alkali metal, a pyrrolopyrrole compound, a cyanine compound, a phthalocyanine compound, a naphthalocyanine compound, a tetraazaporphyrin compound, a diimmonium compound, a squarylium compound, and a copper complex.

15. The optical sensor according to claim 12, wherein the near-infrared cutting layer contains a pyrrolopyrrole compound.

16. The optical sensor according to claim 1, wherein the first optical filter layer and the second optical filter layer are two-dimensionally arranged on the support.

17. The optical sensor according to claim 1, further comprising:
a near infrared absorbing layer that absorbs at least a part of the light in a wavelength range of 800 to 1,500 nm on the light path of the first optical filter layer.

18. A structure comprising:
a support;
a first optical filter layer provided on the support;
a light scattering layer provided on a light path of the first optical filter layer;
a second optical filter layer provided on a region on the support different from a region where the first optical filter layer is provided; and
a near-infrared cutting layer provided on the light path of the first optical filter layer, the near-infrared cutting layer absorbing at least a part of a light in a wavelength range of 800 to 1,500 nm,
wherein
the light scattering layer includes a white pigment,
the light scattering layer is provided on a light incident side of the first optical filter layer,
the light scattering layer is not provided on a light path of the second optical filter layer,
the light scattering layer, the first optical filter layer, and the near-infrared cutting layer are laminated in order from an incidence ray side, and
the content of the white pigment in the light scattering layer is 25% to 60% by mass with respect to the total solid content of the light scattering layer.

19. The structure according to claim 18, wherein the near-infrared cutting layer includes a compound having a maximum absorption wavelength in a wavelength range of 800 to 1,500 nm.

20. An optical sensor comprising the structure according to claim 18.

21. An optical sensor comprising a structure, the structure comprising:
a support;
a first optical filter layer provided on the support;
a light scattering layer provided on a light path of the first optical filter layer;
a second optical filter layer provided on a region on the support different from a region where the first optical filter layer is provided; and
a near-infrared cutting layer that cuts at least a part of light in a wavelength range of 800 to 1,500 nm on the light path of the first optical filter layer,
wherein the light scattering layer includes a white pigment, and the light scattering layer is provided on a light incident side of the first optical filter layer, and the light scattering layer is not provided on a light path of the second optical filter layer,
the light scattering layer, the first optical filter layer, and the near-infrared cutting layer are laminated in order from an incidence ray side, and
the content of the white pigment in the light scattering layer is 25% to 60% by mass with respect to the total solid content of the light scattering layer.

22. The optical sensor according to claim 21, wherein the near-infrared cutting layer includes a compound having a maximum absorption wavelength in a wavelength range of 800 to 1,500 nm.

* * * * *